United States Patent
Saitoh et al.

(10) Patent No.: US 6,693,338 B2
(45) Date of Patent: Feb. 17, 2004

(54) POWER SEMICONDUCTOR DEVICE HAVING RESURF LAYER

(75) Inventors: Wataru Saitoh, Kawasaki (JP); Ichiro Omura, Yokohama (JP); Masakazu Yamaguchi, Kawasaki (JP); Satoshi Aida, Kawasaki (JP); Syotaro Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/163,651

(22) Filed: Jun. 7, 2002

(65) Prior Publication Data
US 2002/0185705 A1 Dec. 12, 2002

(30) Foreign Application Priority Data

Jun. 11, 2001 (JP) .......................... 2001-175041
Sep. 12, 2001 (JP) .......................... 2001-276801
Sep. 27, 2001 (JP) .......................... 2001-298311

(51) Int. Cl.⁷ .............................. H01L 23/58
(52) U.S. Cl. ...................... 257/492; 257/493
(58) Field of Search .................. 257/492, 493

(56) References Cited

U.S. PATENT DOCUMENTS

| 5,216,275 A |   | 6/1993  | Chen |            |
|-------------|---|---------|------|------------|
| 5,438,215 A |   | 8/1995  | Tihanyi |         |
| 5,548,133 A | * | 8/1996  | Kinzer | ........................ 257/155 |
| 5,701,026 A | * | 12/1997 | Fujishima et al. | ........... 257/510 |
| 6,037,632 A |   | 3/2000  | Omura et al. | ............... 257/341 |
| 6,040,600 A |   | 3/2000  | Uenishi et al. |  |
| 6,586,798 B1 | * | 7/2003 | Frisina | ........................ 257/328 |
| 2002/0171093 A1 | * | 11/2002 | Onishi et al. | ............... 257/197 |

FOREIGN PATENT DOCUMENTS

| JP | 2000-183348 | 6/2000 |
| JP | 2000-340578 | 12/2000 |
| JP | 2001-501042 | 1/2001 |
| JP | 2001-60685  | 3/2001 |
| JP | 2001-102577 | 4/2001 |
| JP | 2001-168327 | 6/2001 |

\* cited by examiner

*Primary Examiner*—Allan R. Wilson
(74) *Attorney, Agent, or Firm*—Oblon, Spivak, McClelland, Maier & Neustadt, P.C.

(57) ABSTRACT

A semiconductor device includes a drain layer, first and second drift layers, a RESURF layer, a drain electrode, a base layer, a source layer, a source electrode, and a gate electrode. The first drift layer is formed on the drain layer. The second drift layers and RESURF layers are formed on the first drift layer and periodically arranged in a direction perpendicular to the direction of depth. The RESURF layer forms a depletion layer in the second drift layer by a p-n junction including the second drift layer and RESURF layer. The impurity concentration in the first drift layer is different from that in the second drift layer. The drain electrode is electrically connected to the drain layer.

26 Claims, 60 Drawing Sheets

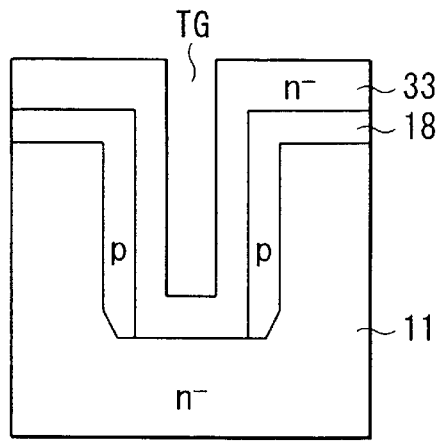
FIG. 24A
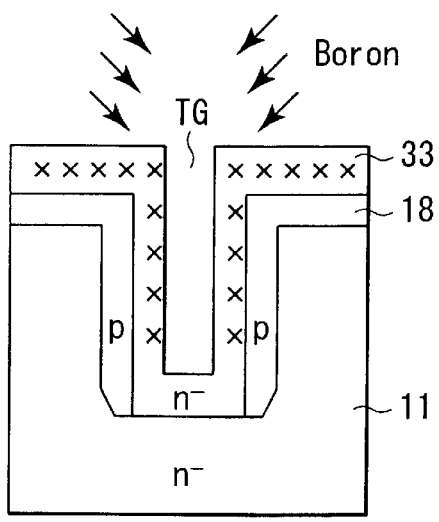
FIG. 24B
FIG. 24C
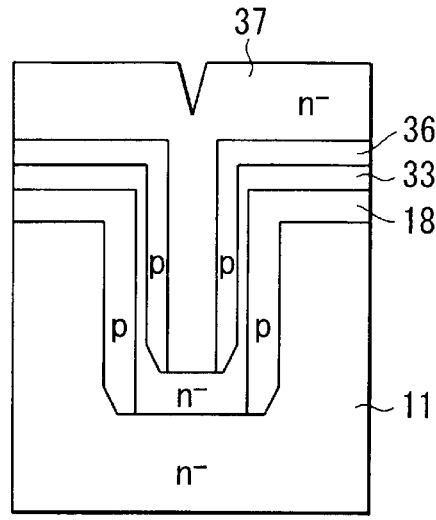
FIG. 24D
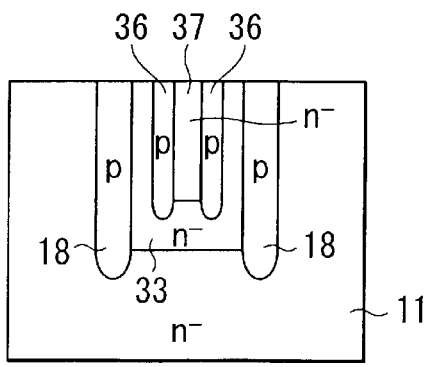
FIG. 24E $NA \cdot WA = ND1 \cdot WD1 + ND2 \cdot WD2$

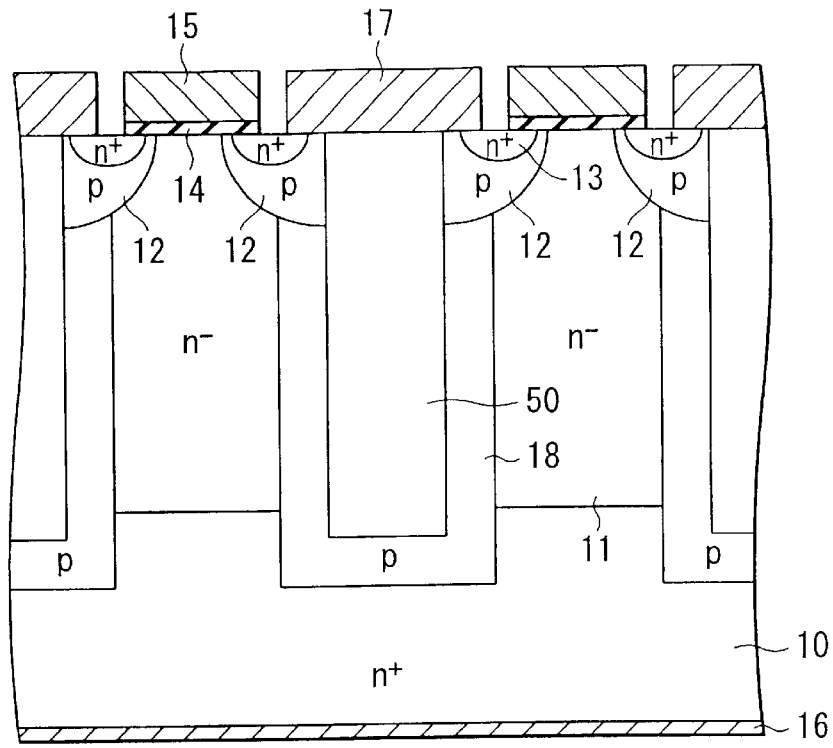
FIG. 32
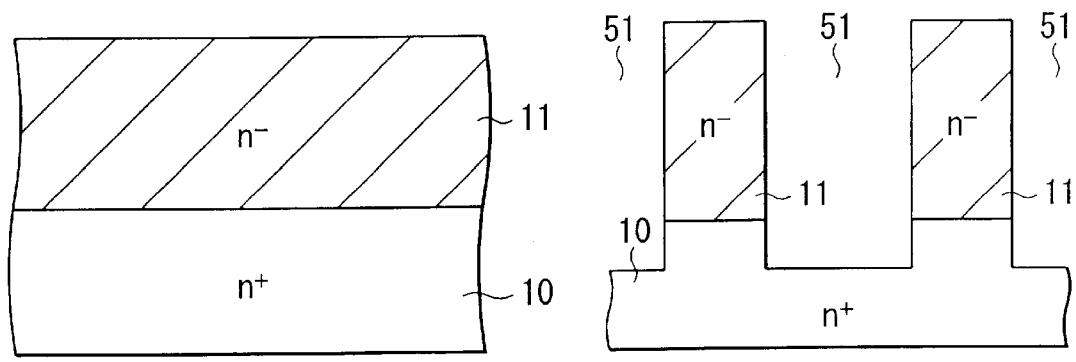
FIG. 33A
FIG. 33B
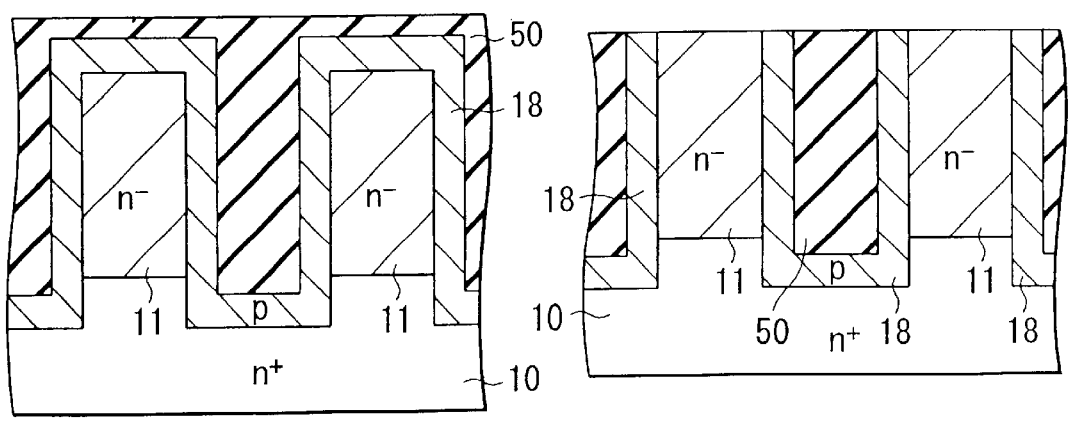
FIG. 33C
FIG. 33D

POWER SEMICONDUCTOR DEVICE HAVING RESURF LAYER

CROSS-REFERENCE TO RELATED APPLICATIONS

This application is based upon and claims the benefit of priority from the prior Japanese Patent Applications No. 2001-175041, filed Jun. 11, 2001; No. 2001-276801, filed Sep. 12, 2001; No. 2001-298311, filed Sep. 27, 2001, the entire contents of all of which are incorporated herein by reference.

BACKGROUND OF THE INVENTION

1. Field of the Invention

The present invention relates to a semiconductor device having a RESURF (REduced SURface Field) layer and, more particularly, to a technology applied to a high-power semiconductor device.

2. Description of the Related Art

Conventionally, vertical power MOS transistors are widely known. The ON resistance of a vertical power MOS transistor greatly depends on the electrical resistance of a conducting layer (drift layer) portion. The electrical resistance of a drift layer is determined by the impurity concentration in the drift layer. The impurity concentration in the drift layer also serves as a factor that determines the breakdown voltage of p-n junction formed by junction between a base layer and the drift layer. That is, the breakdown voltage and ON resistance have a tradeoff relationship. Hence, to improve the breakdown voltage and reduce the ON resistance at the same time, the tradeoff relationship must be improved.

As a technology for improving the tradeoff relationship, a structure in which a RESURF layer is buried in a drift layer is known. This structure is disclosed in, e.g., Jpn. Pat. Appln. KOKAI Publication No. 2000-183348. A conventional power MOS transistor having this structure will be described with reference to FIG. 1. FIG. 1 is a sectional view of a vertical power MOS transistor.

As shown in FIG. 1, an n$^-$-type drift layer 110 is formed on an n$^+$-type drain layer 100. In the surface region of the drift layer 110, a plurality of p-type base layers 120 are periodically arranged in a direction perpendicular to the direction of depth. N$^+$-type source layers 130 are selectively formed in the surface region of each base layer 120. A gate electrode 150 is formed on the base layers 120 and drift layer 110 between adjacent source layers 130 with a gate insulating film 140 interposed therebetween. A drain electrode 160 and source electrodes 170 are formed on the lower surface of the drain layer 100 and the source layers 130, respectively. Pillar-shaped p-type RESURF layers 180 are periodically formed in the drift layer 110.

With the above structure, since the RESURF layers 180 are formed deep in the drift layer 110, the drift layer 110 is readily fully depleted. Once the drift layer 110 is depleted, carriers in the drift layer 110 are not concerned in the breakdown voltage anymore. Hence, the impurity concentration in the drift layer 110 can be increased, and the ON resistance can be reduced. When the width of the drift layer 110, i.e., the periodical width between the RESURF layers 180 is decreased, the drift layer 110 is quickly fully depleted. When the depth of the RESURF layers 180 is increased, the breakdown voltage increases. Especially, to obtain the above effects, it is important to almost equalize the impurity concentration in the RESURF layers 180 with that in the drift layer 110.

A power MOS transistor is sometimes used to arrange a switching power supply or inverter. In this case, instead of connecting a high-speed diode in parallel to the current path of the MOS transistor, an internal diode formed by the drift layer 110 and base layer 120 may be operated. Hence, in a MOS transistor, not only the ON characteristic and switching characteristic but also the recovery characteristic of the internal diode is also important. Particularly, a reverse recovery characteristic when an internal diode shifts from an ON state to an OFF state is important. Even in a MOS transistor having no RESURF layers 180, the reverse recovery characteristic of the internal diode is different from that of a normal high-speed diode in, e.g., the reverse recovery current or reverse recovery time. Basically, however, the current waveform in reverse recovery is smooth, so a soft recovery waveform can be obtained. To the contrary, in a MOS transistor having the RESURF layers 180, the current flowing to the internal diode in reverse recovery abruptly changes. Hence, only a hard recovery waveform can be obtained. This may result in noise.

The two kinds of MOS transistors have different recovery characteristics because the drift layer 110 is depleted in different manners. In a normal MOS transistor, the drift layer 110 is gradually depleted as the applied voltage rises. However, in a MOS transistor having the RESURF layers 180, the drift layer 110 is completely depleted by a low applied voltage. That is, carriers in the drift layer 110 quickly disappear. For this reason, in reverse recovery of the internal diode, the current abruptly changes to 0, i.e., a hard recovery waveform is obtained.

Main manufacturing methods of a power MOS transistor with the above structure are as follows.

(1) Trenches are formed in the drift layer 110 and filled with the RESURF layers 180 by crystal growth.

(2) Crystal growth of the drift layer 110 and ion implantation to form the RESURF layers 180 in the drift layer 110 are repeated.

In the method (1), in forming the RESURF layers 180, crystal growth progresses at the corner portions of a trench bottom portion from both the bottom portion and the side surfaces. For this reason, the crystallinity of the RESURF layer 180 deteriorates at the corner portions of the trench bottom portion. This may make the breakdown voltage low. In addition, since the crystal growth rate in the upper portion differs from that in the lower portion of a trench, a cavity may be generated in the trench. In this case, the thickness of the RESURF layer 180 with a cavity may be different from that of the RESURF layer 180 without any cavity. This may lower the breakdown voltage.

In the method (2), each RESURF layer 180 is formed as p-type impurity ions implanted for every crystal growth are diffused into the drift layer 110 and connected to each other. Hence, a plurality of crystal growth interfaces are present in the drift layer 110 and RESURF layer 180. Due to disorder in crystallinity or mixing of an unexpected impurity, the breakdown voltage may become low, or the electrical characteristic may degrade. If the growth thickness for every crystal growth is increased, the p-type impurity must be diffused in a wide range. Since the impurity is also diffused in the horizontal direction, the unit cell width of the semiconductor element increases. That is, to form a thin and deep RESURF layer 180 to reduce the cell width, the crystal growth process and ion implantation process must be repeated many times. This makes the process very complex and also increases the number of growth interfaces.

In either the method (1) or (2), it is difficult to cause all the RESURF layer 180 to have the same depth. As described above, the depth of the RESURF layer 180 is an important factor of the breakdown voltage. Hence, if the RESURF layers 180 have different depths, the breakdown voltage varies.

BRIEF SUMMARY OF THE INVENTION

A semiconductor device according to an aspect of the present invention comprises:

a drain layer having a first conductivity type;

a first drift layer having the first conductivity type and formed on the drain layer;

second drift layers having the first conductivity type and RESURF layers having a second conductivity type, which are formed on the first drift layer and periodically arranged in a direction perpendicular to a direction of depth, the RESURF layer forming a depletion layer in the second drift layer by a p-n junction including the second drift layer and RESURF layer, and the first drift layer having an impurity concentration different from that in the second drift layer;

a drain electrode electrically connected to the drain layer;

a base layer having the second conductivity type and selectively formed in surface regions of the second drift layer and RESURF layer;

a source layer having the first conductivity type and selectively formed in a surface region of the base layer;

a source electrode formed in contact with surfaces of the base layer and source layer; and a gate electrode formed on the base layer located between the source layer and the second drift layer with a gate insulating film interposed therebetween.

A method for fabricating a semiconductor device according to an aspect of the present invention comprises:

forming a first drift layer having a first conductivity type on a drain layer having the first conductivity type;

forming a trench in a surface region of the first drift layer;

forming a first RESURF layer having a second conductivity type by doping an impurity into an inner wall side surface of the trench;

forming a second drift layer having the first conductivity type in the trench;

selectively forming a base layer having the second conductivity type in surface regions of the first and second drift layers and first RESURF layer;

selectively forming a source layer having the first conductivity type in a surface region of the base layer;

forming a gate insulating film on the base layer located at least between the first drift layer and the source layer and between the second drift layer and the source layer; and forming a gate electrode on the gate insulating film.

BRIEF DESCRIPTION OF THE SEVERAL VIEWS OF THE DRAWING

FIGS. 24A to 24F are sectional views sequentially showing steps in manufacturing a vertical power MOS transistor according to the 17th embodiment of the present invention;

FIG. 32 is a sectional view of a vertical power MOS transistor according to the 25th embodiment of the present invention;

FIGS. 33A to 33D are sectional views sequentially showing steps in manufacturing the vertical power MOS transistor shown in FIG. 32;

DETAILED DESCRIPTION OF THE INVENTION

The embodiments of the present invention will be described below with reference to the accompanying drawing. In the following embodiments, the first conductivity type is n-type, and the second conductivity type is p-type.

<First Embodiment>

Figure 1:
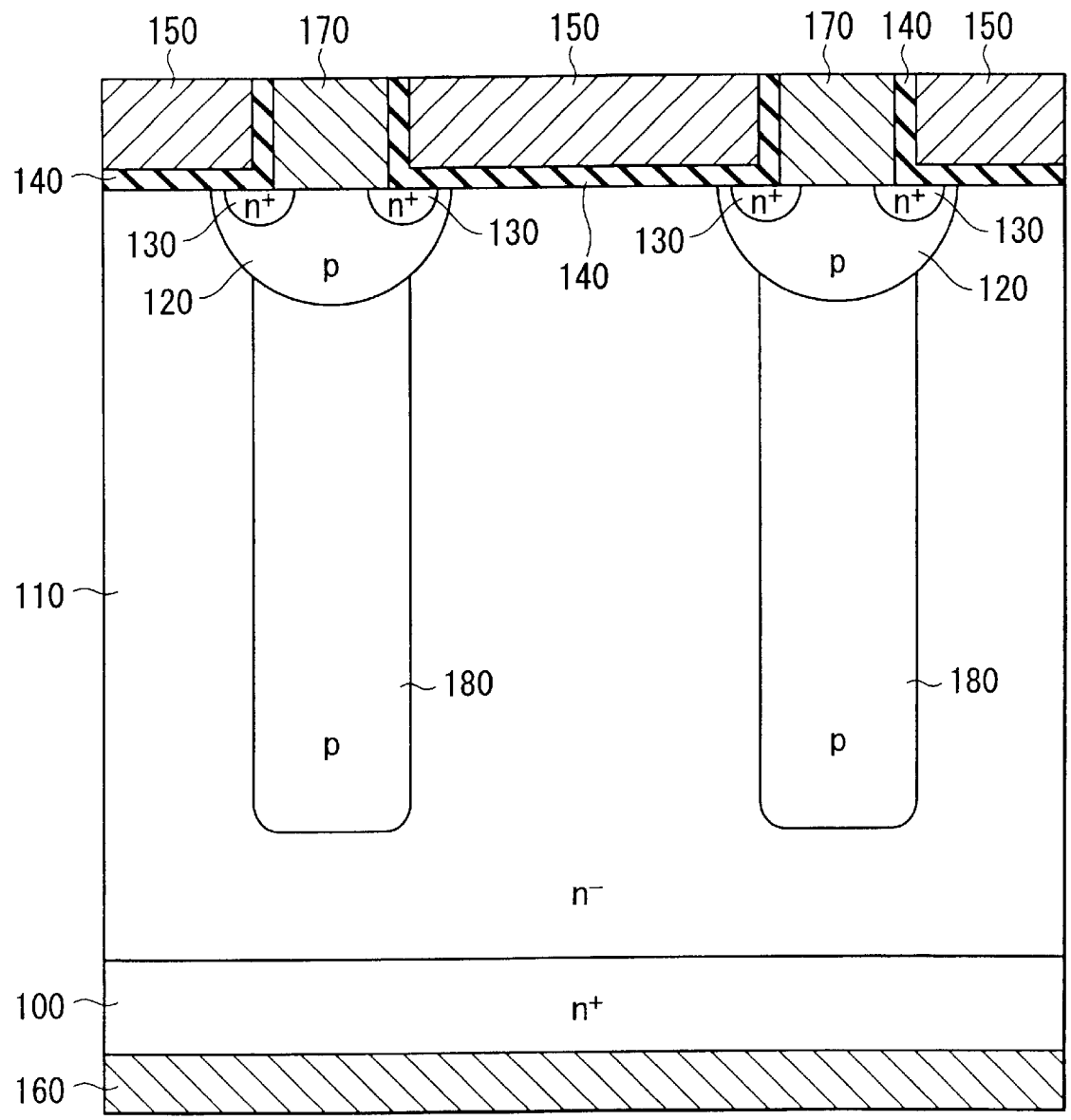
FIG. 1 is a sectional view of a conventional vertical power MOS transistor.
Figure 2:
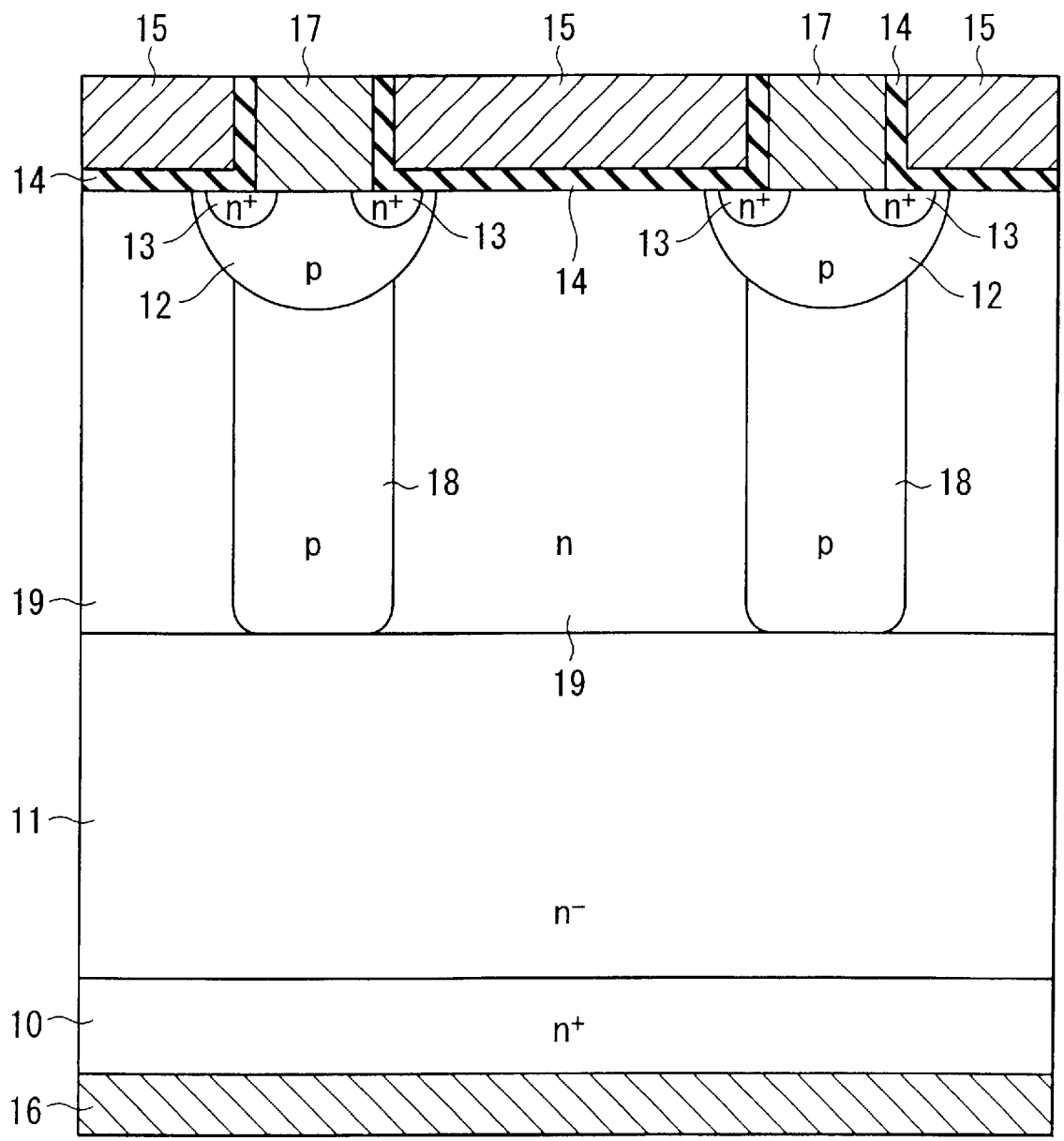
FIG. 2 is a sectional view of a vertical power MOS transistor according to the first embodiment of the present invention.

A semiconductor device according to the first embodiment of the present invention will be described with reference to FIG. 2. FIG. 2 is a sectional view of a vertical power MOS transistor.

As shown in FIG. 2, an n⁻-type first drift layer 11 is formed on an n⁺-type drain layer 10. An n-type second drift layer 19 is formed on the first drift layer 11. P-type base layers 12 are selectively formed in the surface region of the second drift layer. N⁺-type source layers 13 are selectively formed in the surface region of each base layer 12. A gate electrode 15 is formed on the second drift layer 19 and base layers 12 between adjacent source layers 13 with a gate insulating film 14 interposed therebetween. The gate electrodes 15 have a stripe-shaped planar pattern along a direction perpendicular to the page surface of FIG. 2. Source electrodes 17 are formed on the source layers 13 and base layers 12. A drain electrode 16 is formed on the lower surface of the drain layer 10. A p-type RESURF layer 18 is formed in the second drift layer 19 immediately under each base layer 12 while coming into contact with the base layer 12 and first drift layer 11. The p-type RESURF layer 18 forms a superjunction structure together with the second drift layer 19. The second drift layers 19 and RESURF layers 18 are alternated in a direction (horizontal direction) perpendicular to the direction of depth (vertical direction) whereby superjunction structures are periodically arranged.

A superjunction structure means a structure in which the vertical RESURF layer 18 is included in the drift layer 19, as shown in FIG. 2. A superjunction structure serves as least part of a carrier conducting layer. The region of a superjunction structure is quickly depleted when the MOS transistor operates.

The carrier conducting layer (drift layer) of the power MOS transistor shown in FIG. 2 includes two regions: the superjunction structure (also called a vertical RESURF structure) and the first drift layer 11. The second drift layers 19 and RESURF layers 18 have stripe-shaped planar patterns along the same direction as that of the gate electrodes 15. The first drift layer 11 is formed such that the ratio of its thickness to the sum of thicknesses of the first and second drift layers 11 and 19 is 0.21 to 0.8.

The impurity concentration in the drain layer 10 is, e.g., $6\times10^{18}$ cm$^{-3}$. The thickness of the drain layer 10 is about 200 μm. The impurity concentration in the first drift region 11 is, e.g., $5\times10^{14}$ cm$^{-3}$. The thickness of the first drift region 11 is about 26 μm. The impurity concentration in the base layer 12 is, e.g., $3\times10^{17}$ cm$^{-3}$. The base layer 12 is formed to a depth of about 2 μm from the surface of the drift layer 11. The impurity concentration in the source layer 13 is, e.g., $1\times10^{20}$ cm$^{-3}$. The source layer 13 is formed to a depth of about 0.2 μm from the surface of the base layer 12. The impurity concentration in both the RESURF layer 18 and the second drift layer 19 is, e.g., $2\times10^{15}$ cm$^{-3}$. These layers have a thickness of about 20 μm and a width of about 8 μm. The distance between adjacent RESURF layers 18 is about 8 μm. The gate insulating film 14 is, e.g., a silicon oxide film (SiO$_2$) and has a thickness of about 0.1 μm. With the above design, a MOS transistor whose rated voltage is 600V can be implemented.

In the MOS transistor with the above structure, when a forward voltage is applied to the gate electrode and between the source and drain layers, a channel is formed in the base layer 12. Carriers move from the source layers 13 to the drain layer 10 through the channel and the first and second drift layers 11 and 19. When a reverse voltage is applied to the gate electrode, a depletion layer is formed by the p-n junction between the RESURF layer 18 and the second drift layer 19 as well as by the p-n junction between the base layer 12 and the second drift layer 19. Especially, by the p-n junction with the RESURF layer 18, the second drift layer 19 is quickly fully depleted. After that, the depletion layer spreads into the first drift layer 11. In the above design example, each of the superjunction portion and first drift layer 11 shares a breakdown voltage of 300V. When the thickness of the first drift layer 11 is increased, the breakdown voltage to be shared by the first drift layer 11 increases and the ON resistance becomes high. Conversely, when the thickness of the first drift layer 11 is decreased, the ON resistance becomes low.

Figure 3A:
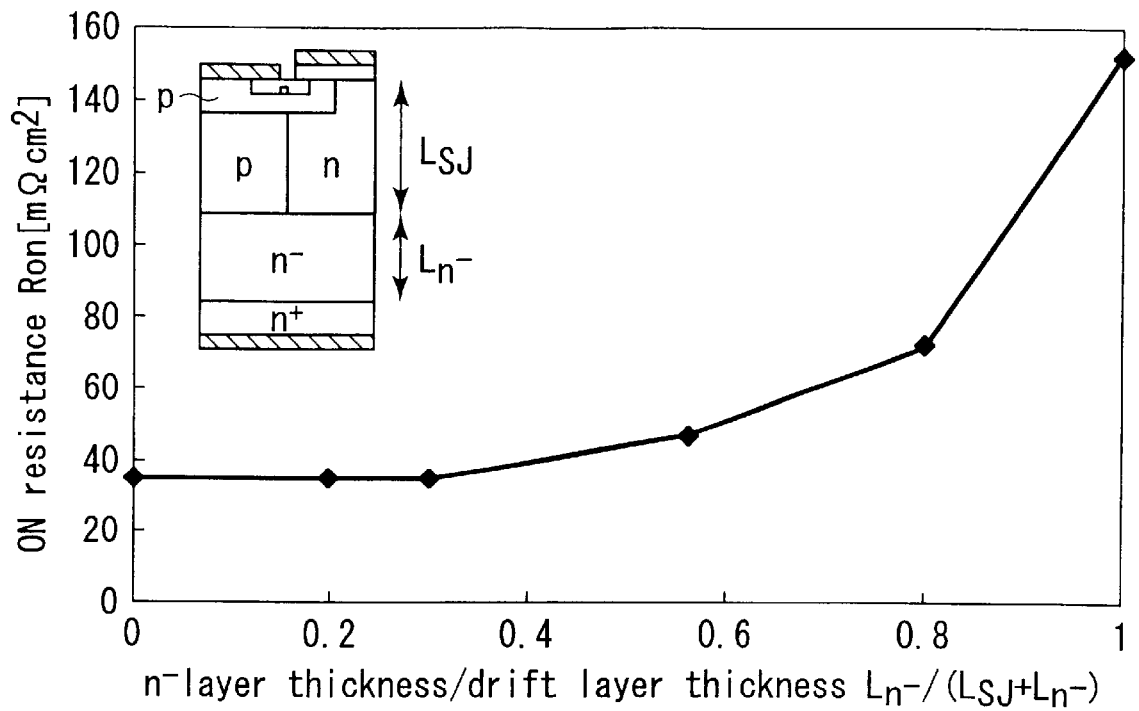
FIG. 3A is a graph showing the relationship between the ON resistance and the thickness ratio of the first drift layer to the total drift layer thickness.

FIG. 3A is a graph showing the relationship between an ON resistance Ron and a ratio Ln⁻/(Lsj+Ln⁻) of a thickness Ln⁻ of the first drift layer to the thickness of the entire carrier conducting layer (the total thickness of the first and second drift layers) (Lsj+Ln⁻) in FIG. 2. The thickness of the first drift layer is represented by Ln⁻. The thickness of the second drift layer is represented by Lsj. If the thickness ratio Ln⁻/(Lsj+Ln⁻) is 0, the entire conducting layer serves as a superjunction structure. If the thickness ratio Ln⁻/(Lsj+Ln⁻) is 1, the device is a normal MOS transistor having no superjunction structure.

As shown in FIG. 3A, the lower the thickness ratio Ln⁻/(Lsj+Ln⁻) becomes, the lower the ON resistance Ron becomes. That is, it is preferable to reduce the ratio of the first drift layer 11 to the entire conducting layer from the viewpoint of decreasing the ON resistance. That is, it is preferable to form the conducting layer only by a superjunction structure.

Figure 3B:
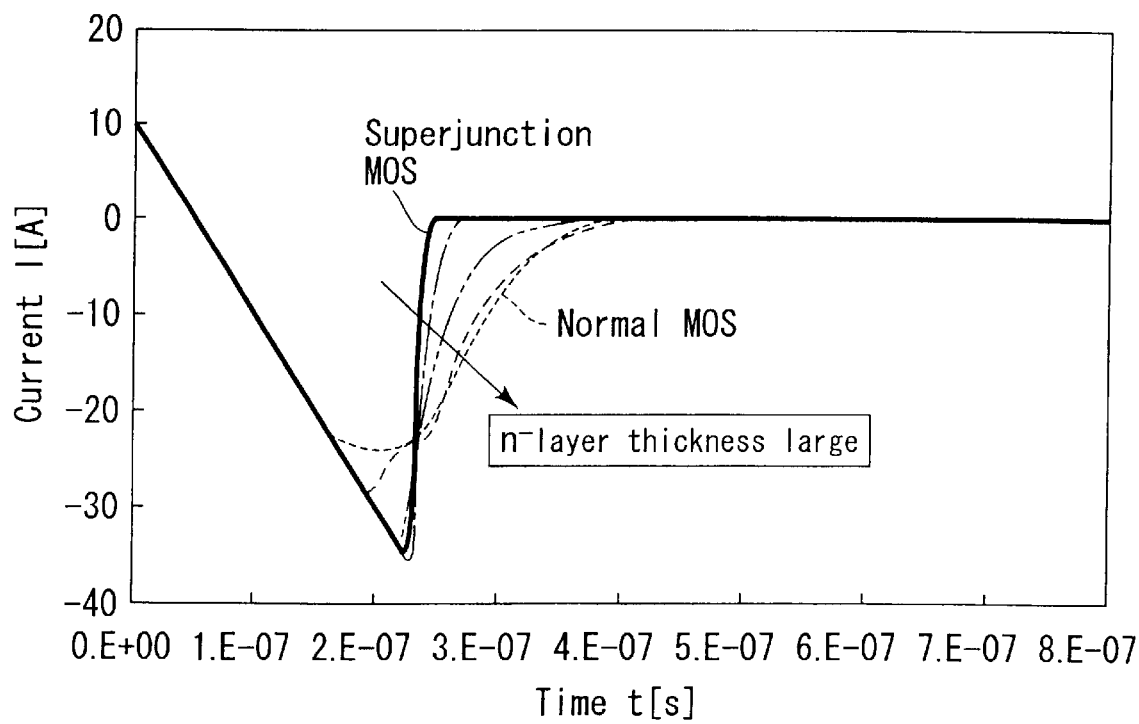
FIG. 3B is a graph showing the reverse recovery characteristic of an internal diode together with a change in thickness ratio of the first drift layer to the total drift layer thickness.

FIG. 3B shows a change in reverse recovery characteristic of the internal diode included in the MOS transistor shown in FIG. 2 along with a change in thickness ratio Ln⁻/(Lsj+Ln⁻). The abscissa indicates the elapse of time, and the ordinate indicates the current.

As shown in FIG. 3B, the reverse recovery characteristic of the MOS transistor having a superjunction structure represents a hard recovery waveform, i.e., the current abruptly changes to 0. To the contrary, in a normal MOS transistor having no superjunction structure, the current moderately decreases, and a soft recovery waveform can be obtained. Hence, only from the viewpoint of reverse recovery characteristic, it is preferable to increase the ratio of the first drift layer 11 to the entire conducting layer. That is, a MOS transistor preferably has no superjunction structure.

As described above, reduction of ON resistance and improvement of the current characteristic in reverse recovery have a tradeoff relationship.

Figure 3C:
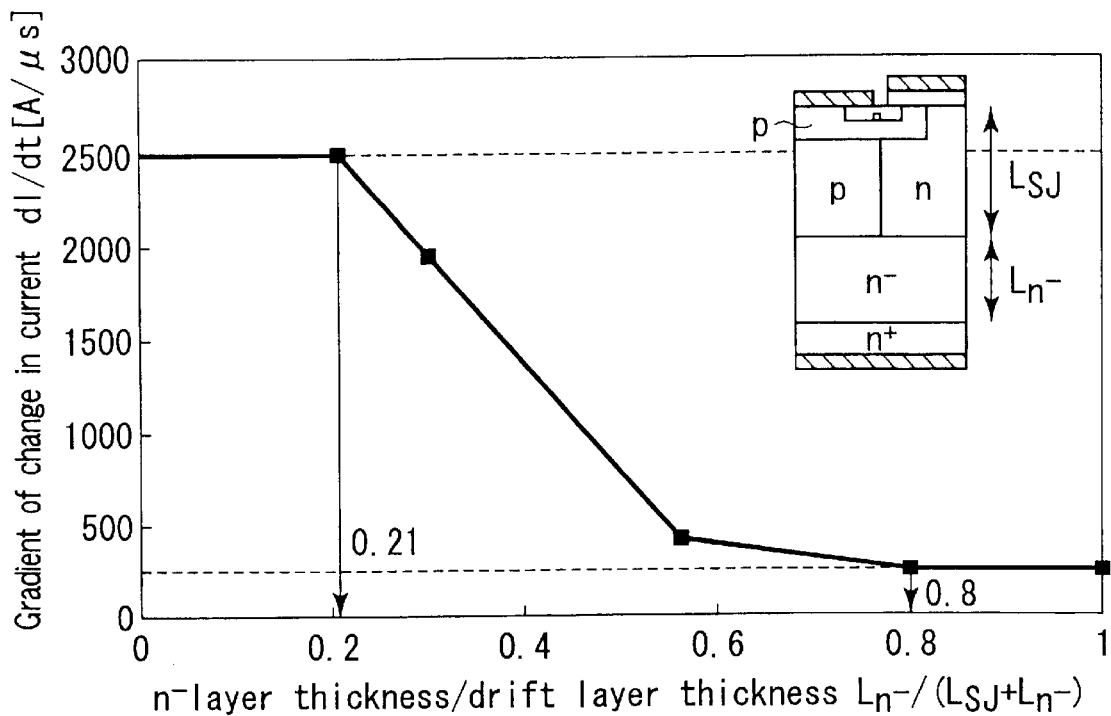
FIG. 3C is a graph showing the relationship between the gradient of a change in reverse recovery current and the thickness ratio of the first drift layer to the total drift layer thickness.

FIG. 3C shows the relationship between the thickness ratio $Ln^-/(Lsj+Ln^-)$ and a current change amount in reverse recovery of the internal diode. The abscissa indicates the thickness ratio $Ln^-/(Lsj+Ln^-)$, and the ordinate indicates the time differential of the current, i.e., the gradient of a change in current.

As shown in FIG. 3C, when the thickness ratio exceeds 0.21, the gradient of the change in current becomes smaller than that in a MOS transistor whose conducting layer is formed from only a superjunction structure. When the thickness ratio is about 0.8, the gradient is almost the same as that in a normal MOS transistor.

The MOS transistor according to this embodiment shown in FIG. 2 has the first drift layer 11 whose thickness ratio to the total thickness of the first and second drift layers 11 and 19 is 0.21 to 0.8. Hence, a soft recovery waveform can be obtained in the internal diode while reducing the ON resistance. As a result, noise can be suppressed.

That is, in the arrangement according to this embodiment, the first drift layer 11 is formed in a conventional MOS transistor having a superjunction structure. Hence, an intermediate characteristic between a MOS transistor whose conducting layer is formed from only a superjunction structure and a MOS transistor having no superjunction structure in the conducting layer. The characteristic can be controlled by changing the thickness ratio of the first drift layer to the thickness of the entire conducting layer, i.e., the total thickness of the first and second drift layers. When the ratio is set to 0.21 to 0.8, the reverse recovery characteristic of the internal diode can be improved as compared to a MOS transistor whose conducting layer is formed from only a superjunction structure. In addition, the ON resistance can be improved as compared to a MOS transistor having no superjunction structure.

Figure 3D:
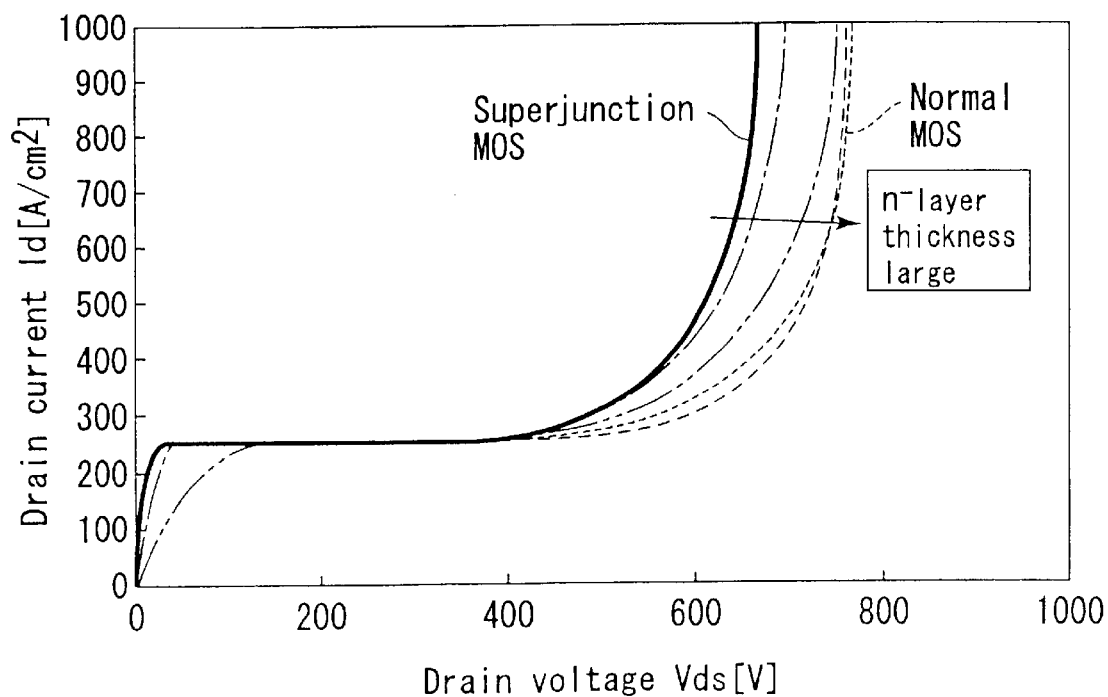
FIG. 3D is a graph showing the relationship between the drain voltage and the drain current.

According to the MOS transistor of this embodiment, since the first drift layer 11 is formed, the safety operation range when a forward voltage is applied can be sufficiently ensured. This will be described with reference to FIG. 3D. FIG. 3D shows a change in drain current Id with respect to a drain voltage Vds together with a change in thickness ratio $Ln^-/(Lsj+Ln^-)$. Especially, a case wherein a gate voltage Vg is (Vth+3V) is shown. Vth is the threshold voltage of the MOS transistor.

As shown in FIG. 3D, when a conducting layer is formed from only a superjunction structure, the drain current Id abruptly increases at the drain voltage Vds=about 600V. In a normal MOS transistor having no superjunction structure, the drain current Id abruptly increases at the drain voltage Vds=about 700V. That is, the normal structure allows application of a higher drain voltage. In other words, the normal structure has a wider voltage range where safety operation is possible. This is because when a high voltage is applied, the electric field near the drain becomes higher in the superjunction structure than in the normal structure. However, in the structure according to this embodiment, since the first drift layer 11 is inserted, the electric field near the drain can be decreased when a high voltage is applied. As a result, the safety operation range of the MOS transistor can be widened. When the ratio of the first drift layer 11 to the entire conducting layer is increased, the structure becomes similar to the normal structure. Hence, the safety operation range increases.

For the MOS transistor according to this embodiment, the manufacturing process can be simplified. In the structure shown in FIG. 2, the breakdown voltage is shared by the superjunction portion and first drift layer 11. Hence, as compared to a conventional structure in which the entire carrier conducting layer is formed as a superjunction structure, the thickness of the superjunction portion can be reduced. Since the thickness of the superjunction portion which has a complex structure can be reduced, the manufacturing process can be simplified. Even when the thickness of the superjunction structure is kept unchanged, the breakdown voltage can be changed by changing the thickness of the first drift layer 11. When wafers for which superjunction structures have the same thickness, and the first drift layers 11 have different thicknesses are prepared, MOS transistors with different breakdown voltages can be manufactured by the same manufacturing process.

As described above, according to the MOS transistor of this embodiment, the first drift layer 11 having an impurity concentration lower than that of the second drift layer 19 serving as part of a superjunction structure is inserted between the superjunction structure and the drain layer 10. For this reason, when a high voltage is applied between the drain electrode 16 and the source electrode 17, a depletion layer gradually spreads in the first drift layer 11 even after the second drift layer 19 and RESURF layer 18 are completely depleted. Hence, the reverse recovery characteristic of the internal diode can be made close to the soft characteristic of a normal diode.

<Second Embodiment>

Figures 4A, 4B, 4C, 4D:
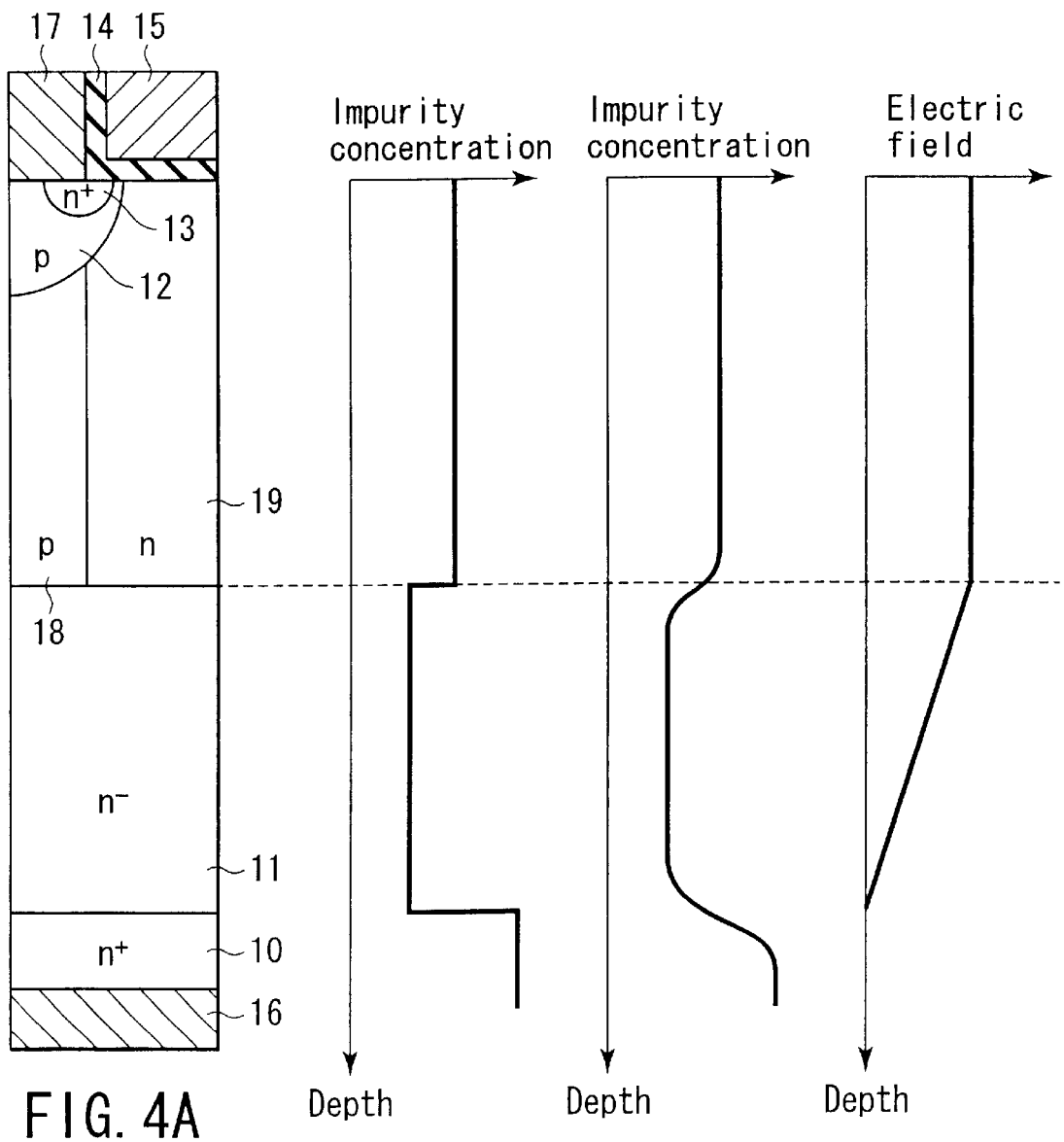
FIG. 4A is a sectional view of a vertical power MOS transistor according to the second embodiment of the present invention.
FIGS. 4B and 4C are graphs showing the impurity concentration profile in the drift layer of the vertical power MOS transistor shown in FIG. 4A.
FIG. 4D is a graph showing the field distribution in the drift layer of the vertical power MOS transistor shown in FIG. 4A.

A semiconductor device according to the second embodiment of the present invention will be described next with reference to FIGS. 4A to 4D. FIG. 4A is a sectional view of a power MOS transistor according to this embodiment. FIGS. 4B and 4C show the impurity concentration profile along the depth-direction in the drift layer of the MOS transistor shown in FIG. 4A. FIG. 4D shows the electric field distribution along the depth-direction in the drift layer.

The MOS transistor according to this embodiment has the same structure as that according to the first embodiment, as shown in FIG. 4A. That is, the carrier conducting layer includes two regions: a superjunction portion and a first drift layer 11. As shown in FIG. 4B, the impurity concentration in the superjunction portion is set to be higher than that of the first drift layer 11.

As shown in FIG. 4D, the electric field distribution in the superjunction portion is different from that in the first drift layer 11. When even a low voltage is applied between the source and the drain, the superjunction portion is completely depleted. Hence, the superjunction portion can be equivalently regarded as a lightly-doped impurity layer, and the electric field distribution in it is flat (constant). To the contrary, in the first drift layer 11, depletion layer gradually spreads from the superjunction portion side. Hence, the electric field distribution has a gradient in the first drift layer 11, as shown in FIG. 4D. In this case, if the impurity concentration in the first drift layer 11 is low, depletion in the first drift layer 11 quickly occurs. Hence, the electric field distribution in the first drift layer 11 is almost flat, like the superjunction structure portion. To the contrary, if the impurity concentration in the first drift layer 11 is high, depletion layer hardly spreads in the first drift layer 11. Hence, the gradient of the electric field distribution in the first drift layer 11 becomes steep.

To obtain a soft reverse recovery characteristic of an internal diode, the impurity concentration in the first drift layer 11 must be designed such that depletion layer in the first drift layer 11 gradually spreads, like a normal MOS transistor. If the impurity concentration in the first drift layer 11 is too low, the depletion layer immediately reaches a drain layer 10. In this case, the effect of insertion of the first drift layer 11 cannot be obtained. Since the resistance in the first drift layer 11 increases, an ON resistance Ron increases. If the impurity concentration in the first drift layer 11 is high, the depletion layer hardly spreads. Hence, although the effect of insertion of the first drift layer 11 becomes weak, the ON resistance Ron decreases.

A design example of a MOS transistor having a rated voltage of about 600V will be described. When the thickness of the superjunction portion is 10 $\mu$m, the thickness of the first drift layer 11 is 39 $\mu$m, and the impurity concentration in the first drift layer 11 is $3.3 \times 10^{14}$ cm$^{-3}$, the ON resistance Ron is 72 m$\Omega$cm$^2$. That is, the internal diode can have almost the same characteristic as in a normal MOS transistor while decreasing the ON resistance as compared with a normal MOS transistor.

When the thickness of the superjunction portion is 30 $\mu$m, the thickness of the first drift layer 11 is 13 $\mu$m, and the impurity concentration in the first drift layer 11 is $1 \times 10^{15}$ cm$^{-3}$, the ON resistance Ron is 35 m$\Omega$cm$^2$. That is, the recovery characteristic of the internal diode can be made soft while keeping almost the same ON resistance Ron as that of a superjunction MOS transistor.

To realize a soft recovery waveform while keeping a low ON resistance Ron, the impurity concentration in the first drift layer 11 is preferably set such that the drift layer is completely depleted when the rated voltage is applied between the source and the drain, as shown in FIG. 4D. The design is done such that the breakdown voltage is shared by the superjunction structure and first drift layer 11.

The resistance and breakdown voltage of the portion of the first drift layer 11 have a tradeoff relationship, like the ON resistance and breakdown voltage of a normal MOS transistor. Hence, an optimum impurity concentration for the first drift layer 11 is so set that the first drift layer 11 is completely depleted when the rated voltage is applied. With this impurity concentration, depletion gradually spreads until the voltage between the source and drain reach the rated voltage. For this reason, the recovery waveform of the internal diode also becomes soft.

From the viewpoint of reliability of a semiconductor element, the first drift layer 11 is preferably not completely depleted, when the rated voltage is applied between the source and drain. However, the power supply voltage of a semiconductor element is normally about ½ the rated voltage. Hence, if the first drift layer 11 is not completely depleted when a voltage ½ the rated voltage is applied, sufficient reliability can be maintained for a MOS transistor.

In some cases, the drain layer 10 is formed by diffusing an impurity from the lower surface of the first drift layer 11. The superjunction structure is sometimes formed by diffusing an impurity from the upper surface of the first drift layer 11. In these cases, the impurity concentration in the first drift layer 11 exhibits not a rectangular distribution as shown in FIG. 4B but a moderate distribution shown in FIG. 4C. However, when the relationship between impurity concentrations is given by drain layer 10>second drift layer 19 of the superjunction portion>first drift layer 11, the effect described in this embodiment can be obtained. In this case, the first drift layer 11 has a thickness from the junction portion with a RESURF layer 18 to a position at the junction portion with the drain layer, at which the impurity concentration almost equals that in the second drift layer 19. When the average impurity concentration in a portion corresponding to this thickness is designed as the impurity concentration in the first drift layer 11, almost the same effect as in a case wherein the first drift layer 11 has a rectangular impurity concentration distribution can be obtained.

<Third Embodiment>

A semiconductor device according to the third embodiment of the present invention will be described next with reference to FIGS. 5A to 5E. In this embodiment, a method of manufacturing the MOS transistors according to the first and second embodiments will be described. FIGS. 5A to 5E are sectional views sequentially showing steps in manufacturing the MOS transistor shown in FIG. 2.

Figure 5A:
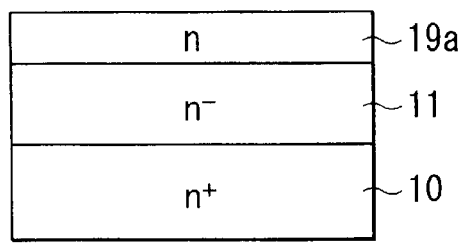
FIGS. 5A to 5E are sectional views sequentially showing steps in manufacturing the vertical power MOS transistor shown in FIG. 2 so as to explain the third embodiment of the present invention.

First, as shown in FIG. 5A, an n$^-$-type first drift layer 11 is formed on an n$^+$-type semiconductor substrate 10. An n-type semiconductor layer 19a is formed on the first drift layer 11.

Figure 5B:
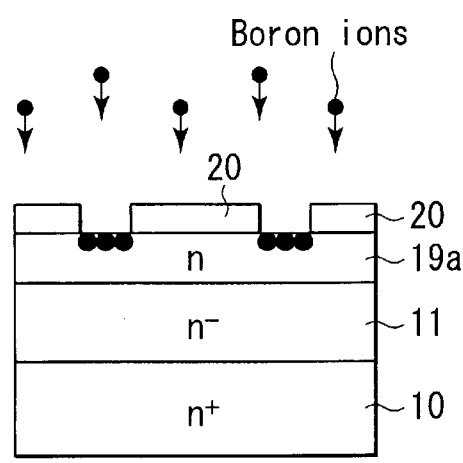
Figure 5C:
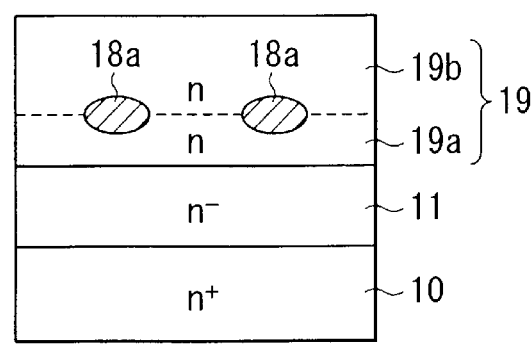

As shown in FIG. 5B, a mask material 20 is formed on the semiconductor layer 19a. The mask material 20 on a region where a RESURF layer is to be formed is removed by photolithography and etching. A p-type impurity such as boron is doped into the semiconductor layer 19a by ion implantation.

After the mask material 20 is removed, a semiconductor layer 19b is formed on the semiconductor layer 19a. The semiconductor layers 19a and 19b serve as a second drift layer 19 shown in FIG. 2. In the process of forming the semiconductor layer 19b, boron that is doped in the step shown in FIG. 5B is diffused to form p-type diffusion layers 18a in the second drift layer 19.

Figure 5D:
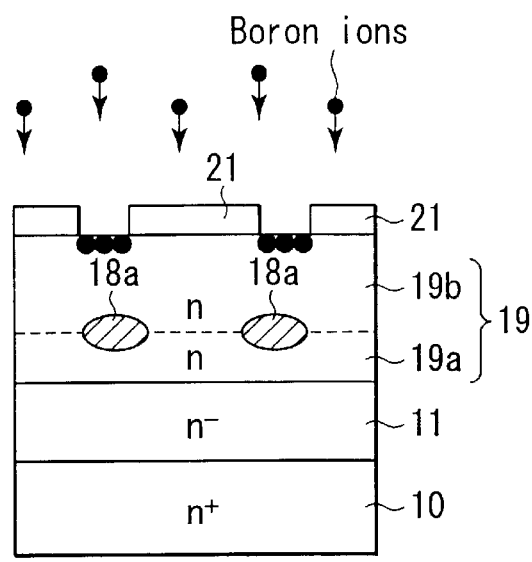

As shown in FIG. 5D, a mask material 21 is formed on the semiconductor layer 19b. The mask material 21 on a region where a RESURF layer is to be formed is removed by photolithography and etching. A p-type impurity such as boron is doped into the semiconductor layer 19b by ion implantation.

Figure 5E:
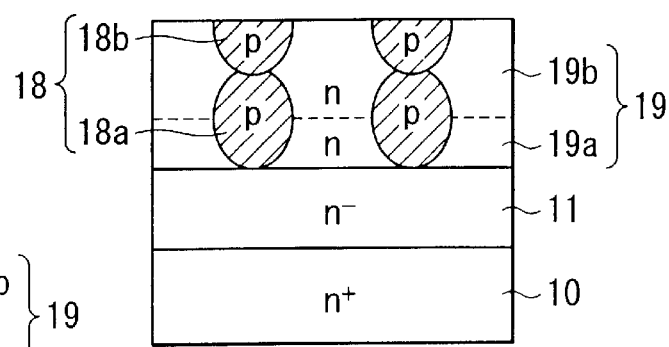

The p-type diffusion layers 18a formed by preceding ion implantation and p-type diffusion layers 18b formed by succeeding ion implantation are diffused and connected to each other by annealing. As a result, as shown in FIG. 5E, RESURF layers 18 including the p-type diffusion layers 18a and 18b are formed.

Figure 5F:
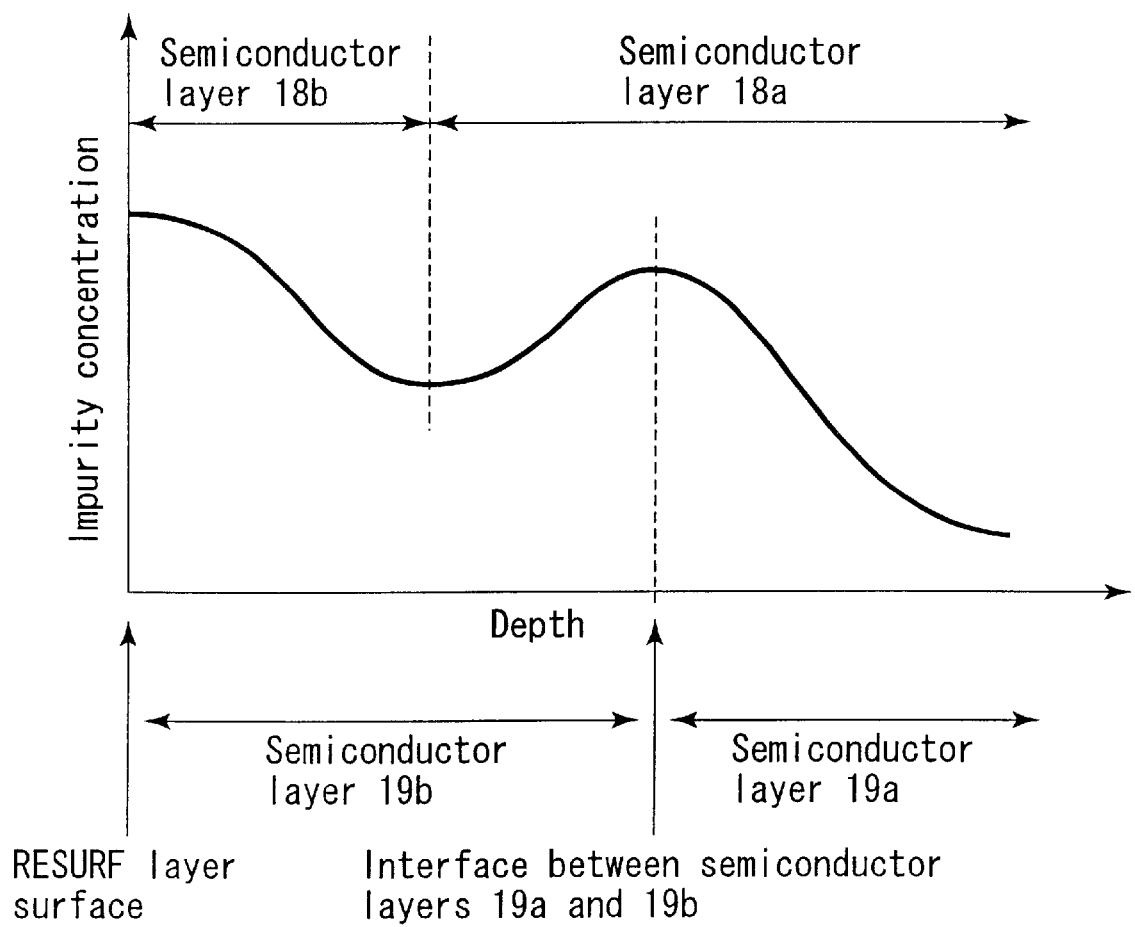
FIG. 5F is a graph showing an impurity concentration profile along the direction of depth of a RESURF layer.

After that, the MOS transistor shown in FIG. 2 is completed by a known MOS process. When a superjunction structure is formed by repeating the step of forming an n-type semiconductor layer and p-type diffusion layer a plurality of number of times, the impurity concentration along a depth-direction in the superjunction structure is not constant. FIG. 5F shows the impurity concentration profile along the depth-direction in the RESURF layer. As shown in FIG. 5F, the impurity concentration changes so as to form a concentration peak in the ion-implanted region.

When the step of forming an n-type semiconductor layer and p-type diffusion layer is further repeated, the superjunction structure can be made thick. The p-type RESURF layers 18 and second drift layer 19 may be formed by doping n- and p-type impurities into the first drift layer 11.

The RESURF layers 18 may also be formed by forming trenches in the second drift layer 19 and filling each trench with a p-type semiconductor layer.

<Fourth Embodiment>

Figure 6:
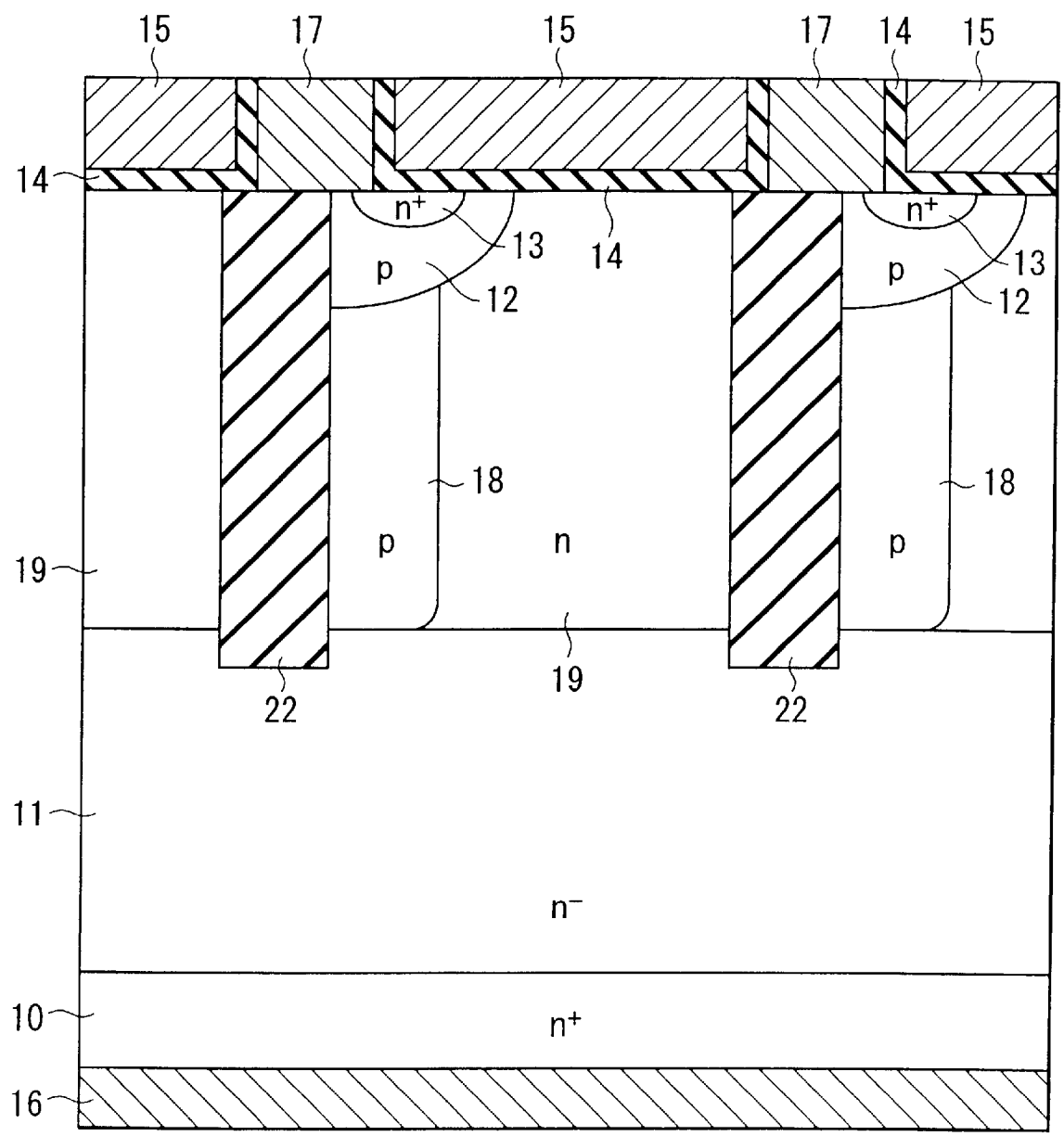
FIG. 6 is a sectional view of a vertical power MOS transistor according to the fourth embodiment of the present invention.

A semiconductor device according to the fourth embodiment of the present invention will be described next with reference to FIG. 6. FIG. 6 is a sectional view of a vertical power MOS transistor according to this embodiment.

As shown in FIG. 6, in the power MOS transistor according to this embodiment, an insulating layer 22 is inserted between a RESURF layer 18 and a second drift layer 19, both of which serve as a basic unit of a superjunction structure in the structure shown in FIG. 2. The insulating layer 22 is formed so deeply as to reach a first drift layer 11. The basic structure in which a drift layer is formed from two regions, i.e., a superjunction structure and the first drift layer 11 is the same as that shown in FIG. 2.

A method of manufacturing the power MOS transistor according to this embodiment will be described with reference to FIGS. 7A to 7E. FIGS. 7A to 7E are sectional views sequentially showing steps in manufacturing the power MOS transistor shown in FIG. 6.

Figure 7A:
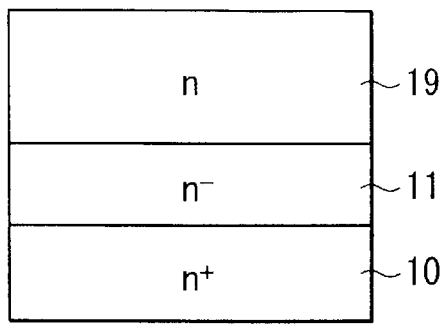
FIGS. 7A to 7E are sectional views sequentially showing steps in manufacturing the vertical power MOS transistor shown in FIG. 6.

First, as shown in FIG. 7A, the $n^-$-type first drift layer 11 is formed on an $n^+$-type semiconductor substrate 10. The n-type second drift layer 19 is formed on the first drift layer 11.

Figure 7B:
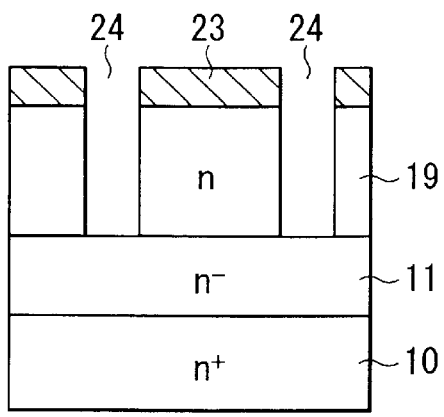

As shown in FIG. 7B, a mask material 23 is formed on the second drift layer 19. The mask material 23 on a region where the insulating layer 22 is to be formed is removed by photolithography and etching. After that, trenches 24 are formed in the second drift layer 19 by anisotropic etching such as RIE using the mask material 23 as a mark.

Figure 7C:
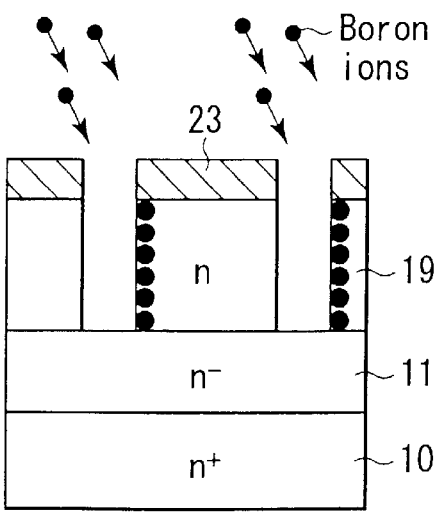

As shown in FIG. 7C, a p-type impurity such as boron is doped into the side walls of the trenches 24 by ion implantation. This ion implantation is executed obliquely with respect to the direction perpendicular to the semiconductor substrate surface. The impurity only needs to be implanted into one side surface of each trench 24. The impurity need not be implanted into both side surfaces.

Figure 7D:
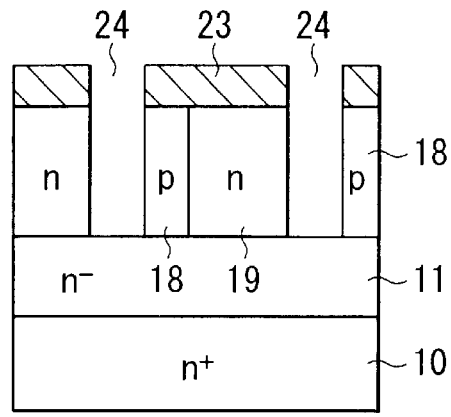

The implanted impurity is activated by annealing to complete the p-type RESURF layers 18, as shown in FIG. 7D.

Figure 7E:
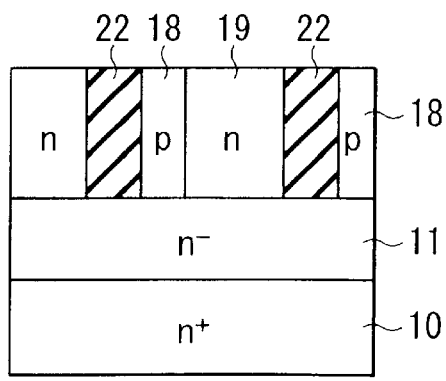

After the mask material 23 is removed, each trench 24 is filled with the insulating layer 22, as shown in FIG. 7E.

After that, the MOS transistor shown in FIG. 6 is completed by a known MOS process.

Figure 7F:
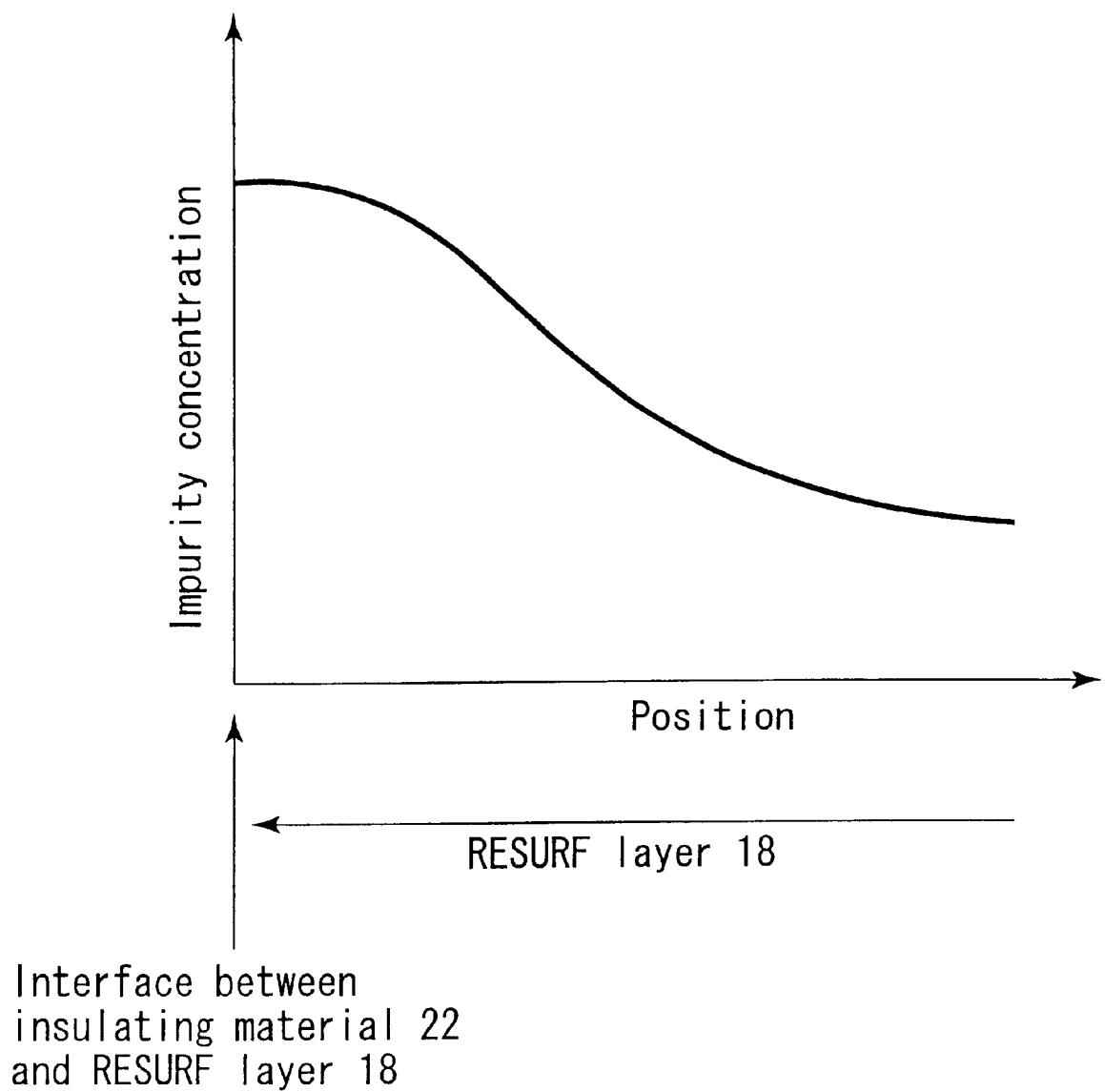
FIG. 7F is a graph showing an impurity concentration profile along the horizontal direction of a RESURF layer.

When a superjunction structure is formed by the above process, since the insulating layers 22 are periodically formed in the horizontal direction, the impurity concentration distribution is not constant in the horizontal direction. FIG. 7F shows the horizontal impurity concentration profile in the RESURF layer. As shown in FIG. 7F, the impurity concentration distribution in the RESURF layer 18 exhibits a maximum value at the junction portion between the RESURF layer and the insulating layer 22.

As the material that fills the trench 24, a semiconductor with low-impurity concentration or a combination of an insulating layer and a semiconductor can be used without any electrical problem. A semiconductor used as a filling material can be either a single-crystal semiconductor or a polycrystalline semiconductor. The trench 24 is formed so deeply as to reach the first drift layer 11. The trench 24 may be formed so deeply as to reach the drain layer 10. The second drift layer 19 and RESURF layer 18 may be formed by ion implantation into the first drift layer 11.

<Modification to Fourth Embodiment>

Figure 8:
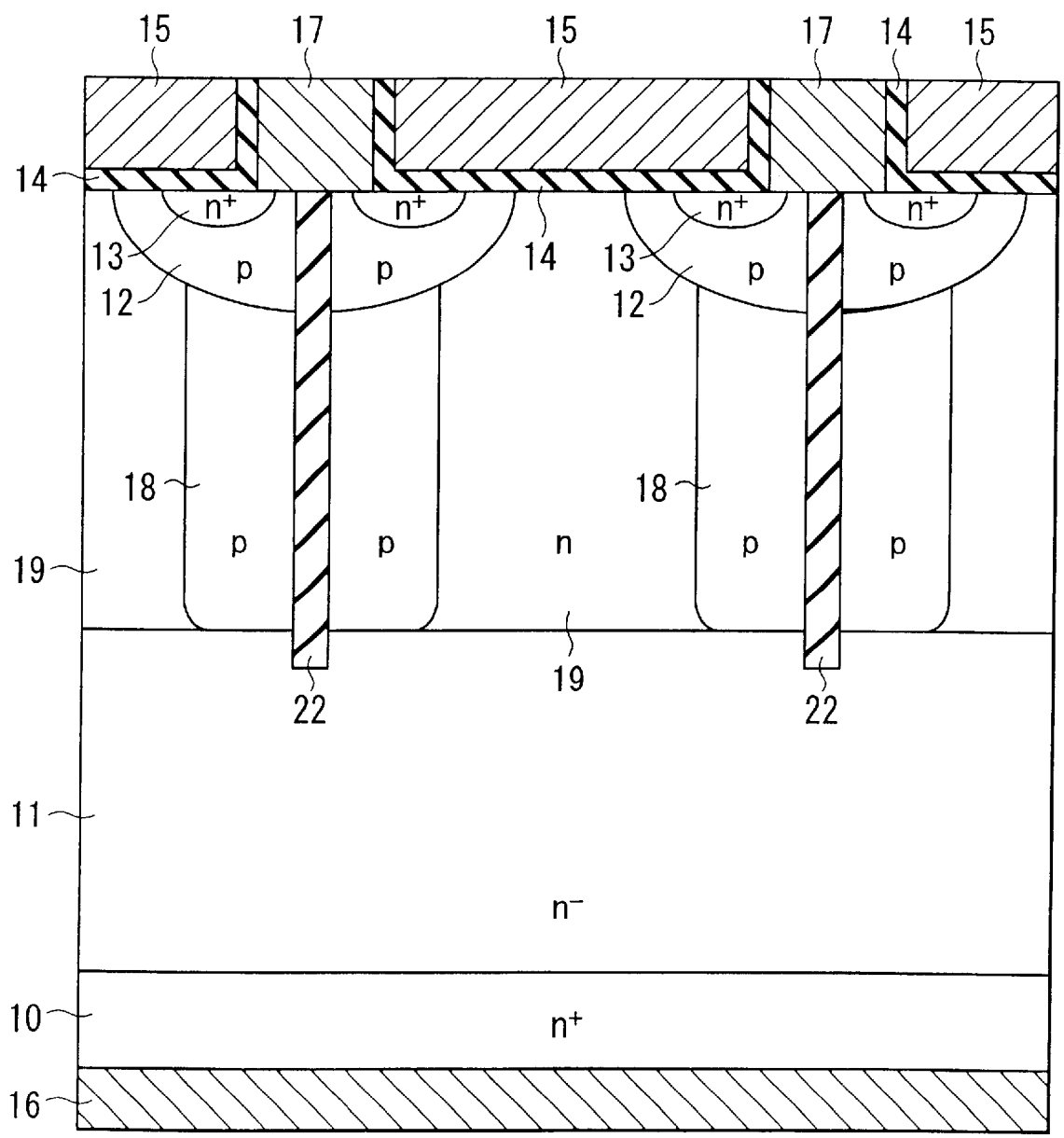
FIG. 8 is a sectional view of a vertical power MOS transistor according to a modification to the fourth embodiment of the present invention.

FIG. 8 is a sectional view of a MOS transistor according to a modification to the fourth embodiment of the present invention.

As shown in FIG. 8, in the power MOS transistor according to this modification, the insulating layer 22 is formed in each RESURF layer 18 in the structure shown in FIG. 2 described in the first embodiment. The insulating layer 22 is formed from the surface of a base layer 12 to reach the first drift layer 11.

With the structure of this modification, the cell width of a superjunction structure can be halved as compared to the MOS transistor having the structure shown in FIG. 6 according to the fourth embodiment. As a result, the ON resistance of the superjunction portion can be ½ that in the structure shown in FIG. 6.

A method of manufacturing the structure shown in FIG. 8 is the same as that of the fourth embodiment except that ion implantation is executed in the step shown in FIG. 7C such that an impurity is implanted into both side surfaces of each trench. With this process, the RESURF layers 18 can be formed in both side surfaces of each trench.

<Fifth Embodiment>

Figure 9A:
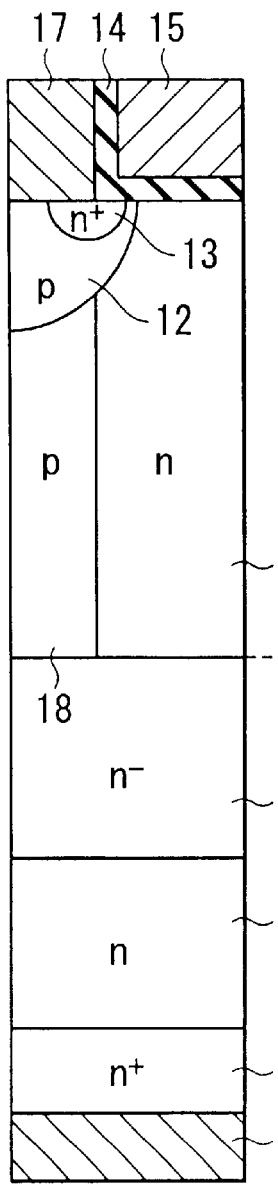
FIG. 9A is a sectional view of a vertical power MOS transistor according to the fifth embodiment of the present invention.
Figure 9B:
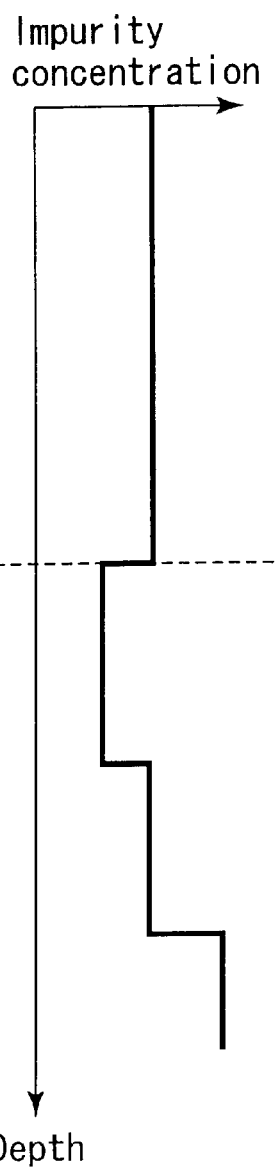
FIGS. 9B and 9C are graphs showing the impurity concentration profile in the drift layer of the vertical power MOS transistor shown in FIG. 9A.
Figure 9C:
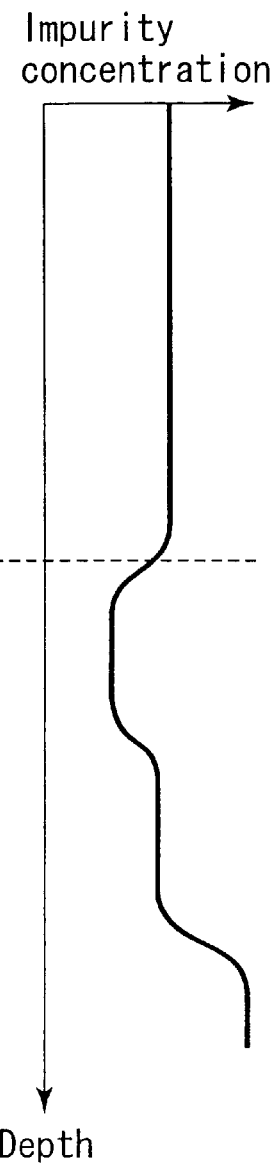

A semiconductor device according to the fifth embodiment of the present invention will be described next with reference to FIGS. 9A to 9C. FIG. 9A is a sectional view of a power MOS transistor according to this embodiment. FIGS. 9B and 9C show the impurity concentration profile along the depth-direction in the drift layer of the MOS transistor shown in FIG. 9A.

As shown in FIG. 9A, in the power MOS transistor according to this embodiment, a first drift layer 11 has a two-layered structure in the structure according to the second embodiment. More specifically, the first drift layer 11 includes an n-type semiconductor layer 11a and an $n^-$-type semiconductor layer 11b which has an impurity concentration lower than that in the n-type semiconductor layer 11a. That is, the impurity concentration in the first drift layer 11 changes stepwise.

In this case, the impurity concentration in the $n^-$-type semiconductor layer 11b is preferably lower than that in a second drift layer 19. The impurity concentration in the n-type semiconductor layer 11a preferably has an intermediate value between the impurity concentration in the $n^-$-type semiconductor layer 11b and that in a drain layer 10 and is preferably equal to or about three times the impurity concentration in the second drift layer 19.

In the power MOS transistor according to this embodiment, the first drift layer 11 includes the n-type semiconductor layer 11a and $n^-$-type semiconductor layer 11b. The n-type semiconductor layer 11a has an impurity concentration lower than that in the drain layer 10. Hence, a region where a depletion layer spreads can easily be controlled. Consequently, a soft recovery characteristic of an internal diode can more easily be obtained.

In the above example, the impurity concentration in the first drift layer 11 is changed in two steps. However, the concentration may be changed in three or more steps. Alternatively, the first drift layer may have a concentration gradient such that the impurity concentration gradually changes.

<Sixth Embodiment>

Figure 10A:
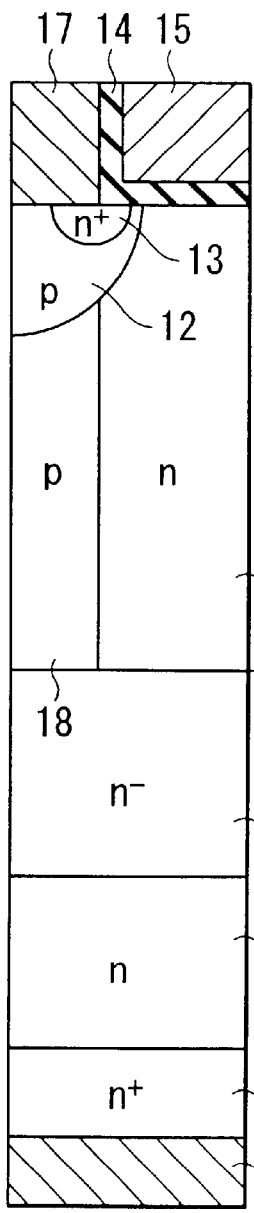
FIG. 10A is a sectional view of a vertical power MOS transistor according to the sixth embodiment of the present invention.
Figure 10B:
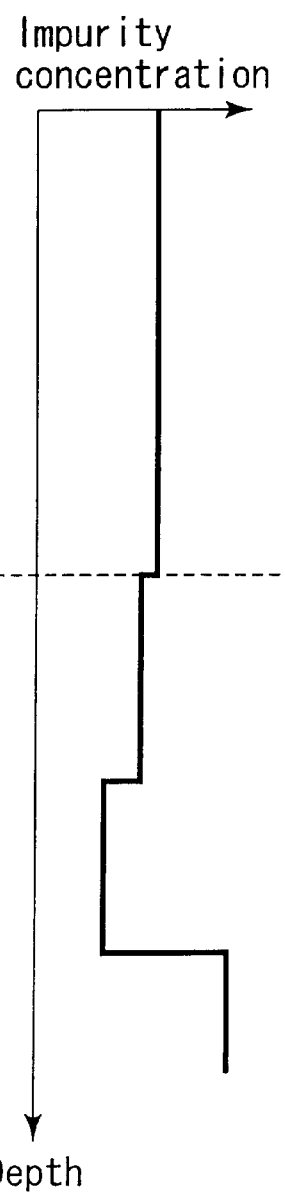
FIGS. 10B and 10C are graphs showing the impurity concentration profile in the drift layer of the vertical power MOS transistor shown in FIG. 10A.
Figure 10C:
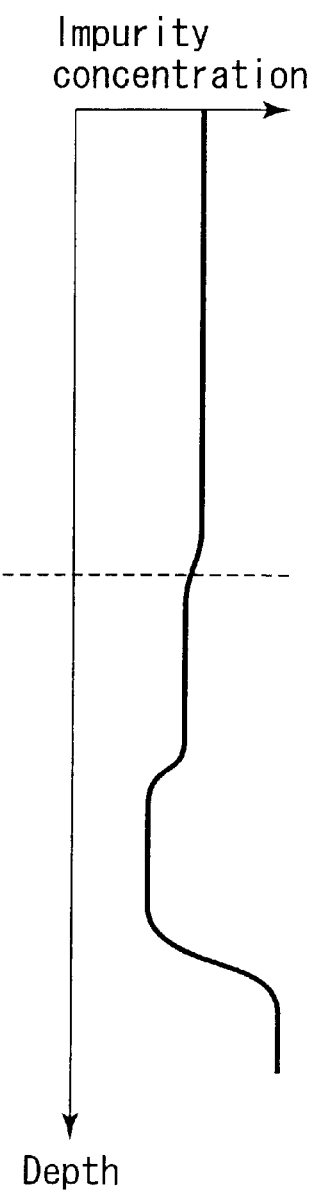

A semiconductor device according to the sixth embodiment of the present invention will be described next with reference to FIGS. 10A to 10C. FIG. 10A is a sectional view of a power MOS transistor according to this embodiment. FIGS. 10B and 10C show the impurity concentration profile along the depth-direction in the drift layer of the MOS transistor shown in FIG. 10A.

As shown in FIG. 10A, in the power MOS transistor according to this embodiment, a first drift layer 11 has a two-layered structure in the structure according to the second embodiment. More specifically, the first drift layer 11 includes an n⁻-type semiconductor layer 11c and an n-type semiconductor layer 11d which has an impurity concentration higher than that in the n⁻-type semiconductor layer 11c. That is, the impurity concentration in the first drift layer 11 changes stepwise. However, the direction of change is reverse to the fifth embodiment.

In this case, the impurity concentration in the n⁻-type semiconductor layer 11c is preferably lower than that in a second drift layer 19. The impurity concentration in the n-type semiconductor layer 11d preferably has an intermediate value between the impurity concentration in the n⁻-type semiconductor layer 11c and that in a drain layer 10 and is preferably equal to or about three times the impurity concentration in the second drift layer 19.

With the above structure, a depletion layer hardly spreads to the n-type semiconductor layer 11d. The n⁻-type semiconductor layer 11c can be moderately depleted. This contributes to make the recovery characteristic of an internal diode soft.

In the above example, the impurity concentration in the first drift layer 11 is changed in two steps. However, the impurity concentration may be changed in three or more steps. Alternatively, the first drift layer may have a concentration gradient such that the impurity concentration gradually changes.

<Seventh Embodiment>

A semiconductor device according to the seventh embodiment of the present invention will be described next.

The semiconductor device according to this embodiment has the structure shown in FIG. 2 described in the first embodiment. A RESURF layer 18 has an impurity concentration 0.87 to 1.5 times higher than that in a second drift layer 19.

Figure 11:
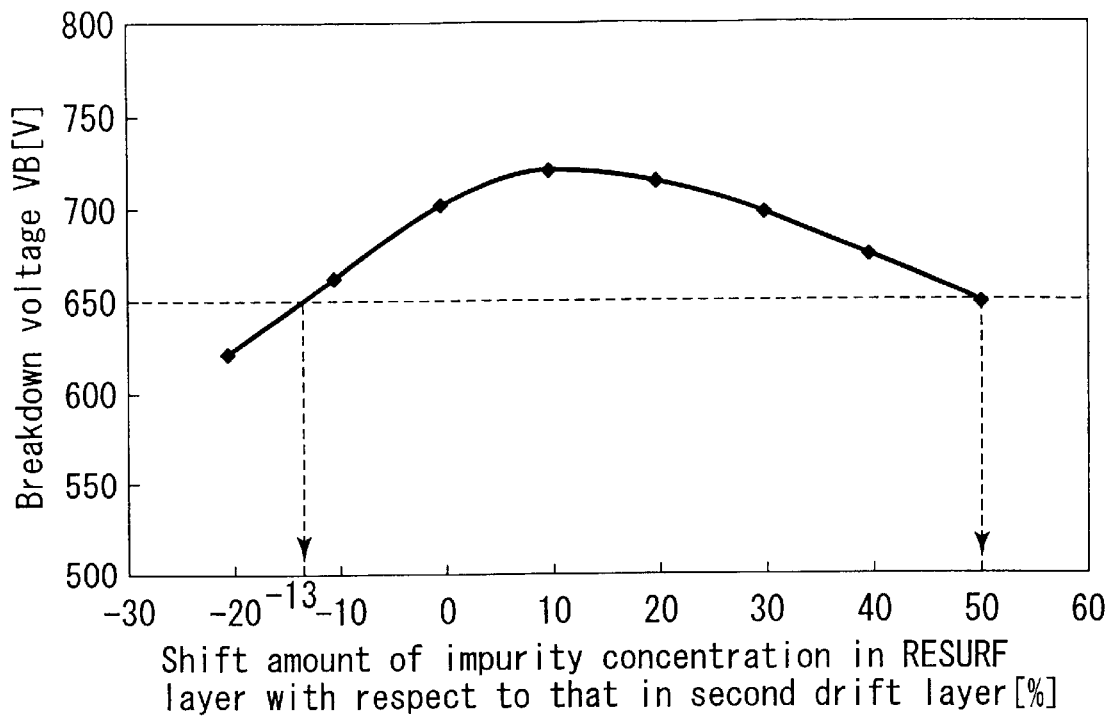
FIG. 11 is a graph showing the relationship between the breakdown voltage and the shift amount of the impurity concentration in the RESURF layer with respect to that in the second drift layer.

In the power MOS transistor according to this embodiment, the impurity concentration in the RESURF layer 18 is optimized, and the breakdown voltage can sufficiently increase. This point will be described in detail with reference to FIG. 11. FIG. 11 is a graph showing a change in breakdown voltage with respect to the shift amount of the impurity concentration between the second drift layer 19 and the RESURF layer 18.

The design values of the layers in a MOS transistor having the characteristic shown in FIG. 11 are as follows. A base layer 12 has an impurity concentration of $1 \times 10^{17}$ cm⁻³ and is formed at a depth of 2.0 μm. A source layer 13 has an impurity concentration of $1 \times 10^{20}$ cm⁻³ and is formed at a depth of 0.2 μm. A drain layer 10 has an impurity concentration of $6 \times 10^{18}$ cm⁻³ and a thickness of 200 μm. A first drift layer 11 has an impurity concentration of $5 \times 10^{14}$ cm⁻³ and a thickness of 25 μm. Both the second drift layer 19 and the RESURF layer 18 have an impurity concentration of $1.5 \times 10^{15}$ cm⁻³, a thickness of 25 μm, and a width of 8 μm.

A power MOS transistor whose rated voltage is 600V is formed by designing the layers with the above values. Each of a superjunction portion and the first drift layer 11 shares a breakdown voltage of 300V. These values are mere examples and are not limited.

Normally, the p-type RESURF layer 18 and second drift layer 19, which form a superjunction structure, are formed to have almost the same impurity concentration. If a shift in impurity dose is generated between these layers, the breakdown voltage changes. As shown in FIG. 11, when the impurity concentration in the RESURF layer 18 is higher than that in the second drift layer 19 by 10%, i.e., the RESURF layer 18 has an impurity concentration 1.1 times higher than that in the second drift layer 19, the breakdown voltage takes a maximum value. From this point, the breakdown voltage decreases as the shift in impurity concentration increases. When the impurity concentration in the RESURF layer 18 decreases by 13% or more or increases by 50% or more, the breakdown voltage is 650V or less. That is, to obtain a breakdown voltage of 650V or more in the MOS transistor, the impurity concentration in the RESURF layer 18 must fall within the range of 0.87 to 1.5 times that in the second drift layer 19. When the impurity concentration in the RESURF layer 18 is designed in this range, a breakdown voltage of 650V is obtained. Hence, the MOS transistor having a rated voltage of 600V can have a sufficient breakdown voltage margin.

In this embodiment, the carrier conducting layer includes the first drift layer 11 and superjunction portion, as in the first embodiment. A structure having no first drift layer 11 can further reduce the ON resistance, as a matter of course. In this case, however, the superjunction structure must be formed deep in order to hold the breakdown voltage. Hence, the structure is hard to form. In addition, as described in "BACKGROUND OF THE INVENTION", the recovery characteristic of an internal diode becomes hard. Furthermore, if the breakdown voltage is to be held only by a superjunction structure, the breakdown voltage considerably decreases due to a change in charge balance. However, in the structure of this embodiment, the breakdown voltage is shared by the superjunction portion and first drift layer 11. Hence, even when the charge balance at the superjunction portion is lost, a decrease in breakdown voltage is minimum. For example, when the superjunction portion holds half of the whole breakdown voltage, the decrease in breakdown voltage can be suppressed to about 0.6 times that when the superjunction portion holds the whole breakdown voltage. Even when the charge balance is lost, a sufficient breakdown voltage can be held by designing the impurity concentration in the RESURF layer 18 to a value 0.87 to 1.5 times that in the second drift layer 19. That is, since the first drift layer is added, any adverse influence that may occur when a cause for a decrease in breakdown voltage is generated in the superjunction portion can be reduced. From the viewpoint of the impurity concentration in the superjunction portion, the impurity concentration in the RESURF layer can have a shift within the range of 0.87 to 1.5 times that in the second drift layer 19 because the first drift layer is formed.

As described above, when the first drift layer 11 is made thick, the breakdown voltage shared by the first drift layer 11 increases, and the ON resistance increases. However, the influence of a decrease in breakdown voltage due to the charge balance in the superjunction structure can be reduced. To the contrary, when the first drift layer 11 is made thin, the ON resistance decreases. Hence, in this embodiment as well, to improve the recovery characteristic of an internal diode while reducing the ON resistance, the ratio of the first drift layer 11 to the thickness of the carrier conducting layer (the sum of thicknesses of the first and second drift layers) is preferably 0.21 to 0.8, as described in the first embodiment.

The MOS transistor of this embodiment can be manufactured by the method shown in FIGS. 5A to 5E or FIGS. 7A to 7E.

<Eighth Embodiment>

A semiconductor device according to the eighth embodiment of the present invention will be described next.

In a power MOS transistor according to this embodiment, the depth of a RESURF layer 18 is designed such that the difference between the depth of a RESURF layer 18 and the depth of a second drift layer 19 within the range of ±5% of the depth of the second drift layer 19 in the structure described in the seventh embodiment.

Figure 12:
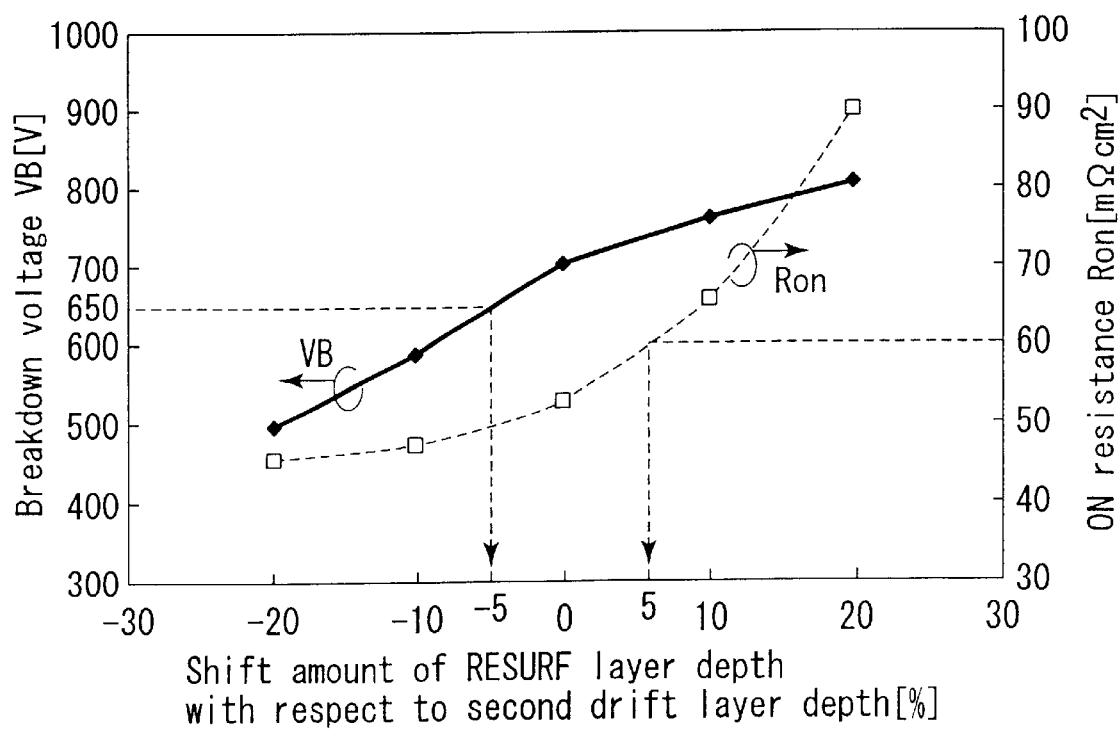
FIG. 12 is a graph showing the relationship between the breakdown voltage and the shift amount of the depth of the RESURF layer with respect to that of the second drift layer.

According to the power MOS transistor with the above structure, an increase in breakdown voltage and reduction in ON resistance can be simultaneously realized. This point will be described below in detail with reference to FIG. 12. FIG. 12 shows the relationship between the breakdown voltage and the shift amount of the depth of the RESURF layer 18 with respect to that of a second drift layer 19.

As described above, the RESURF layer 18 can be formed by repeating ion implantation or by implanting ions into the side wall of a trench and burying a p-type semiconductor layer in the trench. In this step of forming the RESURF layer 18, the depth may sometimes vary.

As shown in FIG. 12, when the depth of the RESURF layer 18 increases, the superjunction structure becomes deep. For this reason, the breakdown voltage increases. However, since a portion in a first drift layer 11, through which electrons can run, becomes small, the ON resistance also increases. Conversely, when the depth of the RESURF layer 18 decreases, the breakdown voltage decreases. However, the ON resistance also decreases. Hence, when the shift amount of the depth of the RESURF layer 18 with respect to that of the second drift layer 19 falls within the range of ±5% of the depth of the second drift layer 19, a power MOS transistor having a breakdown voltage of 650V or more and an ON resistance of 60 mΩcm$^2$ or less can be implemented. That is, as described above, since the first drift layer is added, any adverse influence that may occur when a cause for a decrease in breakdown voltage is generated in the superjunction portion can be reduced. From the viewpoint of the depth of the RESURF layer, the depth of the RESURF layer can have a shift within the range of ±5% of the depth of the second drift layer because the first drift layer is formed.

<Ninth Embodiment>

A semiconductor device according to the ninth embodiment of the present invention will be described next.

In a power MOS transistor according to this embodiment, the impurity concentration in a RESURF layer 18 is set to 1 to 1.3 times that in a second drift layer 19, and the depth is set to 0.95 to 1.05 times.

Figure 13A:
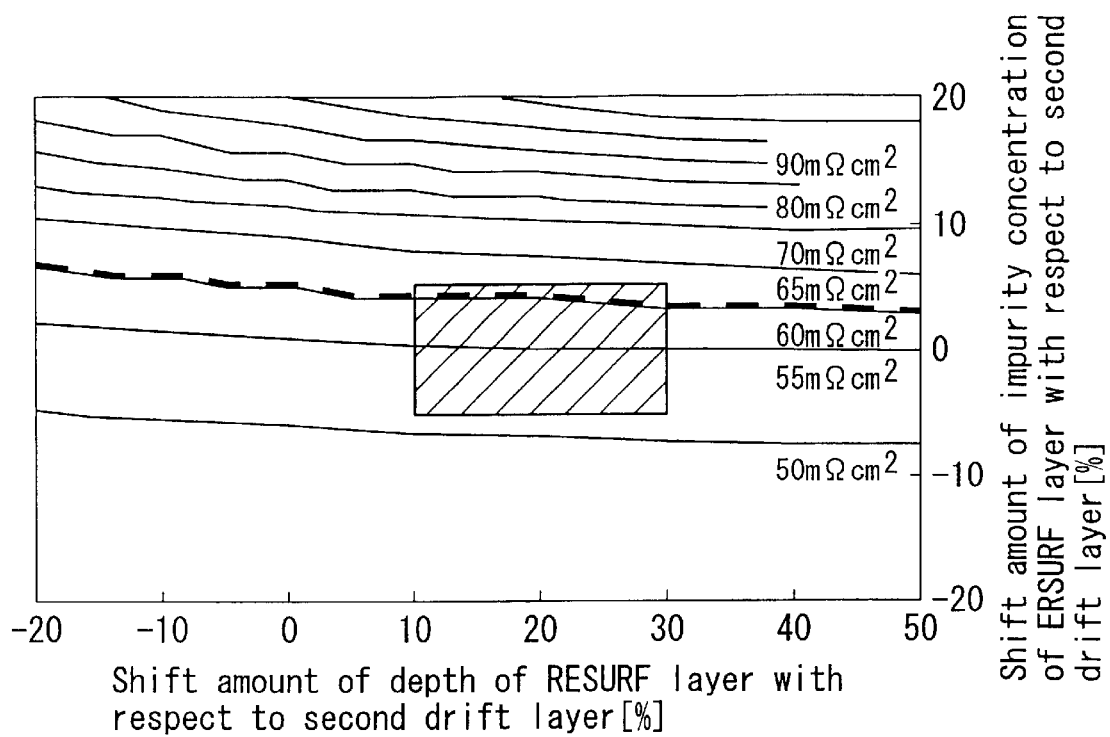
FIG. 13A is a graph showing the relationship between the ON resistance and the shift amounts of the depth and impurity concentration of the RESURF layer with respect to those of the second drift layer.
Figure 13B:
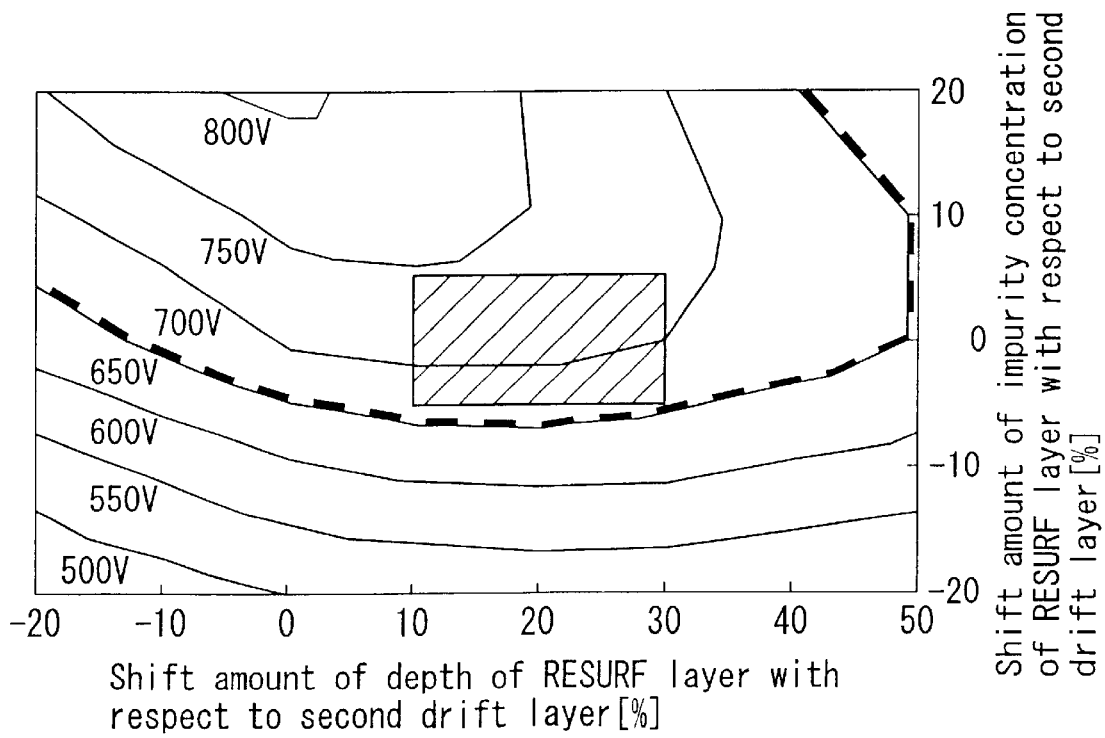
FIG. 13B is a graph showing the relationship between the breakdown voltage and the shift amounts of the depth and impurity concentration of the RESURF layer with respect to those of the second drift layer.

According to the power MOS transistor with the above structure, an increase in breakdown voltage and reduction in ON resistance can be simultaneously realized. This point will be described below in detail with reference to FIGS. 13A and 13B. FIG. 13A shows the relationship between the ON resistance and the shift amounts of the depth and impurity concentration of the RESURF layer 18 with respect to those of the second drift layer 19. FIG. 13B shows the relationship between the breakdown voltage and the shift amounts of the depth and impurity concentration of the RESURF layer 18 with respect to those of the second drift layer 19.

As described above, the depth and impurity concentration of the RESURF layer 18 influence the breakdown voltage and ON resistance. As shown in FIGS. 13A and 13B, especially, the breakdown voltage and ON resistance greatly depend on the depth of the RESURF layer 18. Hence, when the impurity concentration in the RESURF layer 18 is set to 1 to 1.3 times that in the second drift layer, and the depth is set to 0.95 to 1.05 times, a power MOS transistor having a breakdown voltage of 650V or more and an ON resistance of 60 mΩcm$^2$ or less can be implemented. These ranges correspond to hatched regions in FIGS. 13A and 13B. In other words, the design margin to implement a MOS transistor having a breakdown voltage of 650V or more and an ON resistance of 60 mΩcm$^2$ or less can be widened to the ranges shown in FIGS. 13A and 13B because the first drift layer 11 is formed.

The relationship between the RESURF layer 18 and the second drift layer 19 in the seventh to ninth embodiments is not always limited to a 600-V MOS transistor. Even when the rated voltage changes, the relationship almost holds. These structures can be applied not only to the structure described in the first embodiment but also to the power MOS transistors described in the second to sixth embodiments.

<10th Embodiment>

Figure 14:
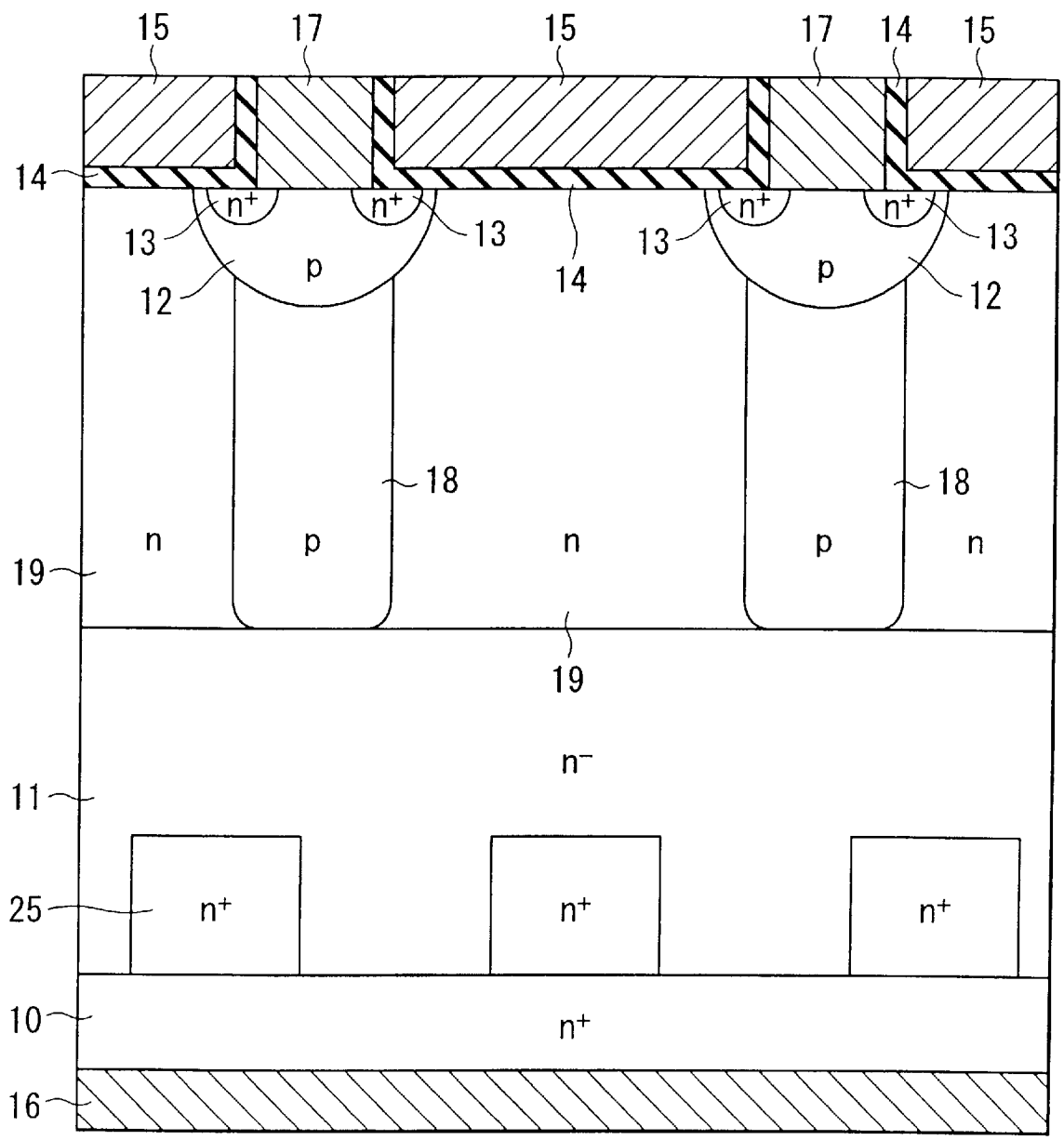
FIG. 14 is a sectional view of a vertical power MOS transistor according to the 10th embodiment of the present invention.

A semiconductor device according to the 10th embodiment of the present invention will be described next with reference to FIG. 14. FIG. 14 is a sectional view of a power MOS transistor according to this embodiment.

As shown in FIG. 14, in the power MOS transistor according to this embodiment, n$^+$-type semiconductor layers 25 are formed in a first drift layer 11 in the structure according to the first embodiment shown in FIG. 2. The n$^+$-type semiconductor layers 25 are periodically formed on a drain layer 10 in the horizontal direction. The n$^+$-type semiconductor layer 25 has an impurity concentration higher than that in the first drift layer 11 and functions as part of the drain layer.

When the n$^+$-type semiconductor layers 25 are formed, the interface between the first drift layer 11 and the drain layers 10 and 25 has an uneven pattern. Many hole carriers that contribute to the recovery current of an internal diode are accumulated in the recessed portions. Since the carriers moderately flow through the depletion layer after reverse recovery, the recovery characteristic can be made soft. If the thickness of the first drift layer 11 is kept unchanged, the ON resistance can be reduced by increasing the occupation ratio of the n$^+$-type semiconductor layer 25 in the direction of depth, i.e., making the n$^+$-type semiconductor layer 25 thick. This is because when the n$^+$-type semiconductor layer 25 becomes thick, the first drift layer 11 can be regarded to be thin.

FIGS. 15A to 15D are sectional views sequentially showing steps in manufacturing the power MOS transistor shown in FIG. 14.

Figure 15A:
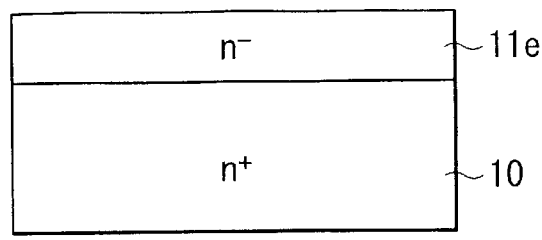
FIGS. 15A to 15D are sectional views sequentially showing steps in manufacturing the vertical power MOS transistor according to the 10th embodiment of the present invention.

First, as shown in FIG. 15A, an n$^-$-type semiconductor layer 1ie serving as part of the first drift layer 11 is formed on the n$^+$-type semiconductor substrate (drain layer) 10.

Figure 15B:
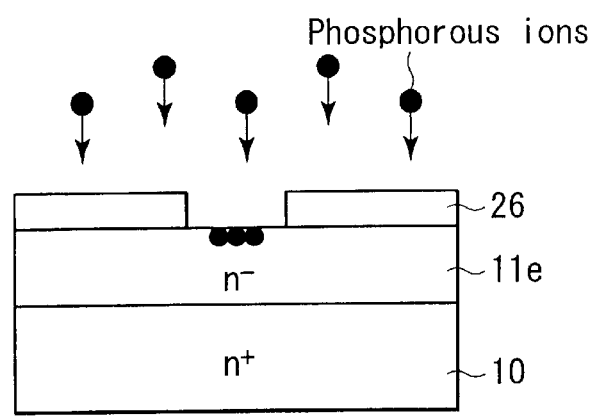

As shown in FIG. 15B, a mask material 26 is formed on the n$^-$-type semiconductor layer 11e. The mask material 26 on a region where the drain layer 25 is to be formed is removed by photolithography and etching. After that, an n-type impurity such as phosphorus is ion-implanted into the drift layer 11e.

Figure 15C:
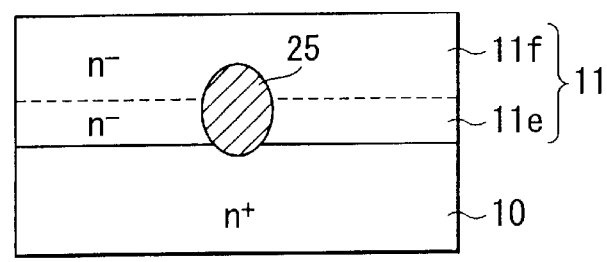

As shown in FIG. 15C, an n$^-$-type semiconductor layer 11f serving as part of the first drift layer is formed on the n$^-$-type semiconductor layer 11e. At this time, the impurity doped in the step described in FIG. 15B is diffused to form the n$^+$-type semiconductor layer 25 which functions as part of the drain layer.

Figure 15D:
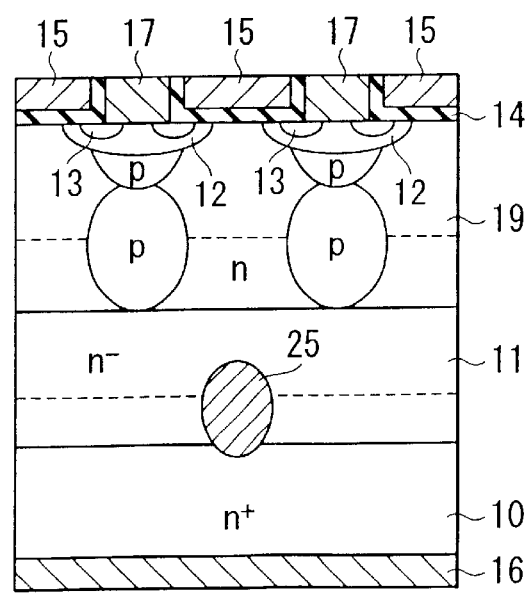

After that, the steps shown in FIGS. 5A to 5E are executed to form the structure shown in FIG. 15D. The steps shown in FIGS. 7A to 7E may be executed.

The step of alternately arranging the first drift layers 11 and drain layers 25 in the horizontal direction is not limited to the above example. Instead, trenches may be selectively formed in the n$^+$-type semiconductor substrate 10, and the n$^+$-type semiconductor layers 25 may be buried in the trenches.

The period of drain layers 25 arranged in the horizontal direction need not always be the same as the period of the superjunction structures. The horizontal width of the drain layer 25 may also have no relation to the pitch of the superjunction structures.

<11th Embodiment>

Figure 16:
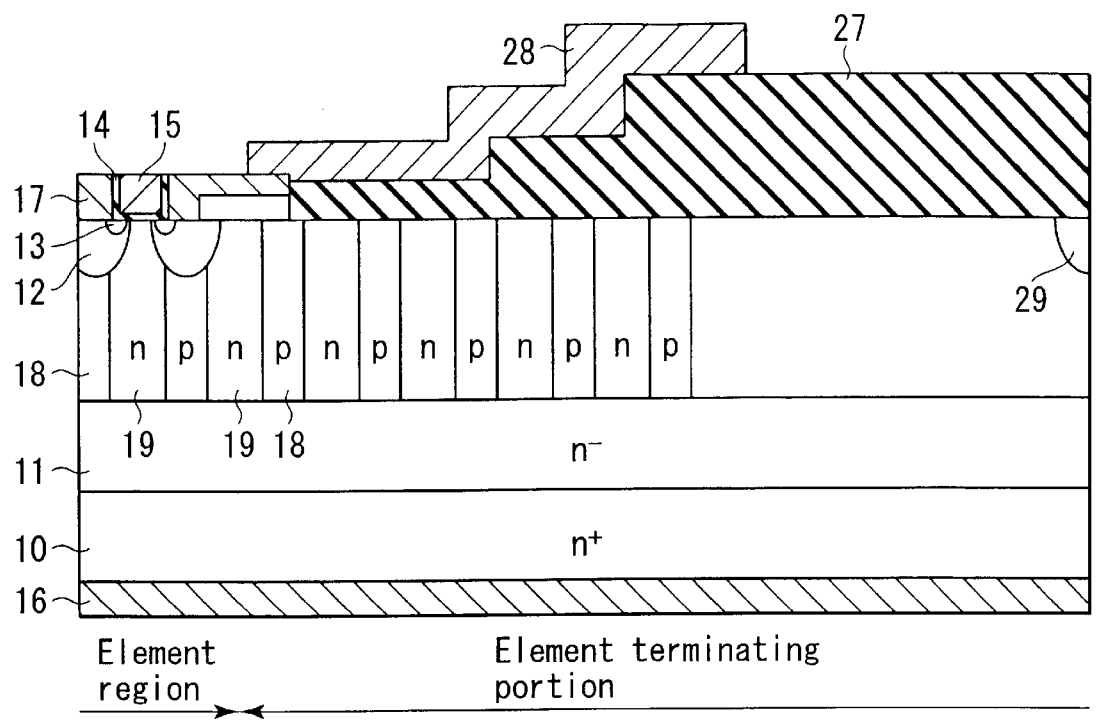
FIG. 16 is a sectional view of a vertical power MOS transistor according to the 11th embodiment of the present invention.

A semiconductor device according to the 11th embodiment of the present invention will be described next with reference to FIG. 16. FIG. 16 is a sectional view of a power MOS transistor according to this embodiment.

As shown in FIG. 16, the power MOS transistor according to this embodiment has a superjunction structure described in the first embodiment not only in an element region but also at an element terminating portion. A field plate 28 is formed on the superjunction structure with an insulating film 27 at the element terminating portion. The field plate 28 is formed from a conductive film such as a metal film or semiconductor film. An n-type channel stopper layer 29 which stops spread of a depletion layer is formed at the outermost periphery of the element terminating portion.

According to the arrangement of this embodiment, when a high voltage is applied, the superjunction structure portion at the element terminating portion is quickly depleted by the effect of the field plate 28 and equivalently changes to a lightly-doped impurity layer. For this reason, concentration of the electric field at the element terminating portion is suppressed, and the breakdown voltage is held. Even when a RESURF layer is formed on the surface of the element terminating portion, the superjunction portion is quickly depleted as in the case wherein the field plate 28 is formed, and the same effect as described above can be obtained. In this embodiment, the superjunction structure shown in FIG. 2 described in the first embodiment has been exemplified. However, the 11th embodiment can also be applied to the structures described in the second to 10th embodiments.

<12th Embodiment>

Figure 17:
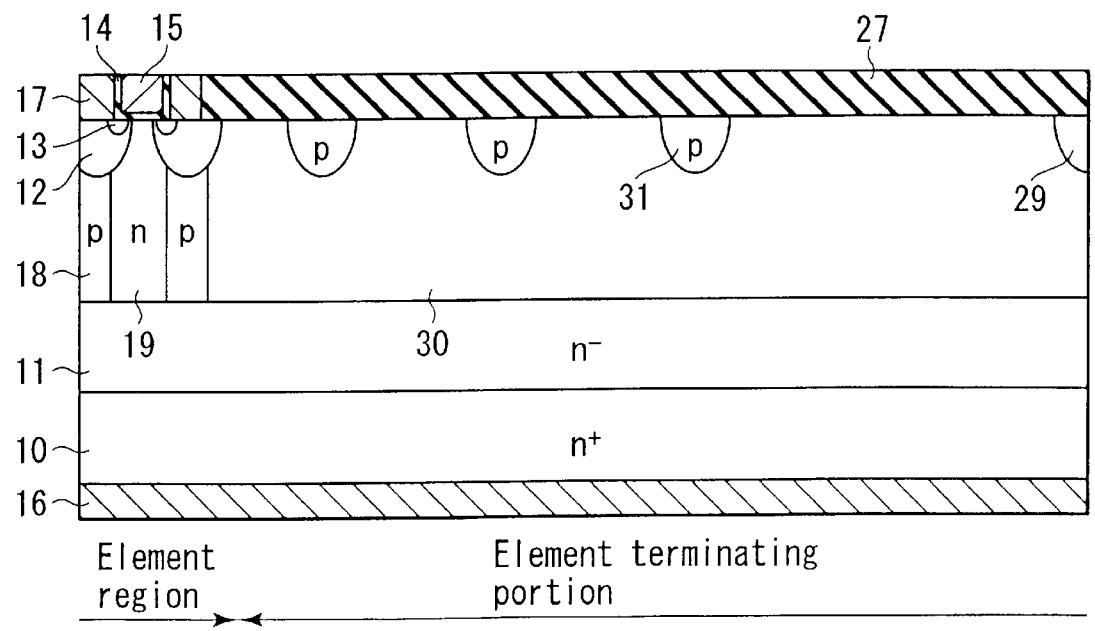
FIG. 17 is a sectional view of a vertical power MOS transistor according to the 12th embodiment of the present invention.

A semiconductor device according to the 12th embodiment of the present invention will be described next with reference to FIG. 17. FIG. 17 is a sectional view of a power MOS transistor according to this embodiment.

As shown in FIG. 17, in the power MOS transistor according to this embodiment, a superjunction structure described in the first embodiment is formed at the element region. An $n^-$-type semiconductor layer 30 is formed on a first drift layer 11 at the element terminating portion. A plurality of guard rings 31 are formed in the surface region of the $n^-$-type semiconductor layer 30.

According to this arrangement, when the impurity concentration in the $n^-$-type semiconductor layer 30 is set sufficiently low, the electric field in the horizontal direction is relaxed, and a decrease in breakdown voltage at the element terminating portion is suppressed. Especially, to quickly deplete the semiconductor layer 30, its impurity concentration is preferably lower than that in the first drift layer 11. The superjunction structure at the element region need not always be the structure according to the first embodiment. It may be any one of the structures described in the second to 10th embodiments.

<13th Embodiment>

Figure 18:
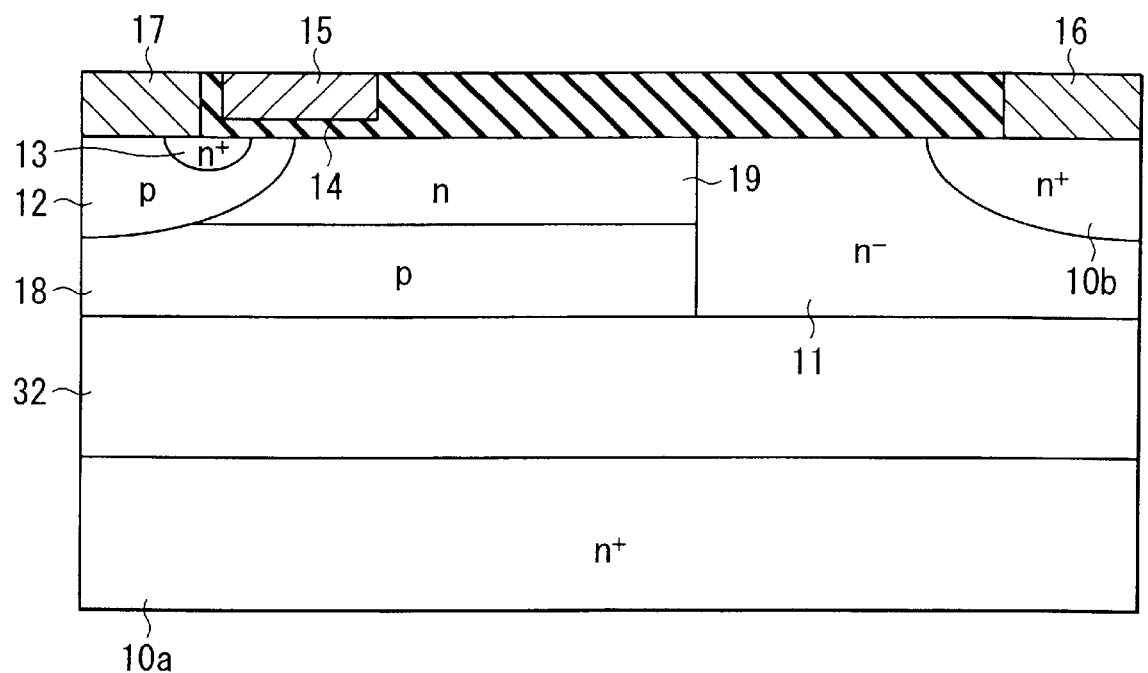
FIG. 18 is a sectional view of a lateral power MOS transistor according to the 13th embodiment of the present invention.

A semiconductor device according to the 13th embodiment of the present invention will be described next with reference to FIG. 18. FIG. 18 is a sectional view of a power MOS transistor according to this embodiment. In this embodiment, the superjunction structure according to the first embodiment is applied to a lateral power MOS transistor.

As shown in FIG. 18, a semiconductor layer 32 having a low impurity concentration is formed on an $n^+$-type drain layer 10a. A p-type RESURF layer 18 and n-type first drift layer 11 are selectively formed on the semiconductor layer 32. The RESURF layers 18 and first drift layers 11 are periodically arranged in the horizontal direction. An n-type second drift layer 19 is formed on the RESURF layer 18. The RESURF layer 18 and second drift layer 19 form a superjunction structure. A p-type base layer 12 is formed in the surface of the superjunction structure. An $n^+$-type source layer 13 is formed in the surface region of the base layer 12. An $n^+$-type drain layer 10b is formed in the surface region of the first drift layer 11 while being separated from the superjunction structure.

A gate electrode 15 is formed at least on the base layer between a source layer 13 and the second drift layer 19 with a gate insulating film 14 interposed therebetween. A drain electrode 16 is formed on the drain layer 10b. A source electrode 17 is formed in contact with the source layer 13 and base layer 12.

Even in a lateral power MOS transistor, when a superjunction structure is used for a drift layer, the same problem as in a vertical power MOS transistor is posed. That is, the recovery characteristic of an internal diode is hard.

However, according to the arrangement of this embodiment, since the first drift layer 11 is present between the drain layer 10b and the superjunction structure, the effect described in the first to 11th embodiments can be obtained. That is, a soft recovery characteristic can be obtained while keeping the ON resistance low.

In FIG. 18, the superjunction structure includes one stage of p-n junction cells. However, two or more stages may be formed. Additionally, in FIG. 18, the p-n junction cells in the superjunction structure are stacked. However, the p-n junction cells may be formed in the planar direction.

In FIG. 18, the $n^+$-type drain layer 10a is formed under the wafer. However, the drain layer 10a may be omitted. The wafer may be an SOI (Silicon On Insulator) wafer. In this case, the lightly-doped impurity layer 32 can be omitted.

When a trench gate is formed as a MOS gate structure, and a plurality of stages of superjunction structures are stacked to increase the layer area, the ON resistance can be reduced.

<14th Embodiment>

Figure 19A:
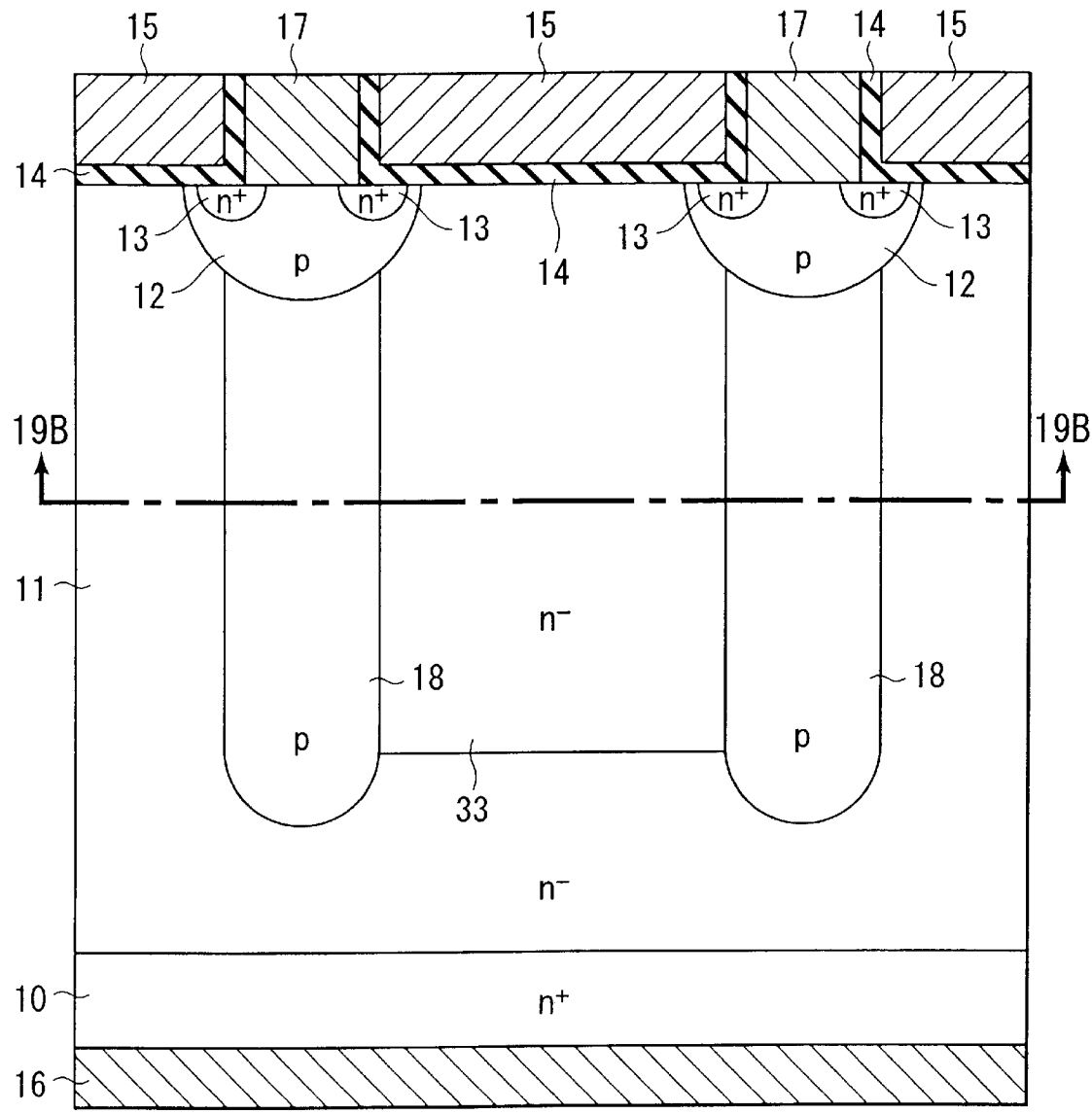
FIG. 19A is a sectional view of a vertical power MOS transistor according to the 14th embodiment of the present invention.

A semiconductor device according to the 14th embodiment of the present invention will be described next with reference to FIG. 19A. FIG. 19A is a sectional view of a power MOS transistor according to this embodiment.

As shown in FIG. 19A, an $n^-$-type first drift layer 11 is formed on an $n^+$-type drain layer 10. A plurality of p-type RESURF layers 18 are formed in the surface region of the first drift layer 11. The RESURF layers 18 are periodically arranged while being separated from each other. An $n^-$-type second drift layer 33 is formed in a region sandwiched between the RESURF layers 18. P-type base layers 12 are selectively formed in the surface regions of the first and second drift layers 11 and 33 and RESURF layers 18. $N^+$-type source layers 13 are selectively formed in the surface region of each base layer 12. A gate electrode 15 is formed on the second drift layer 33 and base layers 12 between adjacent source layers 13 with a gate insulating film 14 interposed therebetween. Source electrodes 17 are formed on the source layers 13 and base layers 12. A drain electrode 16 is formed on the lower surface of the drain layer 10.

The impurity concentration in the drain layer 10 of the power MOS transistor having the above structure is, e.g., $6\times10^{18}$ cm$^{-3}$. The thickness of the drain layer 10 is about 200 μm. The impurity concentration in the first drift region 11 is, e.g., $2\times10^{15}$ cm$^{-3}$. The thickness of the first drift region 11 is about 50 μm. The impurity concentration in the base layer 12 is, e.g., $3\times10^{17}$ cm$^{-3}$. The base layer 12 is formed to a depth of about 2 μm from the surface of the drift layer 11. The impurity concentration in the source layer 13 is, e.g., $1 \times 10^{20}$ cm$^{-3}$. The source layer 13 is formed to a depth of about 0.2 μm from the surface of the base layer 12. The impurity concentration in both the RESURF layer 18 and the second drift layer 33 is, e.g., $2 \times 10^{15}$ cm$^{-3}$. These layers have a width of about 4 μm. The gate insulating film 14 is, e.g., a silicon oxide film (SiO$_2$) and has a thickness of about 0.1 μm.

Figure 19B:
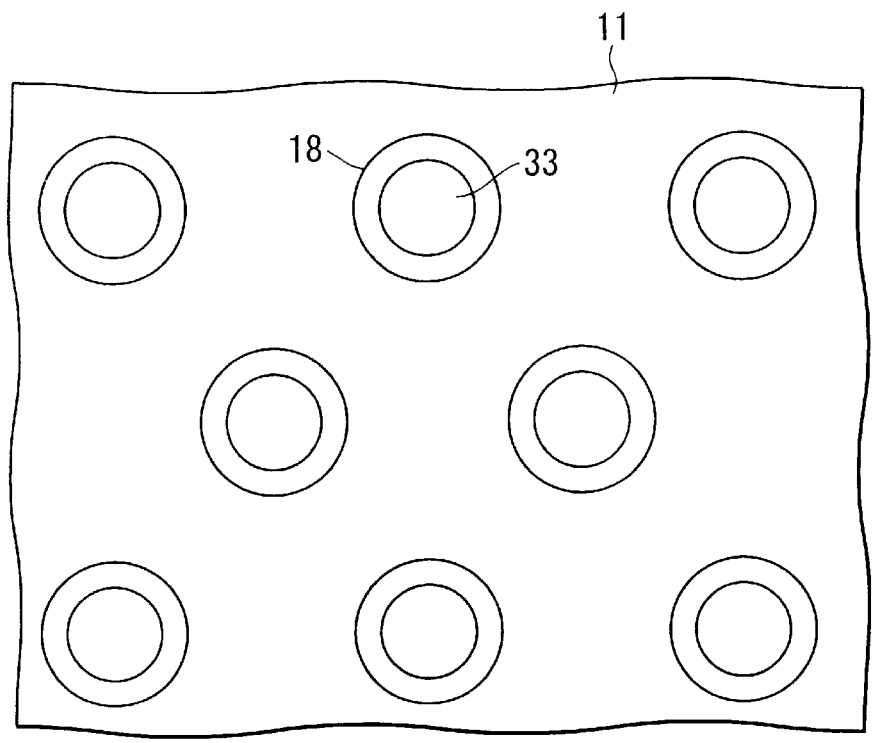
FIGS. 19B and 19C are plan views taken along a line 19B—19B in FIG. 19A.

FIG. 19B is a plan view taken along a line 19B—19B in FIG. 19A. FIG. 19B shows the layout relationship between the first and second drift layers 11 and 33 and the RESURF layers 18.

As shown in FIG. 19B, the RESURF layer 18 has an almost annular planar shape and is buried in a direction perpendicular to the in-plane direction of the drift layer 11. The second drift layer 33 is formed in an inner region surrounded by the almost annular RESURF layer 18. Hence, the RESURF layer 18 is in contact with the second drift layer 33 at the inner periphery and also in contact with the first drift layer 11 at the outer periphery. The RESURF layer 18 and the first and second drift layers 11 and 33 form a superjunction structure.

The planar shape of the RESURF layer 18 is not limited to that shown in FIG. 19B. For example, the RESURF layer 18 may have an elliptical, flat circular, or polygonal planar shape, or an indeterminate peripheral shape.

Figure 19C:
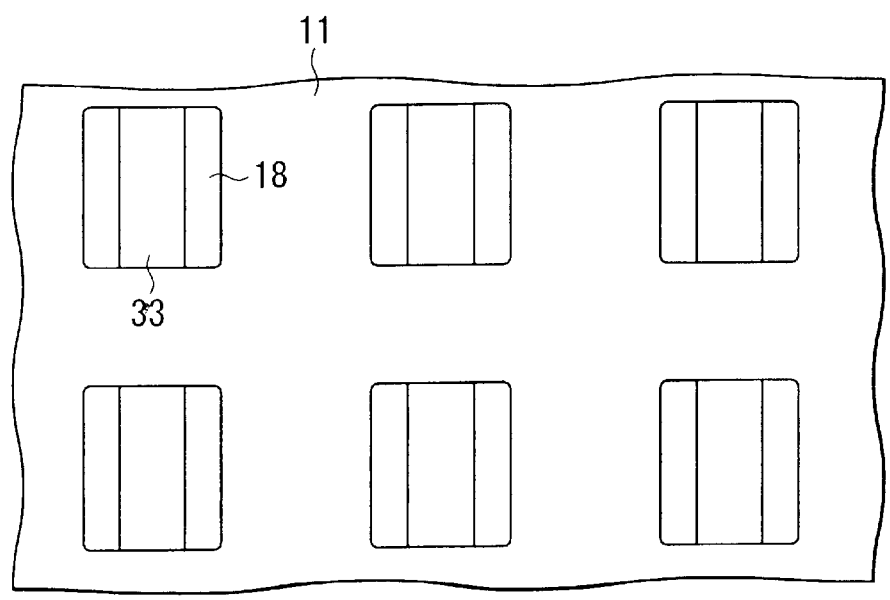

FIG. 19C shows another planar shape of the RESURF layer 18. FIG. 19C corresponds to a plan view taken along a line 19B—19B in FIG. 19A. As shown in FIG. 19C, the RESURF layers 18 are formed into parallel plates which sandwich the second drift layer 33. The RESURF layer 18 need not always completely surround the second drift layer 33. In this case as well, the shape of the RESURF layer 18 is not limited to a flat plate shape and may be a flat circular shape.

A method of manufacturing the vertical power MOS transistor having the above structure will be described next with reference to FIGS. 20A to 20E. FIGS. 20A to 20E are sectional views sequentially showing steps in manufacturing the MOS transistor.

Figure 20A:
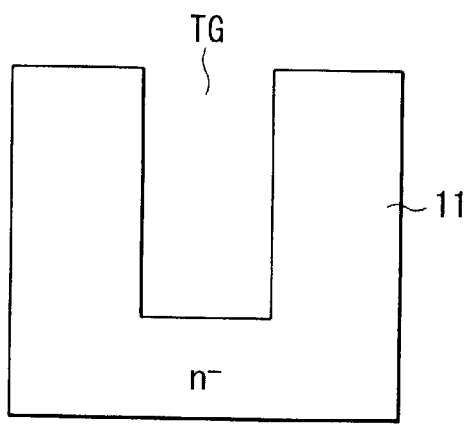
FIGS. 20A to 20E are sectional views sequentially showing steps in manufacturing the vertical power MOS transistor shown in FIG. 19A.

First, as shown in FIG. 20A, a trench TG is formed in the surface region of the n$^-$-type first drift layer 11 by anisotropic etching such as RIE (Reactive Ion Etching).

Figure 20B:
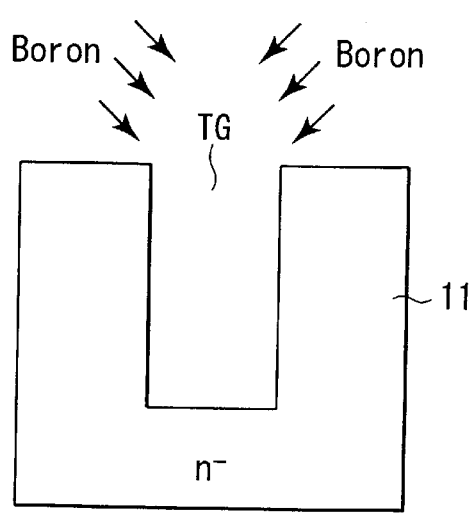

As shown in FIG. 20B, a p-type impurity is doped into the inner wall of the trench TG. To dope a p-type impurity, e.g., boron or the like is obliquely ion-implanted. However, the manufacturing method according to this embodiment is not limited to ion implantation. For example, vapor phase diffusion or solid phase diffusion may be used. By thus doping an impurity, a prospective portion of a p-type RESURF layer 18 can be formed.

Hence, the opening shape of the trench TG is appropriately determined in accordance with the shape of the RESURF layer 18. For example, to form the structure shown in FIG. 19B, a trench TG having a circular opening shape conforming to the inner peripheral shape of the almost annular RESURF layer 18 (i.e., the outer peripheral shape of the second drift layer 33) is formed. To form the structure shown in FIG. 19C, a trench TG having a rectangular opening shape conforming to the interval portion between each pair of RESURF layers 18 (i.e., the outer peripheral shape of the second drift layer 33) is formed.

The method of implanting an impurity can also be appropriately determined in accordance with the shape of the RESURF layer 18. For example, to form the structure shown in FIG. 19B, an impurity must be uniformly doped into the inner wall of a circular trench TG. If ion implantation from oblique directions is to be used, the entire inner wall of the trench TG must be irradiated with ions by, e.g., rotating the wafer. When vapor phase diffusion or solid phase diffusion is to be used, an impurity is just diffused.

On the other hand, to form the structure shown in FIG. 19C, an impurity must be doped into only a pair of side walls of a rectangular trench TG. If ion implantation from oblique directions is to be used, each of opposite side walls in the trench is obliquely irradiated with ions without rotating the wafer. When vapor phase diffusion or solid phase diffusion is to be used, side walls and bottom portion of the trench TG, which is not doped with an impurity, is preferably masked in advance, or unnecessary RESURF layer 18 is removed by etching.

In the example shown in FIG. 19C, combinations of the p-type RESURF layers 18 and n$^-$-type second drift layers 33 are laid out in a matrix. However, the p-type RESURF layers 18 and n$^-$-type second drift layers 33 may be laid out in stripes over the element region.

Figure 20C:
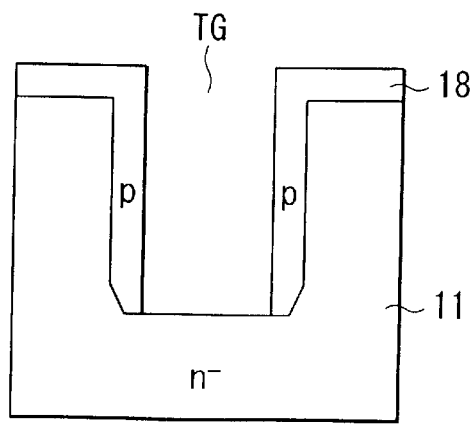

After the impurity is doped in the above way, as shown in FIG. 20C, activation annealing is performed. As a result of annealing, the doped p-type impurity is activated. Hence, the p-type RESURF layers 18 are formed as shown in FIG. 20C.

Figure 20D:
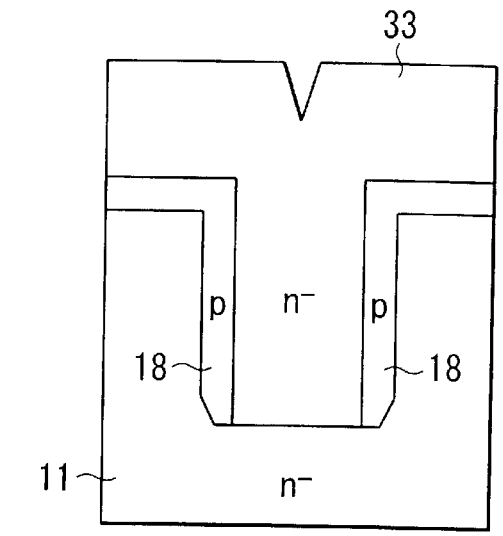

As shown in FIG. 20D, a crystal growth is performed to fill the trench TG. The n$^-$-type second drift layer 33 is formed in the trench by CVD (chemical vapor deposition) using, e.g., silane (SiH$_4$) gas.

Figure 20E:
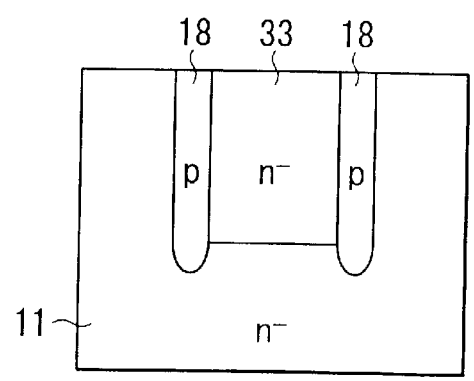

As shown in FIG. 20E, the surface of the wafer is planarized. The second drift layer 33 and RESURF layers 18 are polished and planarized by, e.g., CMP (Chemical Mechanical Polishing) until the first drift layer 11 is exposed, thereby obtaining the structure shown in FIG. 20E.

Next, a MOS structure is formed on the wafer surface by a known method. More specifically, the surfaces of the first and second drift layers 11 and 33 and RESURF layers 18 are thermally oxidized to form the gate insulating film 14. Polysilicon is deposited on the surface of the gate insulating film 14 and patterned by photolithography and etching to form the gate electrode 15. A p-type impurity such as boron is ion-implanted to form the base layers 12. The base layers 12 are selectively formed because the gate electrode 15 serves as a mask. The insulating film 14 is removed. An n-type impurity such as arsenic is ion-implanted to form the n$^+$-type source layers 13 in the surface region of each base layer 12. Aluminum is deposited on the source layers 13 and base layer 12 and patterned to form the source electrode 17.

With the above process, the vertical power MOS transistor shown in FIG. 19A is completed.

According to the above manufacturing method, the trench TG having a width corresponding to the interval between adjacent RESURF layers 18 is formed. After the RESURF layers 18 are formed in the inner walls of the trench, the second drift layer 33 is formed in the trench. Hence, in the step of forming the RESURF layers 18, the cumbersomeness of repeating crystal growth and ion implantation a plurality of number of times can be eliminated. Simultaneously, the RESURF layers 18 and drift layers 11 and 33 are not divided by the crystal interfaces. Hence, any decrease in breakdown voltage or degradation in electrical characteristics can be prevented.

If a thin and deep trench TG is formed in correspondence with each RESURF layer 18, it becomes difficult to carry out the step of forming the second drift layer 33 in the trench TG. However, according to this embodiment, a wide trench TG corresponding to the interval between adjacent RESURF layers 18 is formed. For this reason, the second drift layer 33 can properly and easily be formed in the trench TG. The trench TG can be made narrow as long as burying the trench TG is possible. Hence, as compared to a case wherein trenches corresponding to the individual RESURF layers 18 are formed, the layout pitch of the RESURF layers 18 can be reduced.

Figure 20F:
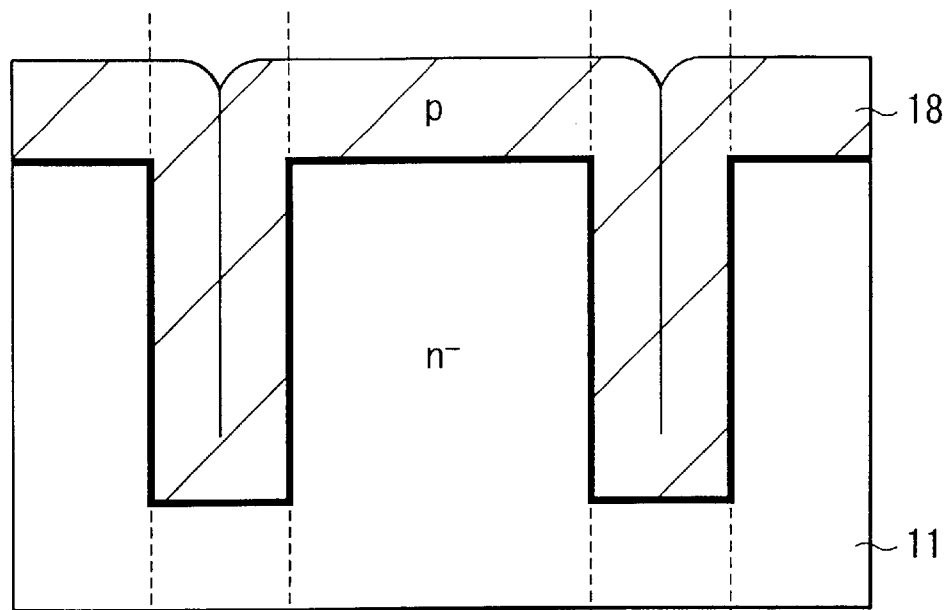
FIGS. 20F and 20G are sectional views of a superjunction structure.
Figure 20G:
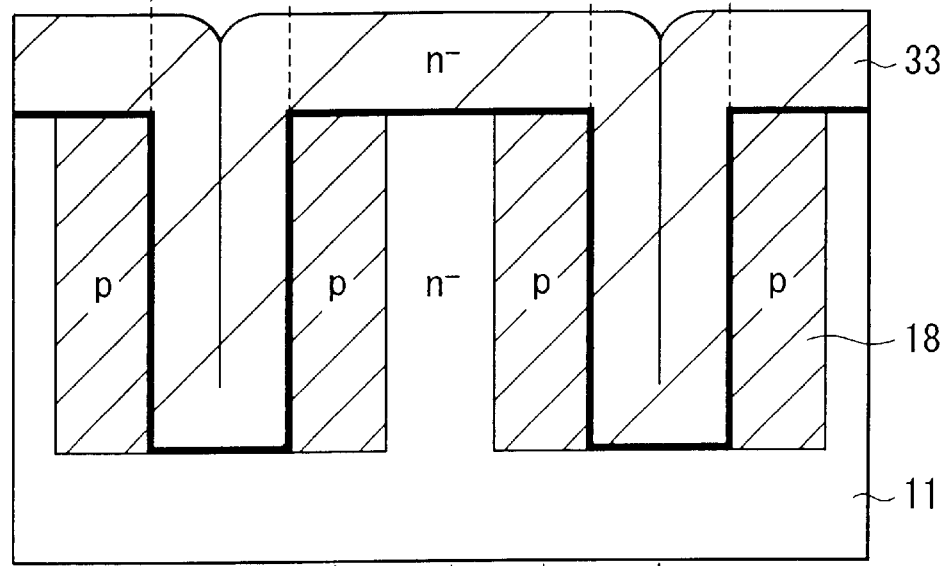

That is, as compared to the method of forming a trench and then burying the RESURF layer 18 in the trench, the repetitive period of n-type drift layer and p-type RESURF layer can be halved in this embodiment. As a consequence, the impurity concentrations in the first and second drift layers 11 and 33 can be increased to two times those in the prior art. Hence, the ON resistance of the power MOS transistor can be halved. This point will be described with reference to FIGS. 20F and 20G. FIGS. 20F and 20G are sectional views of superjunction structures. In FIG. 20F, a RESURF layer is buried in trenches. In FIG. 20G, a drift layer is buried in trenches, as described in this embodiment. Each bold line in FIGS. 20F and 20G indicates the boundary between a layer and trenches. In FIGS. 20F and 20G, the trenches are formed at the same pitch.

As shown in FIG. 20F, when the p-type RESURF layer 18 is buried in the trenches, only the drift layer 11 is present in the region between adjacent trenches. Hence, two semiconductor elements (2 cells) are formed between the RESURF layers 18 buried in the two trenches.

However, in the manufacturing method according to this embodiment, as shown in FIG. 20G, the second drift layer 33 is buried in the trenches. The RESURF layers 18 are formed in the side walls of the trenches by, e.g., ion implantation. Hence, two RESURF layers 18 and the first drift layer 11 are present in the region between adjacent trenches. At this time, four semiconductor elements (4 cells) are formed between the second drift layers 33 buried in the two trenches. That is, the width per semiconductor element can be halved as compared to the case shown in FIG. 20F. In other words, when trenches are formed at the same pitch as in FIG. 20F, the degree of integration can be doubled as compared to the structure shown in FIG. 20F.

In addition, according to this embodiment, for the drift layer surrounding the RESURF layer 18, the impurity concentrations in the first drift layer 11 and second drift layer 33 can be independently set. That is, it is advantageous because the degree of freedom of device design increases. For example, when the impurity concentration in the first drift layer 11 is lower than that in the second drift layer 33, the same effects as those of the semiconductor element described in the first embodiment can be obtained.

The above-described manufacturing method of this embodiment can be applied not only to a power MOS transistor but also to any semiconductor element which requires a region of a given conductivity type to be buried in a semiconductor having a conductivity type opposite to the given conductivity type so as to obtain the same effect as described above. In this embodiment, the drain layer 10 is omitted. However, it may be formed as needed. For example, an $n^+$-type semiconductor substrate may be used as a drain layer, and a first drift layer may be formed by implanting an impurity into the surface of the drain layer. The first drift layer may be deposited on the drain layer 10. Alternatively, an $n^-$-type semiconductor substrate may be used as the first drift layer 11, and the drain layer 10 may be formed on the lower surface of the first drift layer 11.

<15th Embodiment>

Figure 21:
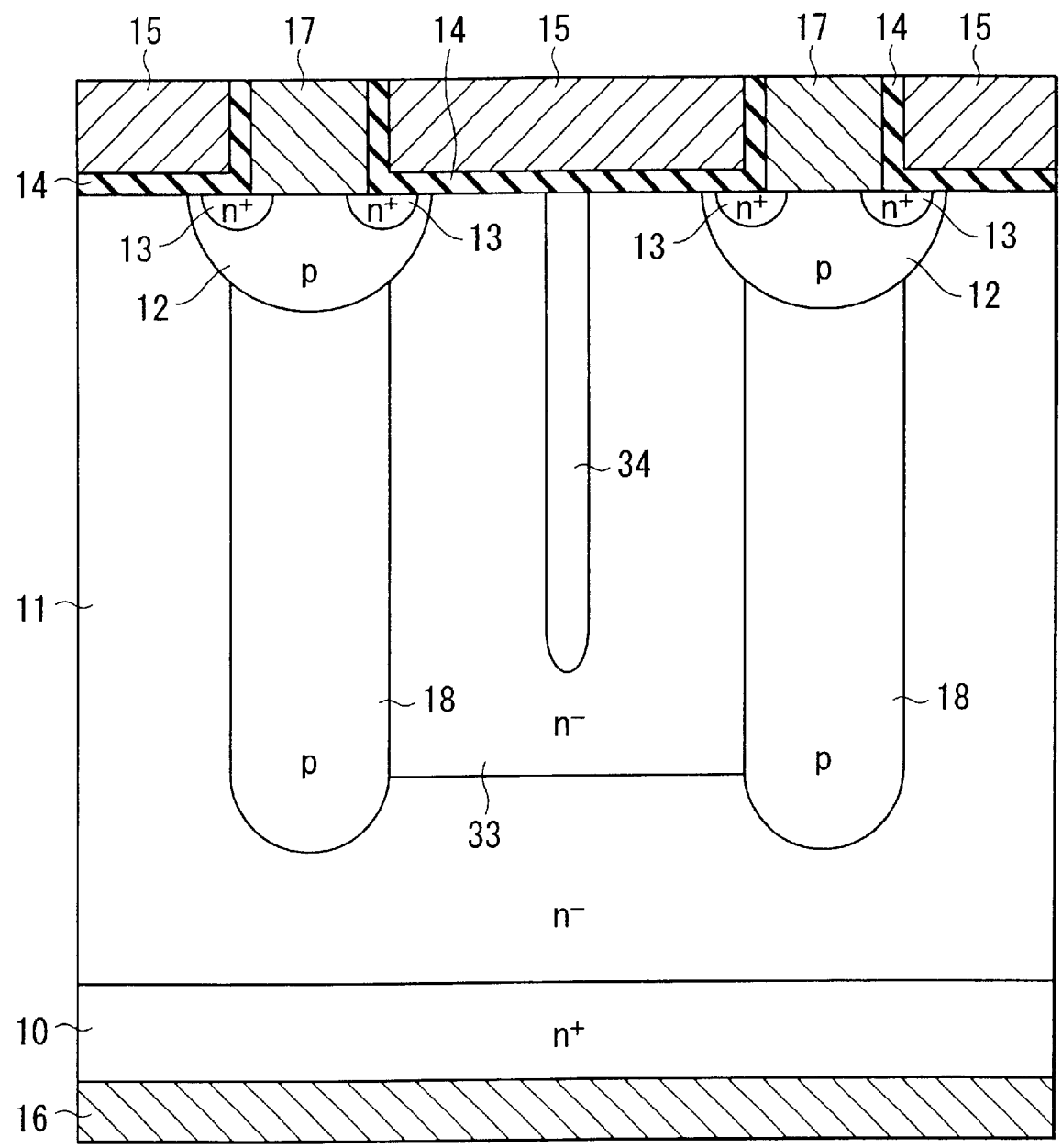
FIG. 21 is a sectional view of a vertical power MOS transistor according to the 15th embodiment of the present invention.

A semiconductor device according to the 15th embodiment of the present invention will be described next with reference to FIG. 21. FIG. 21 is a sectional view schematically showing the structure of a power MOS transistor according to this embodiment.

As shown in FIG. 21, the MOS transistor according to this embodiment also has an insulating film 34 at the center of a drift layer 33 in the structure according to the 14th embodiment.

Figure 22A:
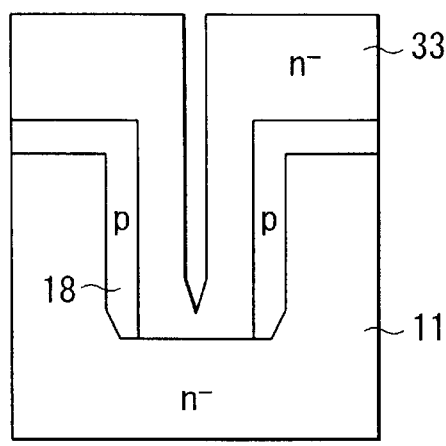
FIGS. 22A to 22C are sectional views sequentially showing steps in manufacturing the vertical power MOS transistor shown in FIG. 21.
Figure 22B:
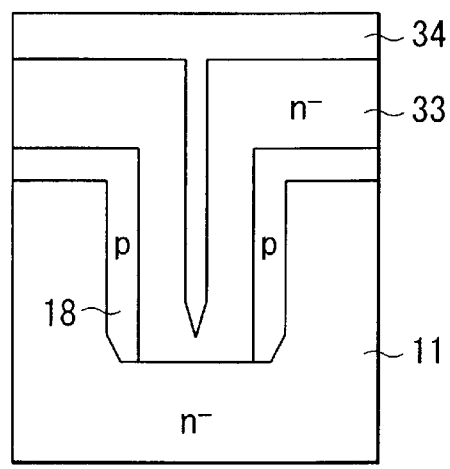
Figure 22C:
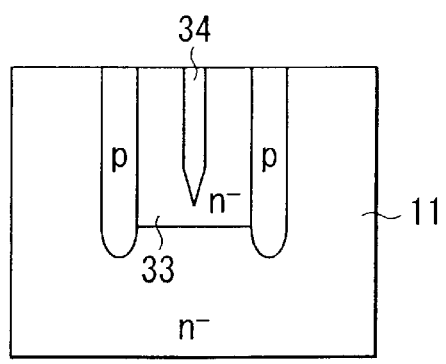

A method of manufacturing the MOS transistor shown in FIG. 21 will be described with reference to FIGS. 22A to 22C. FIGS. 22A to 22C are sectional views sequentially showing steps in manufacturing the MOS transistor shown in FIG. 21.

First, the structure shown in FIG. 20C is obtained by the process described in the 14th embodiment. Next, as shown in FIG. 22A, the second drift layer 33 is formed on the RESURF layers 18 by crystal growth. At this time, a trench TG is not fully filled with the second drift layer 33.

As shown in FIG. 22B, thermal oxidation is performed to oxidize the surface of the second drift layer 33. As a result, the unfilled portion of the trench is filled with the insulating film ($SiO_2$) 34 formed by oxidation. The insulating film 34 need not always be formed by thermal oxidation. It may be deposited by, e.g., CVD.

Next, the insulating film 34, second drift layer 33, and RESURF layers 18 are polished and planarized to obtain the structure shown in FIG. 22C. After that, a vertical power MOS transistor shown in FIG. 21 is completed by a known MOS process.

With the above manufacturing method, since the oxide film 34 is formed, the growth interface of the second drift layer 33 can be terminated to a stable state, and any leakage current or decrease in breakdown voltage can be suppressed. This point will be described below.

In the step of forming the second drift layer 33, crystals grow from opposite inner walls of the trench TG and finally hit each other at the center of the second drift layer 33. That is, since a growth interface is formed at the center of the second drift layer 33, a number of crystal defects are present. This may generate a leakage current or decrease the breakdown voltage.

In this embodiment, to decrease the number of defects, crystal growth is stopped before the second drift layer completely fills the trench. Then, thermal oxidation is performed to completely fill the unfilled portion in the trench with the oxide film 34. As a result, the interface in the second drift layer 33 is terminated by the insulating film 34 to form a stable interface. Hence, the leakage current can be suppressed. The insulating film 34 need not always be formed from a $SiO_2$ film. Even when a nitride film or any other compound is used, the same effect as described above can be obtained.

<16th Embodiment>

Figure 23A:
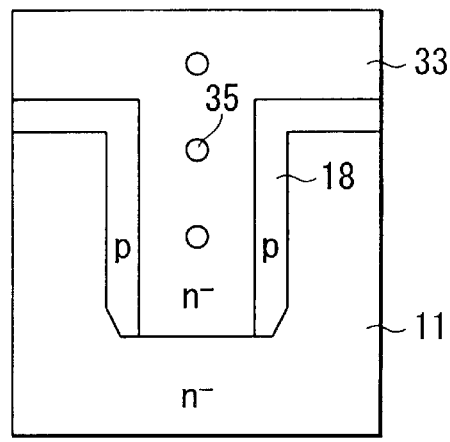
FIGS. 23A and 23B are sectional views sequentially showing steps in manufacturing a vertical power MOS transistor according to the 16th embodiment of the present invention.
Figure 23B:
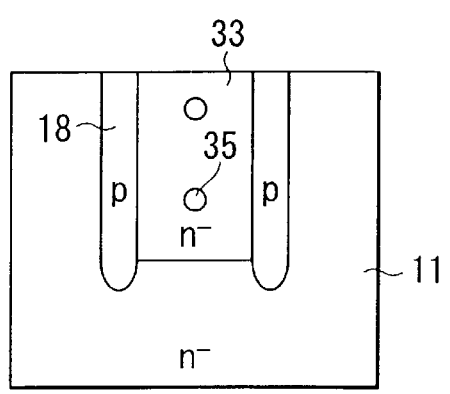

A method of manufacturing a semiconductor device according to the 16th embodiment of the present invention will be described next with reference to FIGS. 23A and 23B. FIGS. 23A and 23B are sectional views sequentially showing steps in manufacturing a power MOS transistor according to this embodiment.

First, the structure shown in FIG. 22A is obtained by the process described in the 15th embodiment. That is, before a trench TG is completely filled with a second drift layer 33, crystal growth of the second drift layer 33 is stopped.

Next, high-temperature annealing in a hydrogen atmosphere is executed. As a result, silicon atoms near the surface of the second drift layer 33 are diffused to fill and planarized the unfilled portion of the trench TG. Thus, the number of crystal defects at the interface in the second drift layer 33 is decreased. When the trench TG is filled using high-temperature annealing in a hydrogen atmosphere, cavities 35 may be formed, as shown in FIG. 23A. However, since silicon atoms in the inner wall surface of each cavity 35 are terminated by hydrogen atoms, the number of defects such as dangling bonds can be reduced.

After this step, as shown in FIG. 23B, the second drift layer 33 and RESURF layers 18 are polished and planarized. Then, the structure shown in FIG. 19A is completed by a known MOS process.

Even when the RESURF layers 18 are formed by forming the trench TG and then burying a p-type semiconductor in the trench TG, crystal growth of the p-type semiconductor can be stopped before the trench is completely filled. Then, the trench can be planarized by a high-temperature treatment in a hydrogen atmosphere. In this case as well, the number of defects at the interface can be reduced.

<17th Embodiment>

A method of manufacturing a semiconductor device according to the 17th embodiment of the present invention will be described next with reference to FIGS. 24A to 24F. FIGS. 24A to 24F are sectional views sequentially showing steps in manufacturing a vertical power MOS transistor according to this embodiment. In this embodiment, RESURF layers are "nested".

First, the structure shown in FIG. 20C is obtained by the process described in the 14th embodiment. Next, as shown in FIG. 24A, a second drift layer 33 is formed on RESURF layers 18 and a first drift layer 11 at the bottom portion of the trench. At this time, a trench TG is not fully filled with the second drift layer 33, as shown in FIG. 24A. The thickness of the second drift layer 33 can be appropriately determined in accordance with the pitch of the RESURF layers 18 to be finally formed.

As shown in FIG. 24B, a p-type impurity such as boron is obliquely ion-implanted into the second drift layer 33 again. The p-type impurity is activated by annealing to form a second RESURF layer 36, as shown in FIG. 24C.

As shown in FIG. 24D, an n⁻-type semiconductor layer 37 is formed on the second RESURF layer 36 to fill the trench TG. The n⁻-type semiconductor layer 37 functions as a drift layer (third drift layer).

The second and third drift layers 33 and 37 and the RESURF layers 18 and 36 are polished and planarized to obtain the structure shown in FIG. 24E.

Figure 24F:
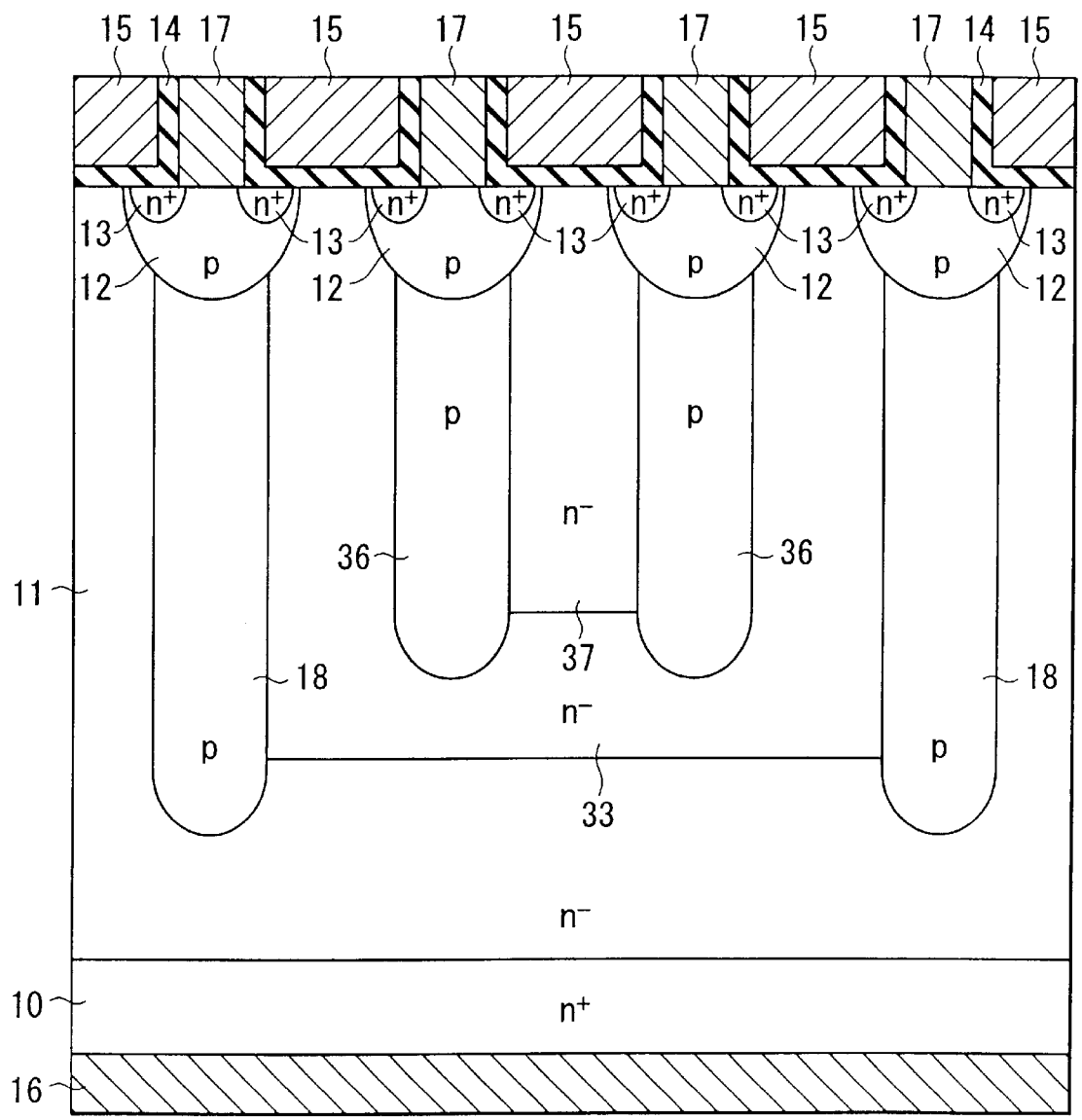

After that, the vertical power MOS transistor shown in FIG. 24F is completed by a known MOS process.

According to the above manufacturing process, the pair of second RESURF layers 36 can be "nested" between the pair of RESURF layers 18. When the method of this embodiment is used, the cell width of the RESURF layer can be controlled by the thickness of crystal growth.

<18th Embodiment>

A method of manufacturing a semiconductor device according to the 18th embodiment of the present invention will be described next with reference to FIGS. 25A to 25D. FIGS. 25A to 25D are sectional views sequentially showing steps in manufacturing a vertical power MOS transistor according to this embodiment.

First, the structure shown in FIG. 20C is obtained by the process described in the 14th embodiment. An n-type impurity such as phosphorus or arsenic is implanted into the side walls of RESURF layers 18. To implant the impurity, ion implantation from oblique directions with respect to the side walls of the trench or a method such as vapor phase diffusion or solid phase diffusion can be used.

Figure 25A:
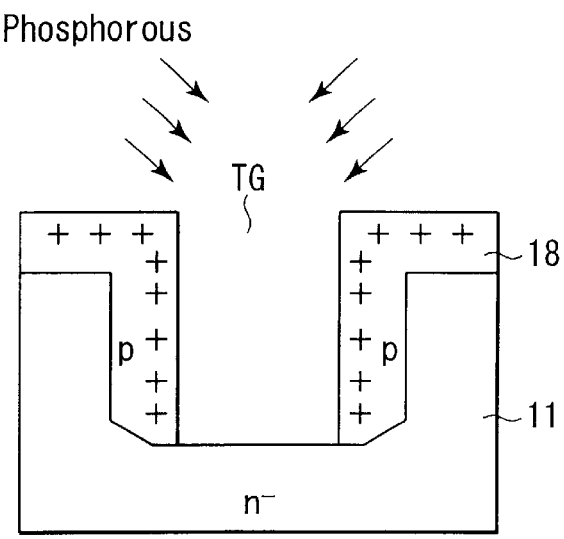
FIGS. 25A to 25D are sectional views sequentially showing steps in manufacturing a vertical power MOS transistor according to the 18th embodiment of the present invention.
Figure 25B:
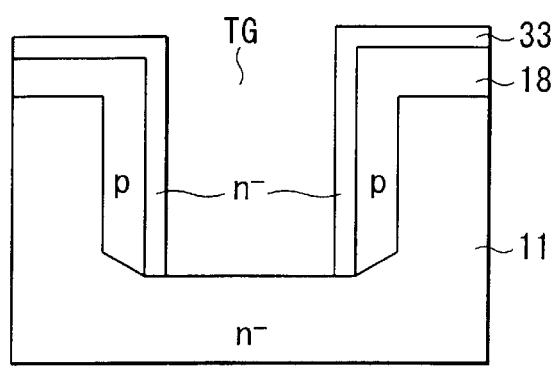

As shown in FIG. 25B, the n-type impurity is activated by activation annealing to form second drift layers 33.

Figure 25C:
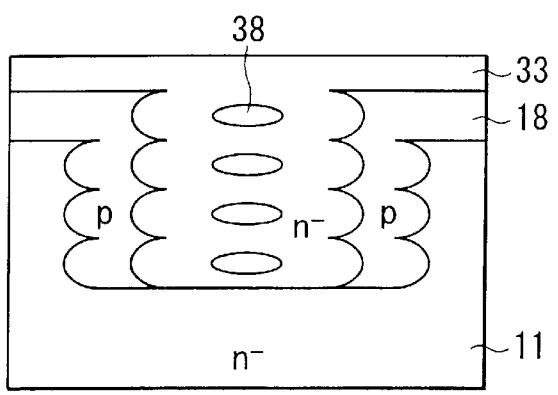
Figure 25D:
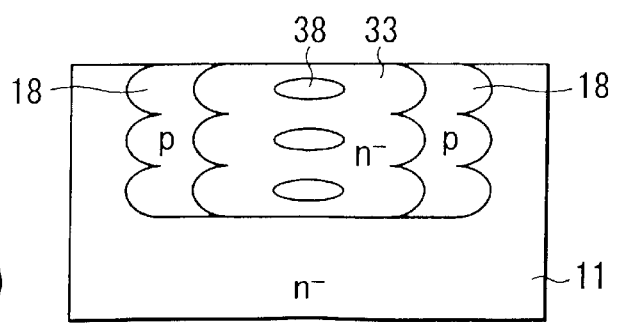

When high-temperature annealing is performed in a hydrogen atmosphere, atoms in the inner walls of a trench TG move. The atoms that form the RESURF layers 18 and second drift layers 33 fill the trench TG to planarized the surface. As a result, the vertical RESURF structure shown in FIG. 25C is formed. In some cases, cavities 38 may be formed in the second drift layer 33. However, as described in the 16th embodiment, since atoms in the inner wall surface of each cavity 38 are terminated by hydrogen atoms, degradation in electrical characteristic is suppressed.

As described above, according to this embodiment, no crystal growth need be executed to fill the trench TG.

<19th Embodiment>

Figure 26:
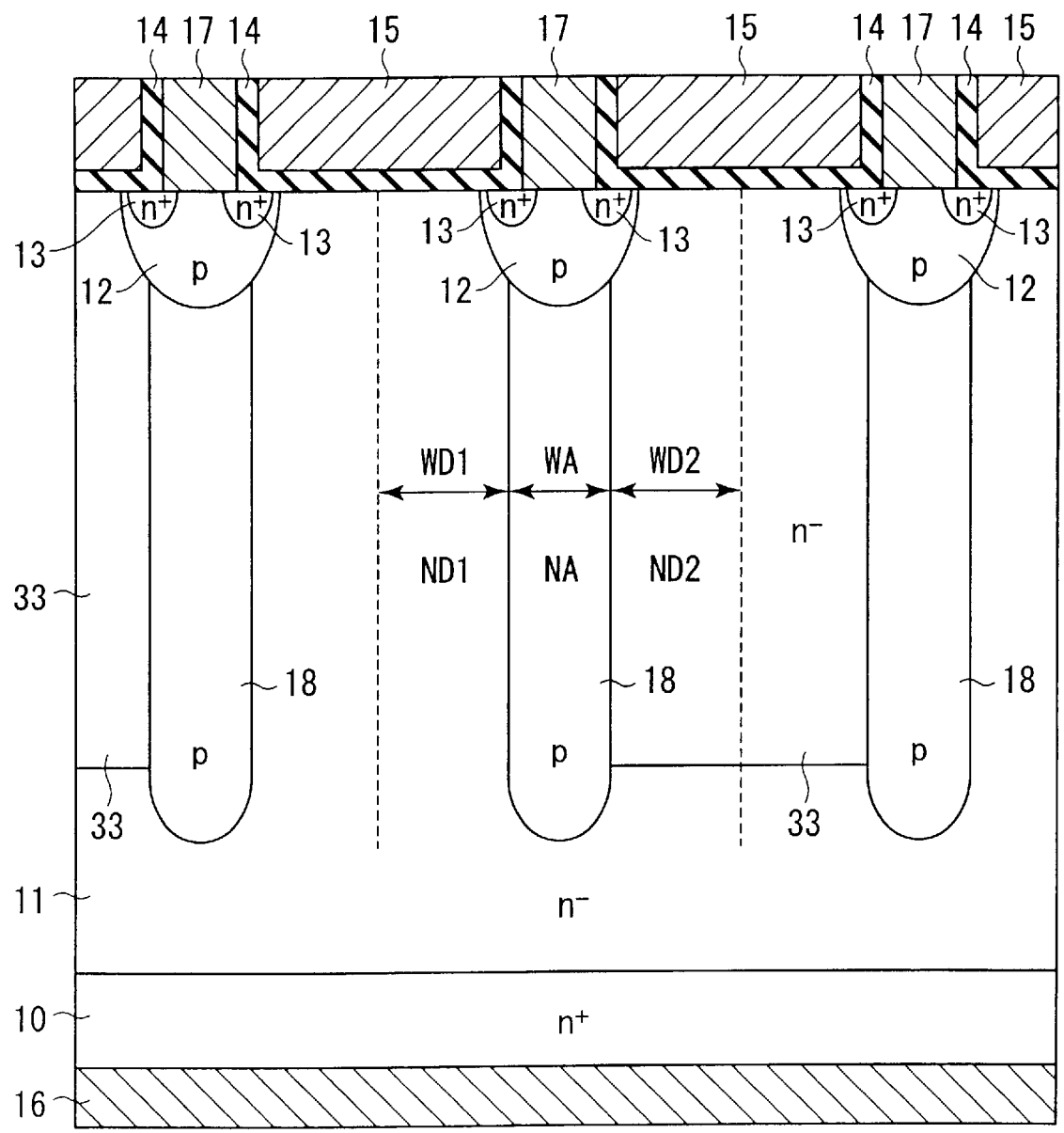
FIG. 26 is a sectional view of a vertical power MOS transistor according to the 19th embodiment of the present invention.

A semiconductor device according to the 19th embodiment of the present invention will be described next with reference to FIG. 26. FIG. 26 is a sectional view of a vertical power MOS transistor according to this embodiment. The MOS transistor has a superjunction structure described in the 14th embodiment. In this embodiment, the impurity concentrations and widths of first and second drift layers 11 and 33 are optimized.

In the power MOS transistor shown in FIG. 26, the breakdown voltage is maximized when $$NA \cdot WA = ND1 \cdot WD1 + ND2 \cdot WD2$$

is satisfied, where NA, ND1, and ND2 are impurity concentrations in a RESURF layer 18 and the first and second drift layers 11 and 33, and WA, WD1, and WD2 are the widths of the RESURF layer 18 and first and second drift layers 11 and 33.

That is, the impurity concentrations in the first and second drift layers 11 and 33 need not always equal. For example, when the RESURF layer 18 has an impurity concentration of $2 \times 10^{15}$ cm$^{-3}$ and a width of 4 µm, and the first drift layer 11 has an impurity concentration of $5 \times 10^{14}$ cm$^{-3}$ and a width of 2 µm, the second drift layer 33 preferably has an impurity concentration of $3.5 \times 10^{15}$ cm$^{-3}$ and a width of 2 µm.

The widths of the first and second drift layers 11 and 33 also need not always equal. For example, when the RESURF layer 18 has an impurity concentration of $1 \times 10^{15}$ cm$^{-3}$ and a width of 4 µm, and the first drift layer 11 has an impurity concentration of $5 \times 10^{14}$ cm$^{-3}$ and a width of 1 µm, the second drift layer 33 preferably has an impurity concentration of $5 \times 10^{14}$ cm$^{-3}$ and a width of 7 µm.

In this specification, the "width" of a RESURF layer or drift layer means the width in the horizontal direction in, e.g., FIG. 26. That is, referring to FIG. 26, the width of the RESURF layer 18 means the horizontal width of the RESURF layer 18 in FIG. 26. When the widths are reduced, the impurity concentrations in the drift layers and RESURF layer can be increased, and the ON resistance can be reduced.

<20th Embodiment>

Figure 27A:
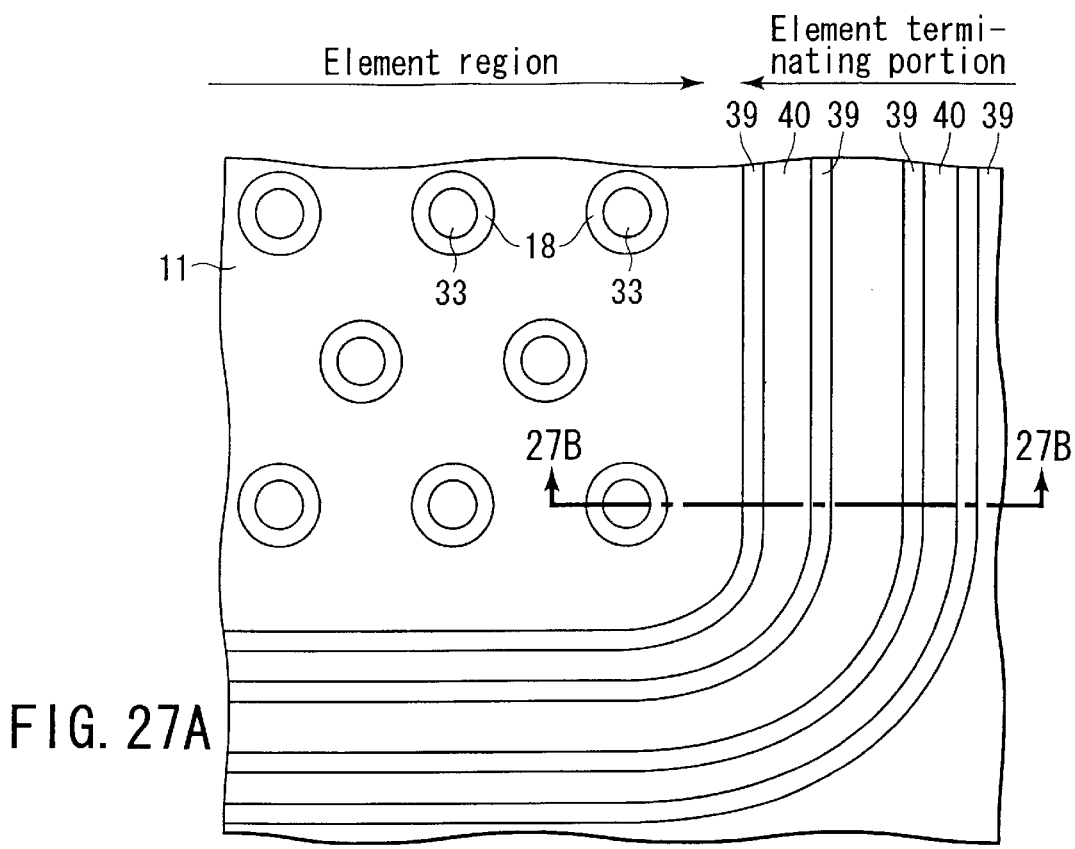
FIG. 27A is a plan view of a vertical power MOS transistor according to the 20th embodiment of the present invention.
Figure 27B:
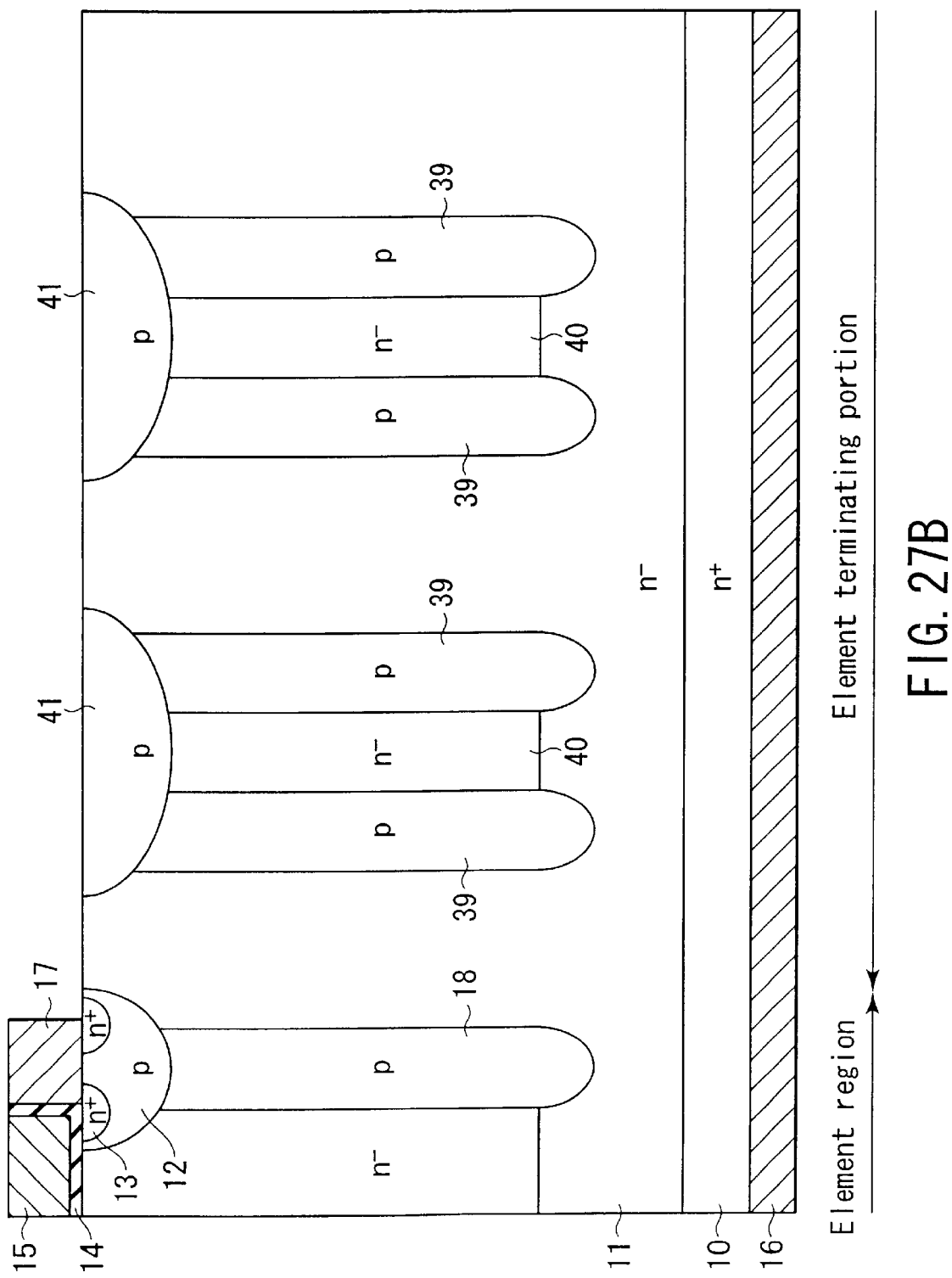
FIG. 27B is a sectional view taken along a line 27B—27B in FIG. 27A.

A semiconductor device according to the 20th embodiment of the present invention will be described next with reference to FIGS. 27A and 27B. FIG. 27A is a plan view of a vertical power MOS transistor according to this embodiment. FIG. 27B is a sectional view taken along a line 27B—27B in FIG. 27A. This embodiment is related to the structure of an element terminating portion of a vertical power MOS transistor.

As shown in FIGS. 27A and 27B, superjunction structures described in the 14th to 19th embodiments are formed in the element region. Even at the element terminating portion, the same structures as the superjunction structures in the element region are formed and surround the element region.

More specifically, two pairs of p-type guard ring layers 39 are formed in a first drift layer 11 at the element terminating portion. An n⁻-type semiconductor layer 40 is formed between each pair of guard ring layers 39. P-type guard ring layers 41 are formed in the surface regions of the guard ring layers 39 and n⁻-type semiconductor layers 40 to connect each pair of guard ring layers 39.

That is, the same structure as that of a RESURF layer 18 in the element region is formed as the guard ring 39 at the element terminating portion. A second drift layer in the element region is buried between the adjacent guard rings 39 at the element terminating portion. Such guard rings 39 and n⁻-type semiconductor layers 40 surround the element region. Elements that should be formed on the guard rings 39 and 41 are not illustrated in FIG. 27B.

The element terminating portion having the above structure can be formed simultaneously with the element region by a single process. That is, the guard rings 39 can be formed simultaneously with the RESURF layers 18 by a single process. The n⁻-type semiconductor layers 40 can be formed simultaneously with second drift layers 33 by a single process. The guard rings 41 can be formed simultaneously with base layers 12 by a single process.

According to the arrangement of this embodiment, by connecting the guard rings 39 and 41, the effective depth of a guard ring can be increased. In addition, when the plurality of guard ring layers 39 are connected, a wide guard ring can be implemented. Consequently, a terminating structure of the semiconductor device that holds a high breakdown voltage can be implemented.

When the impurity concentration in the first drift layer 11 is lower than that in the n-type semiconductor layer 40, the electric field applied to the guard ring layers 39 and 41 upon applying a high voltage becomes small. Hence, a structure capable of holding a higher breakdown voltage can be implemented.

<21st Embodiment>

Figure 28A:
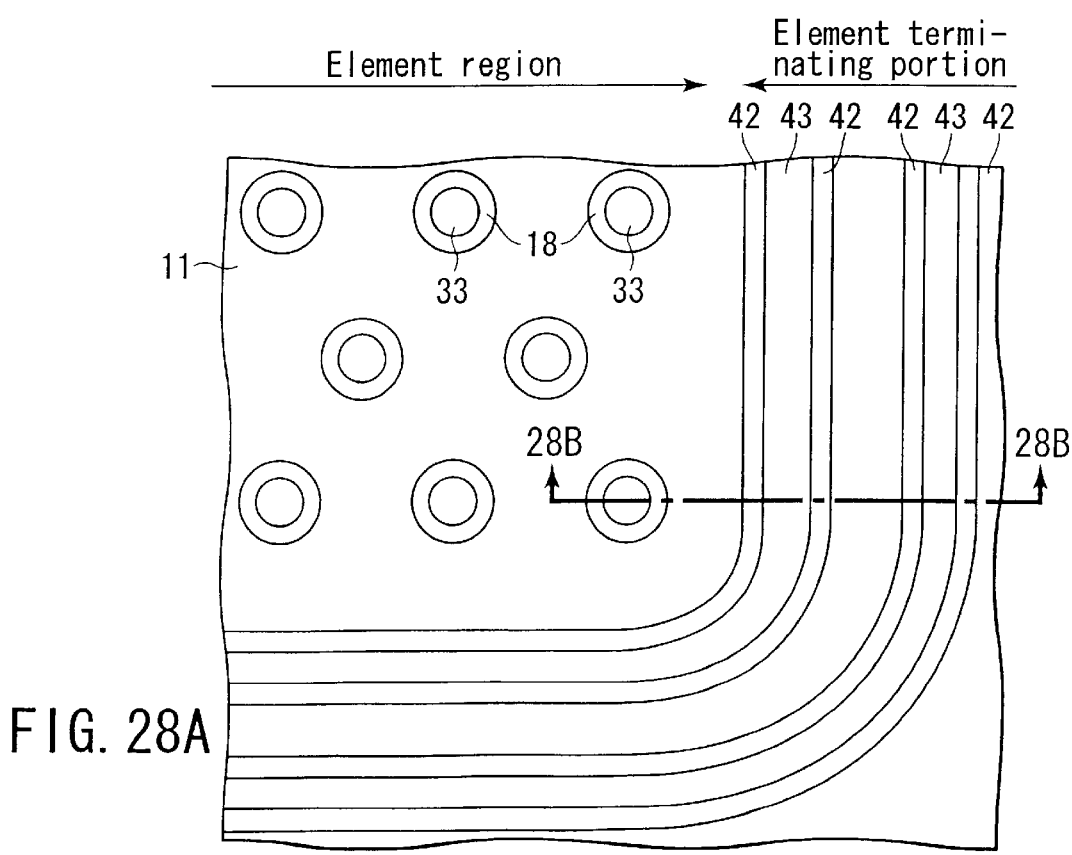
FIG. 28A is a plan view of a vertical power MOS transistor according to the 21st embodiment of the present invention.
Figure 28B:
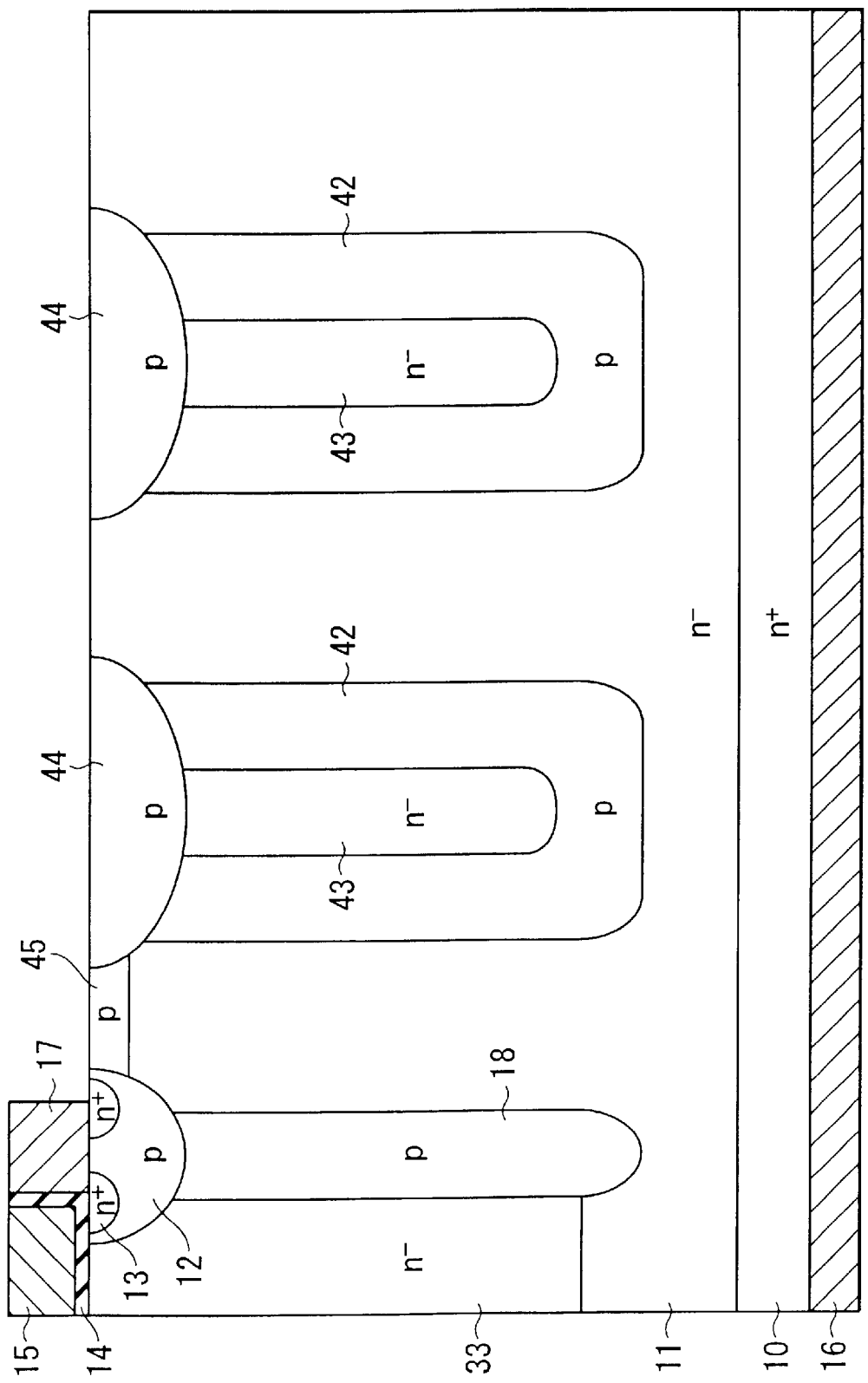
FIG. 28B is a sectional view taken along a line 28B—28B in FIG. 28A.

A semiconductor device according to the 21st embodiment of the present invention will be described next with reference to FIGS. 28A and 28B. FIG. 28A is a plan view of a vertical power MOS transistor according to this embodiment. FIG. 28B is a sectional view taken along a line 28B—28B in FIG. 28A. This embodiment is related to the structure of an element terminating portion of a vertical power MOS transistor.

As shown in FIGS. 28A and 28B, superjunction structures described in the 14th to 19th embodiments are formed in the element region. Even at the element terminating portion, structures similar to the superjunction structures in the element portion are formed and surround the element region.

More specifically, two pairs of p-type guard ring layers 42 are formed in a first drift layer 11 at the element terminating portion. An n⁻-type semiconductor layer 43 is formed between each pair of guard ring layers 42. Each pair of guard rings 42 are connected at the bottom portion. P-type guard ring layers 44 are formed in the surface regions of the guard rings 42 and n⁻-type semiconductor layers 43 to connect each pair of guard ring layers 42. The guard ring layer 44 is electrically connected to a base layer 12 through a p-type semiconductor layer 45 formed in the surface of the first drift layer 11.

That is, at the element terminating portion, each n⁻-type semiconductor layer 43 is surrounded at its side and bottom portions by the guard rings 42 and at the upper portion by the guard ring layer 44. Such structures are formed to surround the element region. Elements that should be formed on the guard rings 42 and 44 are not illustrated in FIG. 28B.

Even in this embodiment, the guard ring layers 42 can be formed simultaneously with RESURF layers 18 by a single process. The n⁻-type semiconductor layers 43 can also be formed simultaneously with second drift layers 33 by a single process. The guard rings 44 can also be formed simultaneously with the base layers 12 by a single process.

In this embodiment, by increasing the effective depth of a guard ring, the breakdown voltage can increase, as described in the 20th embodiment.

In addition, when each pair of guard rings 42 are connected at the bottom portion to obtain an almost U-shaped sectional structure, a wide guard ring can be provided. Consequently, a terminating structure capable of holding a higher breakdown voltage can be provided.

In this embodiment, the guard rings 42 are connected at the bottom portion to form a U-shaped structure. This structure can be formed by changing the angle of incidence of ion implantation. For example, in the planar pattern shown in FIG. 28A, the RESURF layers 18 arranged in a staggered pattern are formed in the element region. At the element terminating portion, the stripe-shaped p-type buried guard ring layers 42 are formed.

In correspondence with this structure, trenches in a staggered pattern are formed in the element region, and stripe-shaped trenches are formed at the terminating portion. The wafer is rotated while setting a constant angle of ion implantation. At the element terminating portion, ions are implanted even to the bottom portion of each trench to form a p-type layer. At the element portion, since no ions are implanted to the bottom portion of each trench, no p-type layer is formed. As a result, the structure shown in FIG. 28B can be formed.

<22nd Embodiment>

Figure 29:
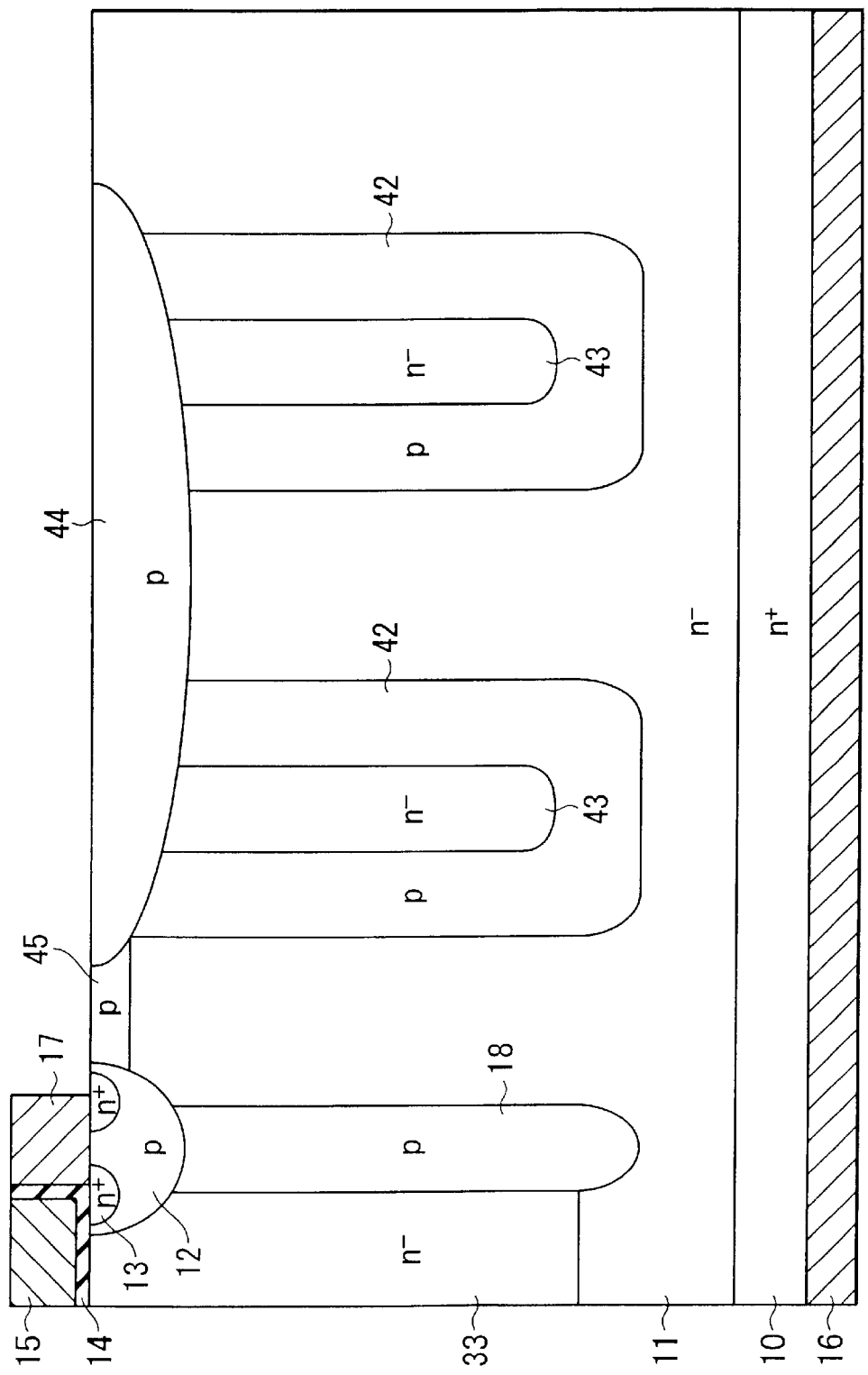
FIG. 29 is a sectional view of a vertical power MOS transistor according to the 22nd embodiment of the present invention.

A semiconductor device according to the 22nd embodiment of the present invention will be described next with reference to FIG. 29. FIG. 29 is a sectional view of a vertical power MOS transistor according to this embodiment. This embodiment is related to the structure of an element terminating portion of a vertical power MOS transistor.

As shown in FIG. 29, for the structure according to this embodiment, each pair of guard rings 42 are commonly connected by a guard ring layer 44 in the structure shown in FIG. 28B described in the 21st embodiment.

When the plurality of guard rings 42 are commonly connected, a wider guard ring can be provided. In addition, a terminating structure which holds a higher breakdown voltage can be provided.

The planar pattern of the structure of this embodiment is the same as in FIGS. 27A and 28A.

<23rd Embodiment>

Figure 30:
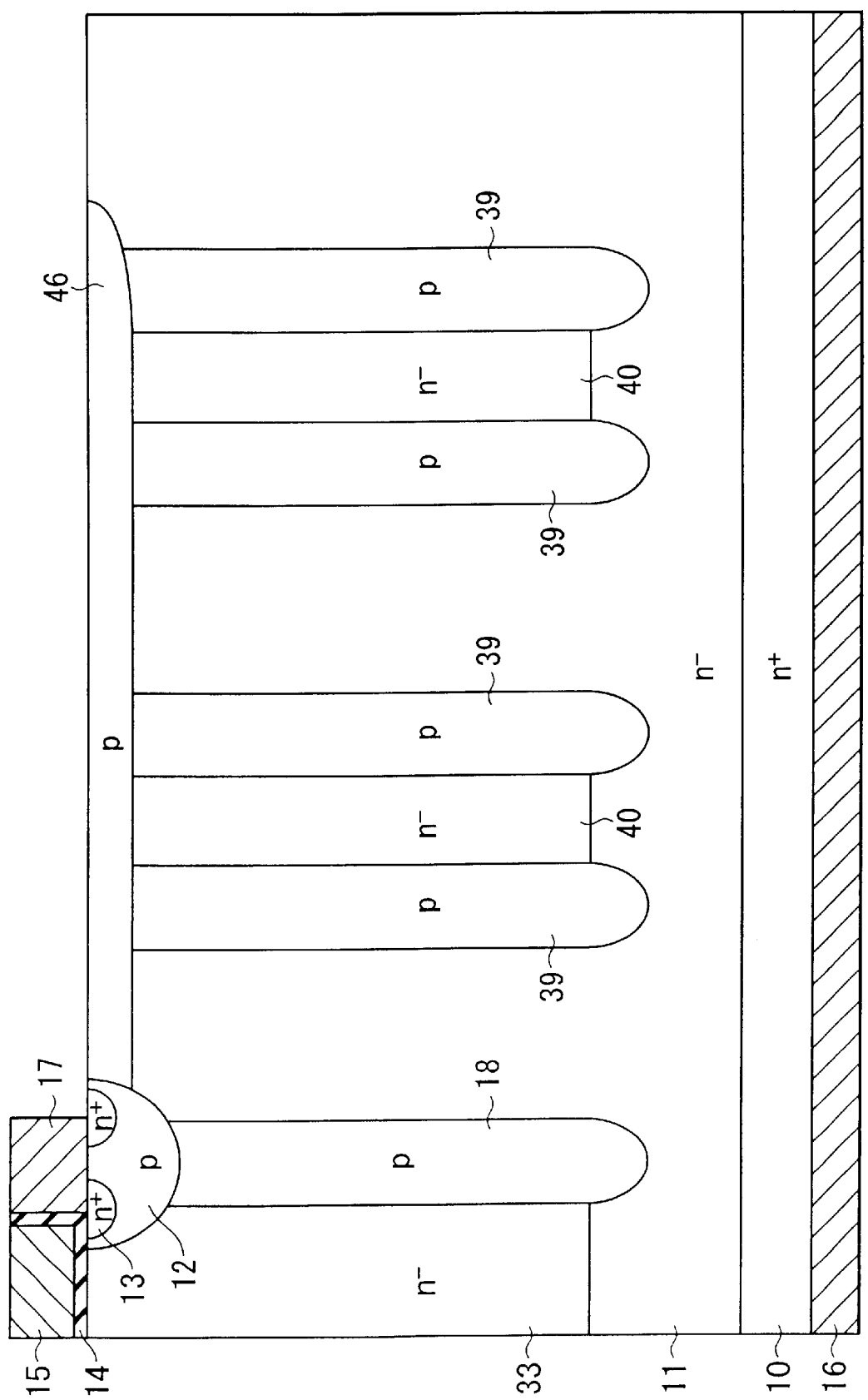
FIG. 30 is a sectional view of a vertical power MOS transistor according to the 23rd embodiment of the present invention.

A semiconductor device according to the 23rd embodiment of the present invention will be described next with reference to FIG. 30. FIG. 30 is a sectional view of a vertical power MOS transistor according to this embodiment. This embodiment is related to the structure of an element terminating portion of a vertical power MOS transistor.

As shown in FIG. 30, in the structure according to this embodiment, guard rings 41 in the structure shown in FIG. 27B described in the 20th embodiment are omitted. Instead, a p-type RESURF layer 46 is formed in the surface regions of a first drift layer 11, guard rings 39, and n⁻-type semiconductor layers 40. The RESURF layer 46 commonly connects the pairs of guard rings 39 and is connected to a base layer 12.

According to the above arrangement, when the width of the RESURF layer 46 is set to 100 $\mu$m, and the impurity dose is set to $8 \times 10^{11}$ cm$^{-2}$, a MOS transistor having a breakdown voltage of 600V can be implemented. The planar pattern of the structure of this embodiment is the same as in FIGS. 27A and 28A.

<24th Embodiment>

Figure 31:
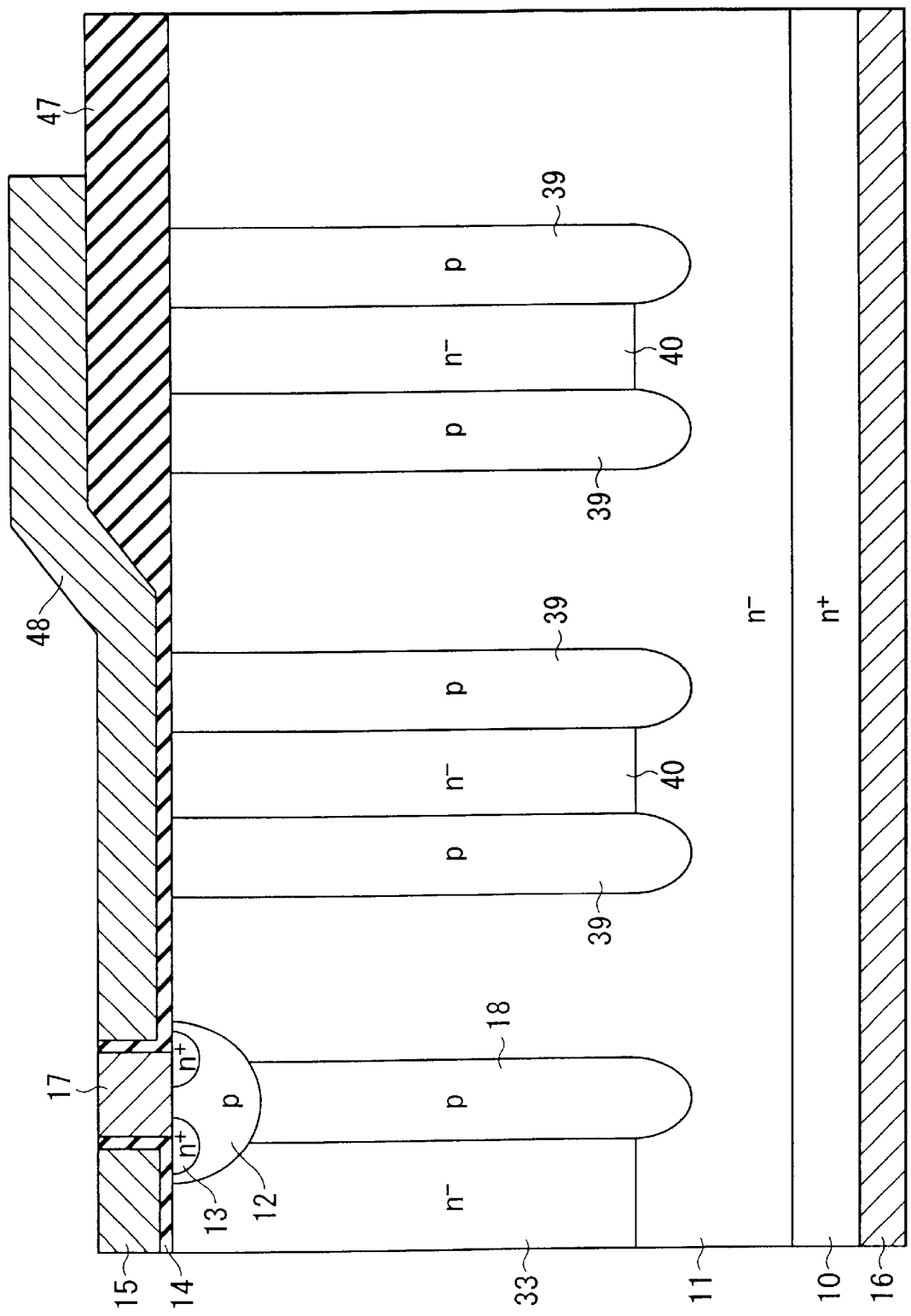
FIG. 31 is a sectional view of a vertical power MOS transistor according to the 24th embodiment of the present invention.

A semiconductor device according to the 24th embodiment of the present invention will be described next with reference to FIG. 31. FIG. 31 is a sectional view of a vertical power MOS transistor according to this embodiment. This embodiment is related to the structure of an element terminating portion of a vertical power MOS transistor. The planar pattern of the structure of this embodiment is the same as in FIGS. 27A and 28A.

As shown in FIG. 31, in the structure according to this embodiment, a RESURF layer 46 in the structure shown in FIG. 30 described in the 23rd embodiment is omitted. Instead, an insulating film 47 is formed on a first drift layer 11, guard rings 39, and n⁻-type semiconductor layers 40 at the element terminating portion. In addition, a metal layer 48 is formed on the insulating film 47. The metal layer 48 functions as a "field plate". As a result, the breakdown voltage can increase.

In the structure shown in FIG. 31, the thickness of the insulating film 47 changes in two steps.

However, the thickness may change in one or three or more steps. The metal layer 48 only needs to be a conductive film. Alternatively, a polysilicon film doped with an impurity may be used. A single ring-shaped film may be used as the metal layer 48. Alternatively, two or more concentric metal films may be used. The number of RESURF layers 39 under the metal layer 48 is not particularly limited.

In the 14th to 24th embodiments, the RESURF layers 18 which construct superjunction structures can be laid out in a stripe pattern, mesh pattern, or staggered pattern. In the 20th to 24th embodiments, the guard ring layers 39 and 42 at the element terminating portion can be laid out in a stripe pattern, mesh pattern, or staggered pattern. The number of guard rings is not limited to two pairs. One pair or three or more pairs of guard rings may be formed.

In the 14th to 24th embodiments, the base layers 12 and source layers 13 need not always have a stripe pattern. Instead, they may have, e.g., a dot pattern.

In the 14th to 18th embodiments, manufacturing processes including a planarizing process are exemplified. However, when ion implantation is executed or a mask for crystal growth is formed on the upper surface of a substrate, the planarizing process can be omitted.

In the first to 24th embodiments, planar power MOS transistors are exemplified. However, the embodiment of the present invention can also be applied to a power MOS transistor having a trench structure.

<25th Embodiment>

A semiconductor device according to the 25th embodiment of the present invention will be described next with reference to FIG. 32. FIG. 32 is a sectional view of a vertical power MOS transistor according to this embodiment.

As shown in FIG. 32, a drift layer (n⁻-type semiconductor region) 11 is formed on a drain layer (n⁺-type semiconductor substrate) 10. Base layers (p-type semiconductor regions) 12 are selectively formed in the surface region of the drift layer 11. Source layers 13 (n⁺-type semiconductor regions) are selectively formed in the surface regions of the base layers 12. A gate electrode 15 is formed on the drift layer 11 and base layers 12 between adjacent source layers 13 with a gate insulating film 14 interposed therebetween so as to form a stripe-shaped planar pattern (in a direction perpendicular to the page surface of FIG. 32). In addition, insulating films 50 extending from the surfaces of the base layers 12 to the drain layer 10 through the base layers 12 and drift layer 11 are formed in a stripe pattern, like the gate electrode 15. A RESURF layer (p-type semiconductor region) 18 is formed between the insulating film 50 and the drain layer 10 and drift layer 11. A drain electrode 16 and source electrodes 17 are formed on the lower surface of the drain layer 10 and the source layers 13, respectively, thereby forming a MOS transistor. Superjunction structures each including the RESURF layer 18 and drift layer 11 are periodically formed in the horizontal direction.

The impurity concentration in the drain layer 10 is, e.g., $6\times10^{18}$ cm$^{-3}$. The thickness of the drain layer 10 is about 200 $\mu$m. The impurity concentration in the drift region 11 is, e.g., $2\times10^{15}$ cm$^{-3}$. The thickness of the drift region 11 is about 50 $\mu$m. The impurity concentration in the base layer 12 is, e.g., $3\times10^{17}$ cm$^{-3}$. The base layer 12 is formed to a depth of about 2 $\mu$m from the surface of the drift layer 11. The impurity concentration in the source layer 13 is, e.g., $1\times10^{20}$ cm$^{-3}$. The source layer 13 is formed to a depth of about 0.2 $\mu$m from the surface of the base layer 12. The impurity concentration in the RESURF layer 18 is, e.g., $2\times10^{15}$ cm$^{-3}$. The thickness of the RESURF layer 18 is about 4 $\mu$m. The distance between adjacent RESURF layers 18 is about 8 $\mu$m. The gate insulating film 14 is, e.g., a silicon oxide film (SiO$_2$) and has a thickness of about 0.1 $\mu$m.

In the MOS transistor with the above structure, when a forward voltage is applied to the gate electrode and between the source and drain layers, a channel is formed in the base layer 12. Carriers move from the source layers 13 to the drain layer 10 through the channel and drift layer 11. When a reverse voltage is applied, a depletion layer is formed by the p-n junction between the RESURF layer 18 and the drift layer 11 as well as by the p-n junction between the base layer 12 and the drift layer 11. Especially, by the p-n junction with the RESURF layer 18, the drift layer 11 is quickly fully depleted. Hence, the breakdown voltage of the MOS transistor is determined by the junction depth between the drift layer 11 and the RESURF layer 18 and the interval between adjacent RESURF layers 18. The breakdown voltage does not depend on the impurity concentration in the drift layer 11. For this reason, the impurity concentration in the drift layer 11 can be increased. The breakdown voltage can increase by the superjunction structure. Simultaneously, the ON resistance can be reduced.

A method of manufacturing the MOS transistor having the above structure will be described next with reference to FIGS. 33A to 33D. FIGS. 33A to 33D are sectional views sequentially showing steps in manufacturing the vertical power MOS transistor shown in FIG. 32.

First, as shown in FIG. 33A, the drift layer 11 is formed on the drain region (e.g., silicon substrate) 10 by, e.g., CVD or impurity diffusion. This step may be executed by forming the drain region 10 on the lower surface of the drift layer 11.

As shown in FIG. 33B, trenches 51 extending from the upper surface of the drift layer 11 to the drain layer 10 are formed in a stripe pattern (in a direction perpendicular to the page surface of FIG. 33B) by photolithography and dry etching such as RIE.

As shown in FIG. 33C, the RESURF layer 18 is formed on the drain layer 10 and drift layer 11 by CVD using, e.g., SiH$_4$ gas. The RESURF layer 18 does not completely fill the trenches 51. The insulating film 50 is formed on the RESURF layer 18. The insulating film 50 completely fills the trenches 51.

Planarization by CMP is executed to expose the surface of the drift layer 11, thereby obtaining the structure shown in FIG. 33D. After that, a MOS structure is formed by a known process. More specifically, the surfaces of the drift layer 11 and RESURF layer 18 are thermally oxidized to form the gate insulating film 14. A polysilicon film is formed on the gate insulating film 14. The polysilicon film is patterned by photolithography and etching to form the gate electrode 15. A p-type impurity such as boron is ion-implanted into the drift layer 11 and RESURF layer 18 to form the base layers 12. Since the gate electrode 15 serves as a mask, the base layers 12 are selectively formed. An n-type impurity such as arsenic is ion-implanted into the base layers 12 to selectively form the source layers 13. After that, aluminum films are formed on the source layer 13 and the lower surface of the drain layer 10 and patterned, this obtaining the structure shown in FIG. 32.

With the semiconductor device and manufacturing method according to the 25th embodiment, the following effects can be obtained.

(1) Any variation in breakdown voltage of semiconductor device can be prevented. As described in "BACKGROUND OF THE INVENTION", the depth of the RESURF layer 18 in the superjunction structure is an important factor that determines the breakdown voltage. Hence, a variation in depth of the RESURF layer 18 directly leads to a variation in breakdown voltage. In the structure shown in FIG. 32, the RESURF layer 18 is so deep as to reach the drain layer 10. As a manufacturing method, the trench 51 is formed so deep as to reach the drain layer 10 in advance. The trench 51 is filled with the RESURF layer 18. That is, the depth of the RESURF layer 18 is determined only by the thickness of the drift layer 11. The depth of the RESURF layer 18 does not depend on the depth of the trench 51. For this reason, any variation in the depth of the RESURF layer 18 occurred in the step of forming the trenches 51 can be prevented from influencing the breakdown voltage. As a result, any variation in breakdown voltage of each elements can be prevented. A designed breakdown voltage can easily be obtained.

(2) Any decrease in breakdown voltage due to the crystallinity in the RESURF layer 18 can be prevented. In forming the RESURF layer 18 in the trench 51, at the corner portions of the bottom portion of the trench 51, crystal growth occurs from both the bottom portion and the side portions. As a result, the crystallinity in the RESURF layer 18 at the bottom portion of the trench 51 inevitably degrades. This decreases the breakdown voltage. In the structure shown in FIG. 32, however, the bottom portion of the RESURF layer 18 is buried in the drain layer 10. That is, no electric field is applied to the bottom portion of the RESURF layer 18. Hence, even when the crystallinity at the bottom portion of the RESURF layer 18 degrades, it does not influence the breakdown voltage because the bottom portion does not function as a RESURF layer. As a consequence, any decrease in breakdown voltage can be prevented. The decrease in breakdown voltage due to degradation in crystallinity can be prevented even by, after formation of the RESURF layer 18, oxidizing the surface of the RESURF layer 18 to form a thermal oxide film.

(3) Any decrease in breakdown voltage due to cavities generated in a trench can be prevented. As described above, when a single crystal is grown in a trench, the growth rate changes between the upper portion and the lower portion of the trench. This may generate cavities in the trench. The cavities also degrade the breakdown voltage. In the structure shown in FIG. 32, however, the trench 51 is filled with the insulating film 50. That is, instead of completely filling the trench 51 with the RESURF layer 18, after a predetermined thickness is obtained, crystal growth is stopped. Then, the trench 51 is newly filled with the insulating film 50. When crystal growth of the RESURF layer 18 is stopped before cavities are generated, the difference in thickness of the RESURF layer 18 in the direction of depth can be suppressed small. Hence, any decrease in breakdown voltage can be prevented. In addition, since the trench 51 is filled not with a single crystal but with an insulating film, it is easy to fill the trench completely.

As described in (1) to (3), according to the semiconductor device and manufacturing method according to this embodiment, a semiconductor device capable of simultaneously realizing a high breakdown voltage and low ON resistance and also eliminating any variation in breakdown voltage and a manufacturing method thereof can be provided. The step of forming the trench 51 shown in FIG. 33B is executed using RIE. Instead, for example, wet etching using an alkali solution such as KOH or TMAH (TetraMethylAmmonium Hydroxide) may be executed to (110) plane of the semiconductor substrate. In forming the RESURF layer 18 shown in FIG. 33C, oxide films or the like may be added to portions other than the side walls and bottom surface of the trench 51, and in this state, a crystal growth is performed such that the RESURF layer 18 is formed only in the trench 51. As the insulating film 50 which completely fills the trench 51, a thermal oxide film formed by oxidizing a semiconductor layer or an oxide or nitride film deposited by CVD can be used. The trench 51 may be completely filled by heat-treating and reflowing an insulating film formed by CVD. The insulating film 50 in the trench 51 does not function as part of the RESURF structure. Even when cavities are formed in the insulating film 50, the breakdown voltage does not decrease due to the cavities. The upper surface of the superjunction layer 18 located at the bottom portion of the trench 51 is preferably present at a deeper position than the upper surface of the drain layer 10. This is because if the RESURF layer 18 along the bottom portion of the trench 51 is present in the drift layer, that portion also functions as a superjunction structure. Since the thickness of the RESURF layer differs between the upper portion and the bottom portion of the superjunction structure, breakdown voltage design may become difficult.

<26th Embodiment>

Figures 34, 35:
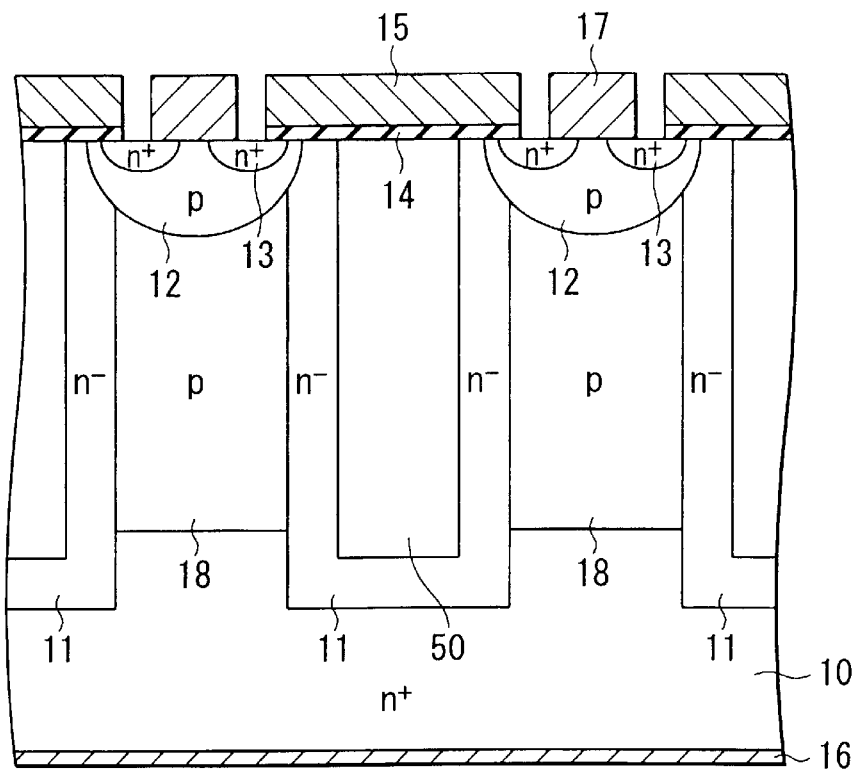
FIG. 34 is a sectional view of a vertical power MOS transistor according to the 26th embodiment of the present invention.
FIG. 35 is a sectional view of a vertical power MOS transistor according to the 27th embodiment of the present invention.

A semiconductor device according to the 26th embodiment of the present invention will be described next with reference to FIG. 34. FIG. 34 is a sectional view of a vertical power MOS transistor according to the 26th embodiment of the present invention.

As shown in FIG. 34, RESURF layers 18 (p-type semiconductor regions) are formed on a drain layer (n$^+$-type semiconductor substrate) 10. Base layers (p-type semiconductor regions) 12 are selectively formed in the surfaces of the RESURF layers 18. Source layer (n$^+$-type semiconductor regions) 13 are selectively formed in the surface of each base layer 12. A gate electrode 15 is formed on a surface between the source layers 13 of adjacent base layers 12 with a gate insulating film 14 interposed therebetween so as to form a stripe pattern (in a direction perpendicular to the page surface of FIG. 34). In addition, insulating films 50 extending from the surfaces of the RESURF layers 18 immediately under the gate electrodes to the drain layer 10 through the RESURF layers 18 are formed in a stripe pattern, like the gate electrode 15. Drift layers (n$^-$-type semiconductor regions) 11 are formed between the insulating films 50 and the drain layer 10 and RESURF layers 18. A drain electrode 16 and source electrodes 17 are formed on the lower surface of the drain layer 10 and the source layers 13, respectively, thereby forming a MOS transistor. Superjunction structures including the RESURF layers 18 and drift layers 11 are periodically formed in the horizontal direction. The impurity concentration in the RESURF layer 18 is, e.g., $2\times10^{15}$ cm$^{-3}$. The thickness of the RESURF layer 18 is about 4 µm. The distance between adjacent RESURF layers 18 is about 8 µm. The impurity concentration in the drift layer 11 is, e.g., $2 \times 10^{15}$ cm$^{-3}$.

The breakdown voltage of the MOS transistor having the above structure is determined by the junction depth between the drift layer 11 and the RESURF layer 18 and the interval between adjacent RESURF layers 18. The breakdown voltage does not depend on the impurity concentration in the drift layer 11. For this reason, the impurity concentration in the drift layer 11 can be increased. The breakdown voltage can increase by the superjunction structure. Simultaneously, the ON resistance can be reduced.

A method of manufacturing the MOS transistor having the above structure is the same as that described in the 25th embodiment with reference to FIGS. 33A to 33D except that the n$^-$-type drift layer 11 and p-type RESURF layer 18 are replaced with each other.

Even with the semiconductor device and manufacturing method according to the 26th embodiment, the same effects as in the 25th embodiment can be obtained.

<27th Embodiment>

A semiconductor device according to the 27th embodiment of the present invention will be described next with reference to FIG. 35. FIG. 35 is a sectional view of a vertical power MOS transistor according to this embodiment.

As shown in FIG. 35, a drift layer (n$^-$-type semiconductor region) 11 is formed on a drain layer (n$^+$-type semiconductor substrate) 10. Base layers (p-type semiconductor regions) 12 are selectively formed in the surface region of the drift layer 11. Source layers 13 (n$^+$-type semiconductor regions) are selectively formed in the surface regions of the base layers 12. A gate electrode 15 is formed on the base layers 12 and drift layer 11 between adjacent source layers 13 with a gate insulating film 14 interposed therebetween so as to form a stripe-shaped planar pattern (in a direction perpendicular to the page surface of FIG. 35). In addition, insulating films 50 extending from the surfaces of the base layers 12 to the drain layer 10 through the drift layer 11 are formed in a stripe pattern, like the gate electrode 15. Semiconductor layers 52 having a low concentration are formed between the insulating films 50 and the drain layer 10 and drift layers 11. A RESURF layer (p-type semiconductor region) 18 is formed between the semiconductor layer 52 and the drift layer 11. A drain electrode 16 and source electrodes 17 are formed on the lower surface of the drain layer 10 and the source layers 13, respectively, thereby forming a MOS transistor. The impurity concentration in the semiconductor layer 52 is lower than those in the drift layer 11 and RESURF layer 18. The semiconductor layer 52 may be undoped.

As in the 25th and 26th embodiments, the breakdown voltage of the MOS transistor having the above structure is determined by the junction depth between the drift layer 11 and the RESURF layer 18 and the interval between adjacent RESURF layers 18. The breakdown voltage does not depend on the impurity concentration in the drift layer 11. For this reason, the impurity concentration in the drift layer 11 can be increased. The breakdown voltage can increase by the superjunction structure. Simultaneously, the ON resistance can be reduced.

A method of manufacturing the MOS transistor having the above structure will be described next with reference to FIGS. 36A to 36E. FIGS. 36A to 36E are sectional views sequentially showing steps in manufacturing the vertical power MOS transistor shown in FIG. 35.

Figures 36A, 36B:
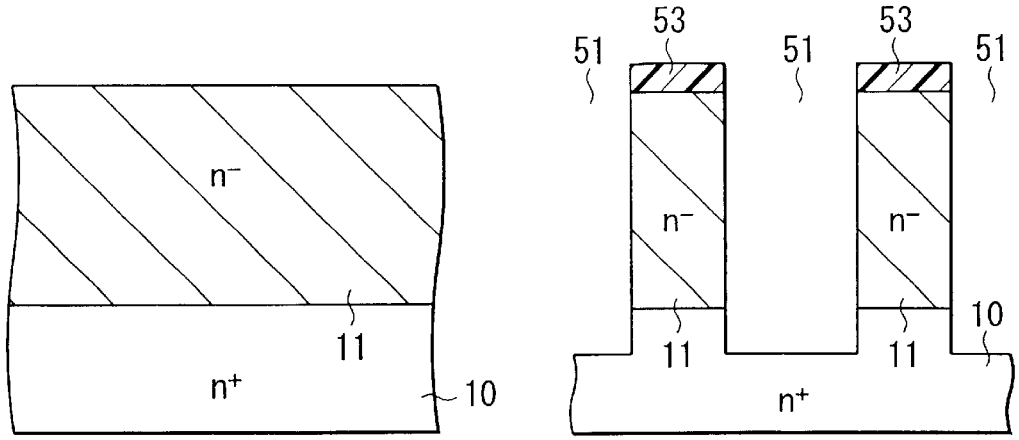
FIGS. 36A to 36E are sectional views sequentially showing steps in manufacturing the vertical power MOS transistor shown in FIG. 35.

First, as shown in FIG. 36A, the drift layer 11 is formed on the drain region (e.g., a silicon substrate) 10. As shown in FIG. 36B, trenches 51 extending from the upper surface of the drift layer 11 to the drain layer 10 are formed in a stripe pattern (in a direction perpendicular to the page surface of FIG. 36B) using a mask material 53.

Figure 36C:
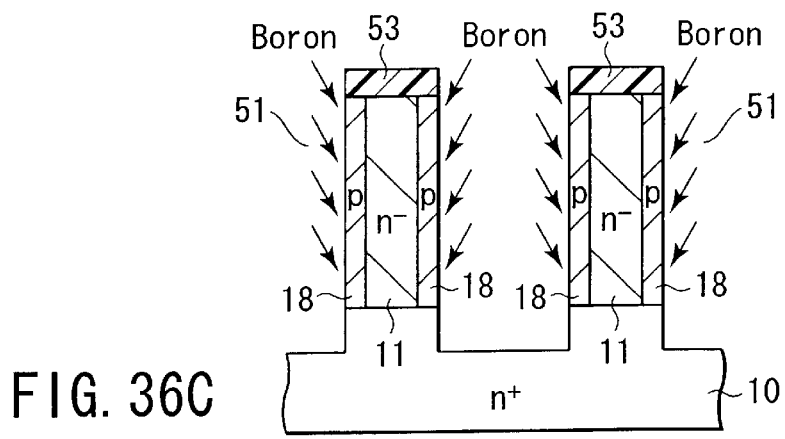

As shown in FIG. 36C, while keeping the mask material 53 left, a p-type impurity such as boron is obliquely ion-implanted into the drift layer 11, thereby forming the RESURF layers 18 in the side walls of the drift layers 11.

Figure 36D:
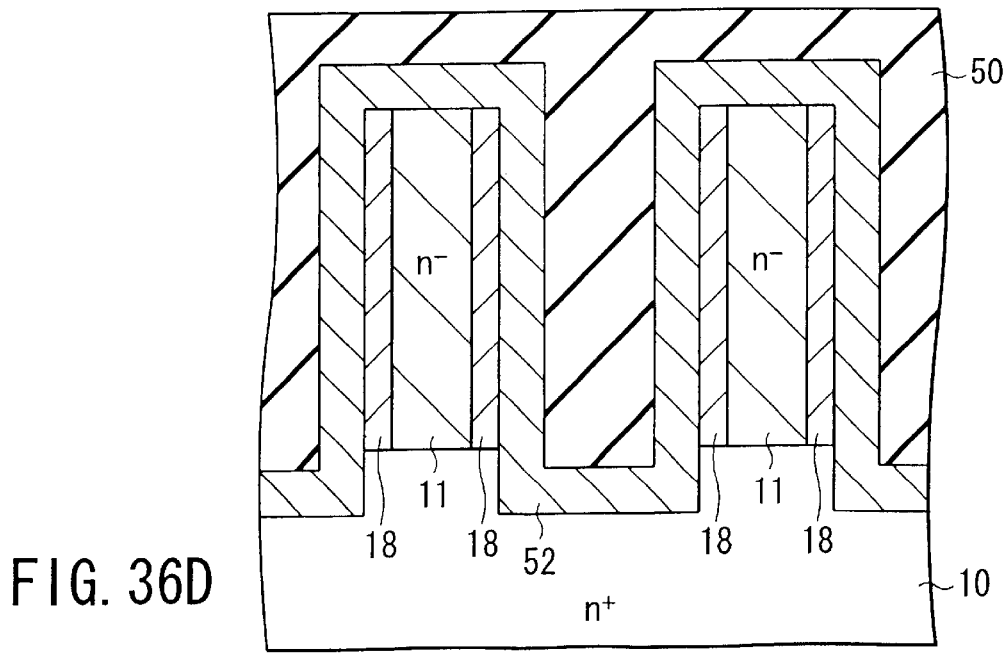

As shown in FIG. 36D, the semiconductor layer 52 which is undoped or has an impurity concentration lower than those in the drift layer 11 and RESURF layer 18 is formed in the trenches 51 and on the drift layers 11 by, e.g., CVD. The semiconductor layer 52 does not completely fill the trenches 51. The insulating film 50 is formed on the semiconductor layer 52 to completely fill the trenches 51 with the insulating film 50.

Figure 36E:
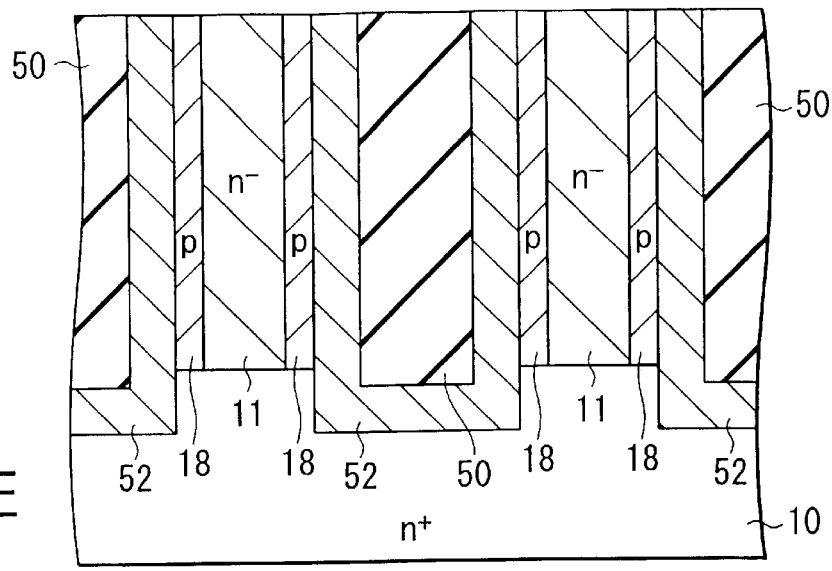

Planarization by CMP is executed to expose the surfaces of the drift layers 11, thereby obtaining the structure shown in FIG. 36E. After that, a MOS structure is formed by a known process, thereby obtaining the structure shown in FIG. 35.

With the above structure and manufacturing method, in addition to the effects (1) to (3) described in the 25th embodiment, effects (4) and (5) can also be obtained.

(4) The breakdown voltage can easily be designed. In the manufacturing method according to this embodiment, the RESURF layers 18 are formed by ion implantation from oblique directions, as shown in FIG. 36C. The semiconductor layer 52 buried in the trench 51 is a lightly-doped semiconductor layer (n- or p-type semiconductor layer) or an undoped intrinsic semiconductor layer. Hence, the semiconductor layer 52 is quickly fully depleted by a relatively low voltage and does not function as a RESURF layer. In addition, the depth-direction impurity concentration distribution of the semiconductor layer 52 does not influence the breakdown voltage because the concentration is very low. That is, the breakdown voltage needs to be designed in consideration of only the impurity dose in forming the RESURF layer 18 by ion implantation from oblique directions and the impurity concentration in the drift layer 11. When the RESURF layer 18 is formed by ion implantation, the breakdown voltage can easily be designed.

(5) The trench 51 can easily be filled. It is difficult to fill a trench not only when the trench width is small but also when the width is too large. With the structure and manufacturing method according to this embodiment, the trench 51 is filled to some extent by the semiconductor layer 52. Then, the trench 51 is completely filled with the insulating film 50. That is, even when the width of the trench 51 is too large, the width in forming the insulating film 50 can be optimized by forming the semiconductor layer 52. As a result, it is easy to fill the trench 51 completely.

Figure 37A:
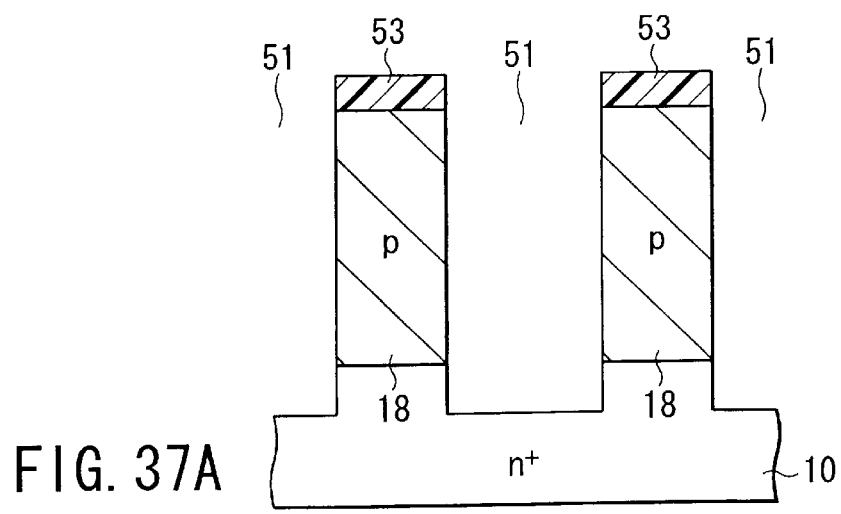
FIGS. 37A and 37B are sectional views sequentially showing steps in manufacturing a vertical power MOS transistor according to the first modification to the 27th embodiment of the present invention.
Figure 37B:
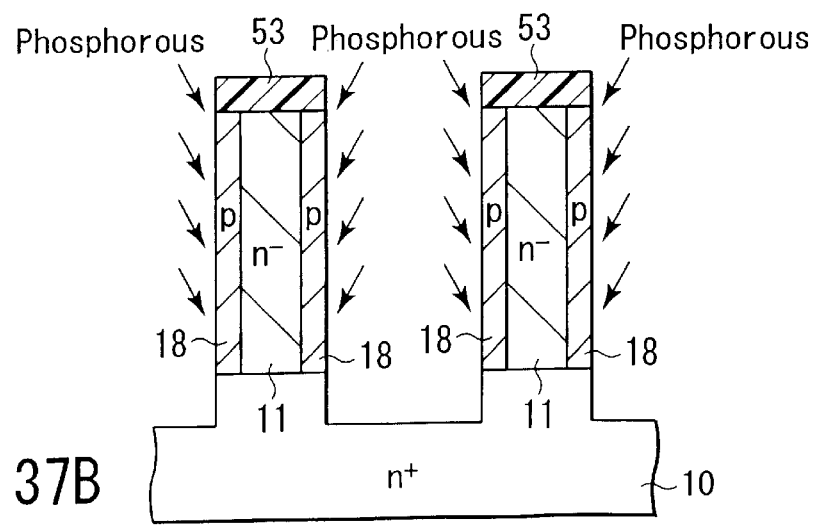

Another method of manufacturing the RESURF layer 18 and drift layer 11 using ion implantation will be described as a modification to this embodiment. First, a semiconductor device manufacturing method according to the first modification to this embodiment will be described with reference to FIGS. 37A and 37B. FIGS. 37A and 37B are sectional views sequentially showing steps in manufacturing a vertical power MOS transistor according to this modification.

First, as shown in FIG. 37A, the RESURF layer (p-type semiconductor region) 18 is formed on the drain layer (n$^+$-type semiconductor substrate) 10. The trenches 51 are formed using the mask material 53. Each trench 51 extends from the surface of the RESURF layer 18 to the drain layer 10.

As shown in FIG. 37B, an n-type impurity such as phosphorus or arsenic is ion-implanted into the RESURF layer 18 from oblique directions. By adjusting the acceleration voltage such that the n-type impurity is implanted deeply into the RESURF layer 18, the drift layer 11 is formed in the RESURF layer 18.

Figure 38A:
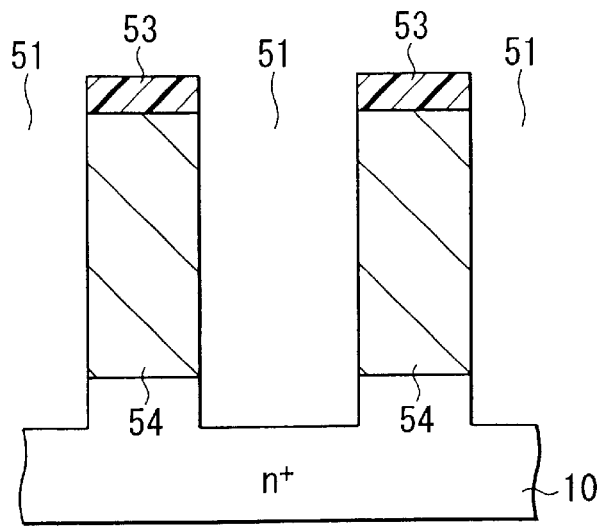
FIGS. 38A to 38C are sectional views sequentially showing steps in manufacturing a vertical power MOS transistor according to the second modification to the 27th embodiment of the present invention.
Figure 38B:
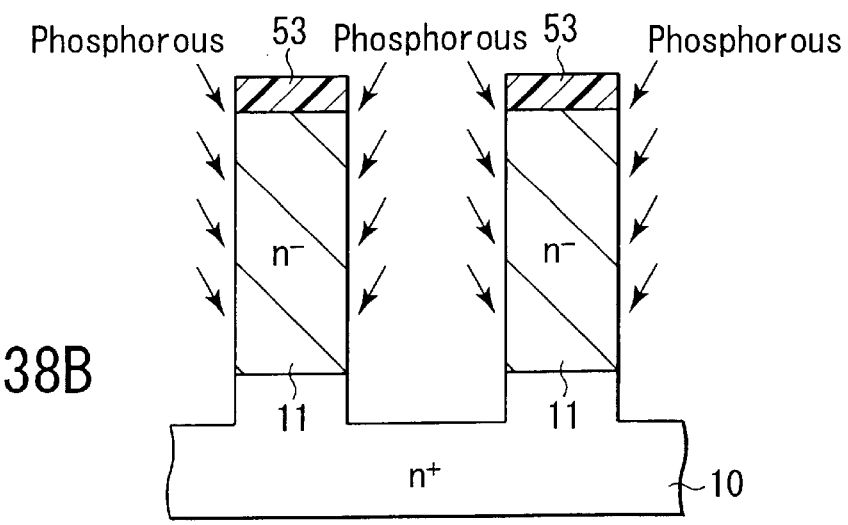
Figure 38C:
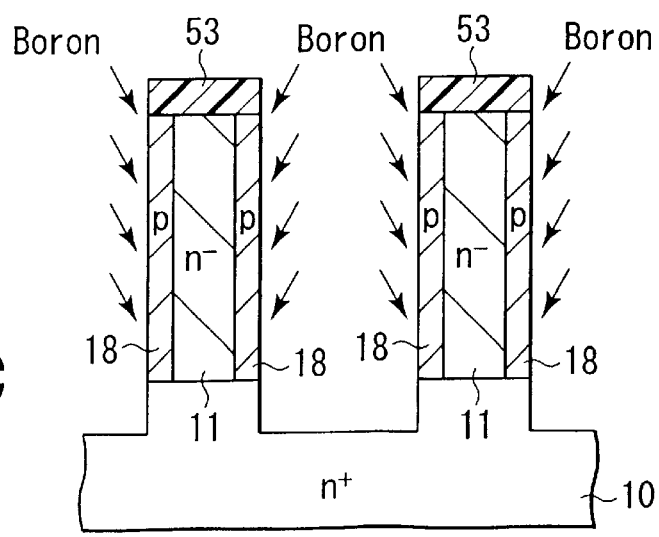

FIGS. 38A to 38C are sectional views sequentially showing steps in manufacturing a vertical power MOS transistor according to the second modification to this embodiment.

First, as shown in FIG. 38A, a semiconductor layer 54 is formed on the drain layer 10. This semiconductor layer 54 is an undoped intrinsic semiconductor layer or a semiconductor layer having an impurity concentration lower than those in the drift layer 11 and RESURF layer 18. The trenches 51 are formed using the mask material 53 so as to extend from the surface of the semiconductor layer 54 to the drain layer 10.

As shown in FIG. 38B, an n-type impurity such as phosphorus or arsenic is ion-implanted into the semiconductor layer 54 from oblique directions. When the acceleration voltage is adjusted such that the n-type impurity is implanted into the entire surface of the semiconductor layer 54, the semiconductor layer 54 changes to the $n^-$-type drift layer 11.

As shown in FIG. 38C, a p-type impurity such as boron is ion-implanted into the drift layer 11 from oblique directions, the RESURF layers 18 are formed in the side surfaces of the drift layer 11.

Even when the structure shown in FIG. 35 is formed by the above manufacturing methods, the same effects as described above can be obtained.

<28th Embodiment>

Figure 39:
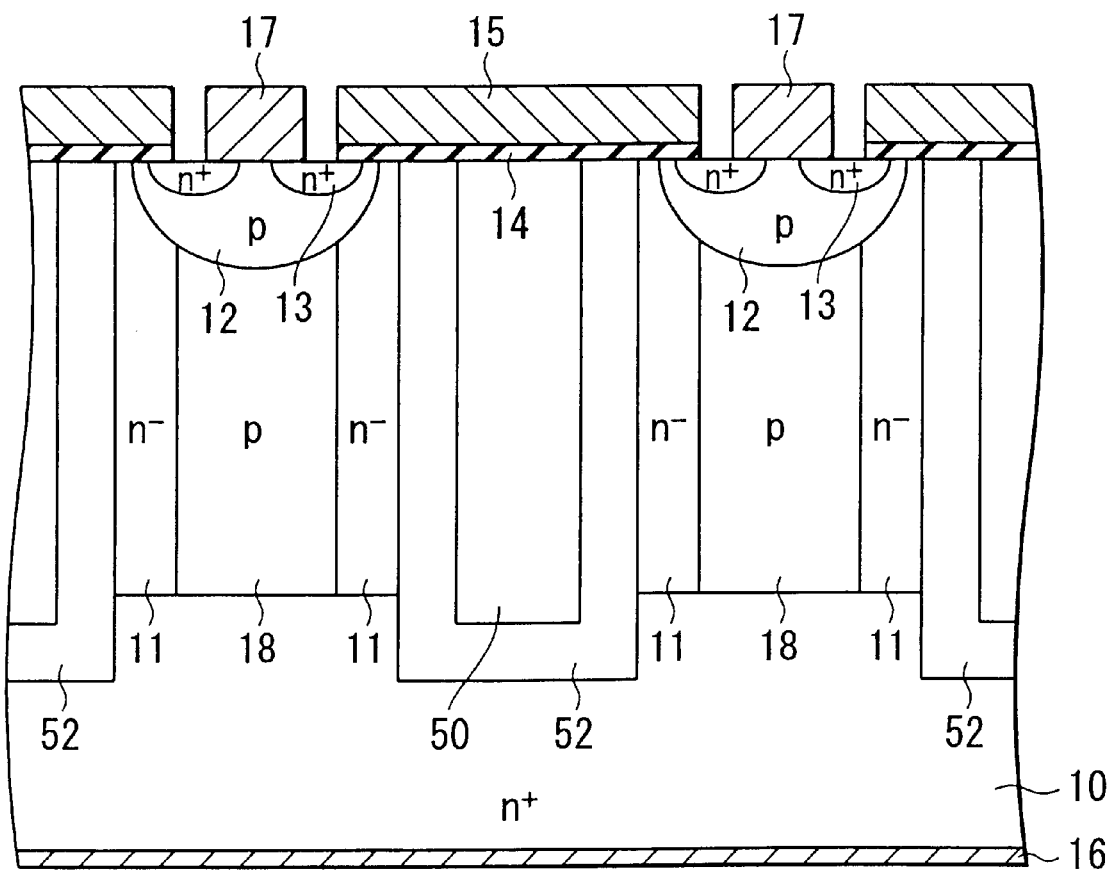
FIG. 39 is a sectional view of a vertical power MOS transistor according to the 28th embodiment of the present invention.

A semiconductor device according to the 28th embodiment of the present invention will be described next with reference to FIG. 39. FIG. 39 is a sectional view of a vertical power MOS transistor according to this embodiment.

As shown in FIG. 39, RESURF layers 18 (p-type semiconductor regions) are formed on a drain layer ($n^+$-type semiconductor substrate) 10. Base layers (p-type semiconductor regions) 12 are selectively formed in the surface regions of the RESURF layers 18. Source layers ($n^+$-type semiconductor regions) 13 are selectively formed in the surface region of each base layer 12. A gate electrode 15 is formed on a surface between the source layers 13 of adjacent base layers 12 with a gate insulating film 14 interposed therebetween so as to form a stripe pattern (in a direction perpendicular to the page surface of FIG. 39). In addition, insulating films 50 extending from the surfaces of the RESURF layers 18 immediately under the gate electrodes to the drain layer 10 through the RESURF layers 18 are formed in a stripe pattern, like the gate electrode 15. Semiconductor layers 52 having a low concentration are formed between the insulating films 50 and the drain layer 10 and RESURF layers 18. A drift layer ($n^-$-type semiconductor region) 11 is formed between the semiconductor layer 52 and the RESURF layer 18. A drain electrode 16 and source electrodes 17 are formed on the lower surface of the drain layer 10 and the source layers 13, respectively, thereby forming a MOS transistor. The impurity concentration in the semiconductor layer 52 is lower than those in the drift layer 11 and RESURF layer 18. The semiconductor layer 52 may be undoped.

A method of manufacturing the MOS transistor having the above structure is the same as that described in the 27th embodiment with reference to FIGS. 35A to 35E except that the $n^-$-type drift layer 11 and p-type RESURF layer 18 are replaced with each other. Even with the semiconductor device and manufacturing method according to this embodiment, the same effects as in the 27th embodiment can be obtained.

In the 27th and 28th embodiments, the following effect can be obtained in addition to the effects (1) to (5).

(6) The ON resistance can be further reduced. In the 27th and 28th embodiments, when the impurity concentration in the semiconductor layer 52 is almost the same as that in the RESURF layer 18, the semiconductor layer 52 can function as part of the superjunction structure. In this case, the same effect as in a case wherein the vertical RESURF width is effectively reduced can be obtained. For this reason, the impurity concentration in the drift layer 11 can be increased while maintaining the breakdown voltage. Hence, the ON resistance can be further reduced.

<29th Embodiment>

Figure 40A:
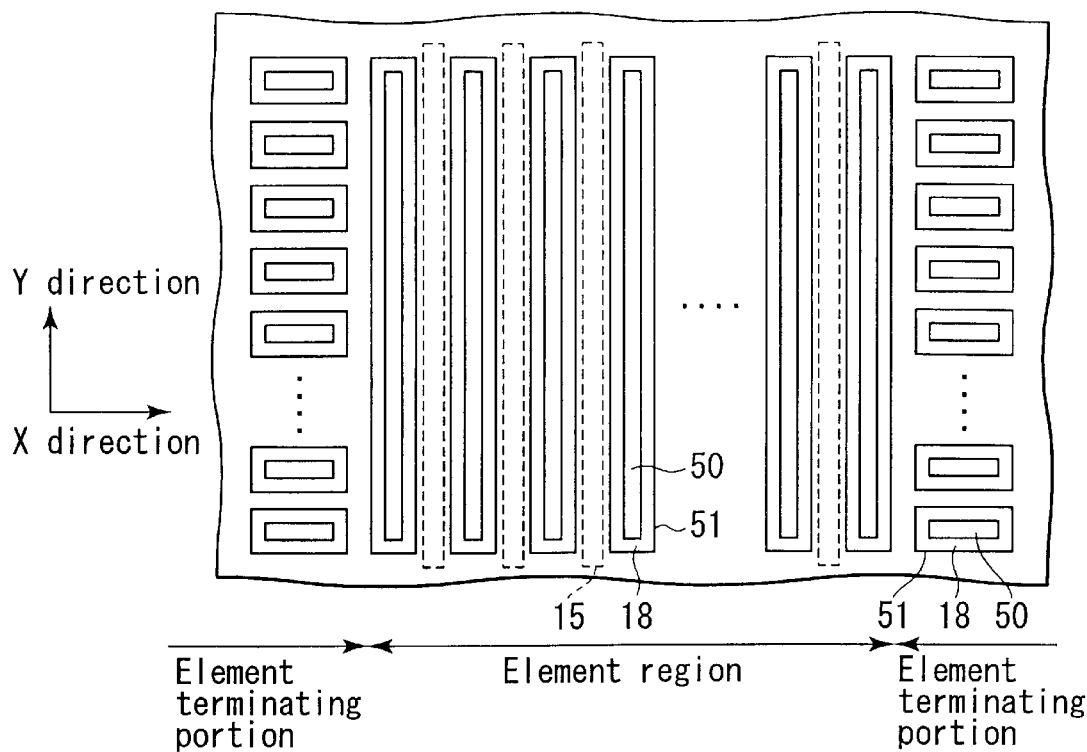
FIG. 40A is a plan view of a vertical power MOS transistor according to the 29th embodiment of the present invention.

A semiconductor device according to the 29th embodiment of the present invention will be described next with reference to FIG. 40A. In this embodiment, the planar pattern of a superjunction structure will be described. FIG. 40A is a plan view of a vertical power MOS transistor according to this embodiment. This plan view especially shows a superjunction structure. A superjunction structure in the element region corresponds to, e.g., the structure described in the 25th embodiment.

As shown in FIG. 40A, the pattern of trenches 51 is formed by combining a stripe pattern parallel to gate electrodes 15 (Y direction) and a stripe pattern parallel to a direction perpendicular to the gate electrodes (X direction). The stripe pattern parallel to the gate electrodes 15 is formed in a region (element region) where MOS transistors are formed. The stripe pattern perpendicular to the gate electrodes is formed in the region of a terminating portion (element terminating portion) of the semiconductor device in the horizontal direction of the MOS transistors. Each trench 51 is filled with a RESURF layer 18 and insulating film 50.

When RESURF structures are formed in the above pattern, the following effect can be obtained.

(7) When a high voltage is applied, the depletion layer can be quickly extended. Hence, the breakdown voltage can be increased. This effect will be described below. First, a case wherein superjunction structures extending in the X direction as shown in FIG. 40A are not present at the element terminating portion will be examined.

A depletion layer generated by p-n junctions between a base layer 12 and a drift layer 11 and between the RESURF layer 18 and the drift layer 11 extends in the X and Y directions in FIG. 40A. In the Y direction, the depletion layer can spread along the drift layer 11 between adjacent RESURF layers 18 without any obstacle. In the X direction, however, since each trench 51 is filled with the insulating film 50, MOS transistors are electrically disconnected for every trenches. The MOS transistors are electrically connected only at the outermost periphery of the superjunction structures. If a high voltage is applied to a MOS transistor, the breakdown voltage should be maintained as the superjunction structure portion is depleted. However, since each trench is filled with the insulating film 50, extension of the depletion layer in the X-direction is impeded by the insulating film 50. That is, to deplete adjacent superjunction structures, a path through which holes are discharged from the RESURF layers 18 is necessary. However, such a path is absent in the X direction because of the insulating films 50. Even in the X direction, electrical connection is done at the outermost periphery of the superjunction structures. Hence, holes in the element region preferably temporarily move to the outermost periphery and then flow into adjacent element regions. Normally, however, such electric field distribution is not obtained. After all, since the depletion layer cannot extend in the X direction, the electric field strength per unit area increases, resulting in dielectric breakdown.

However, the semiconductor device according to this embodiment has, at its element terminating portion, a superjunction structure extending in the X direction, as shown in FIG. 40A. As described above, a depletion layer can quickly extend without any obstacle in the direction in which the superjunction structures having a stripe pattern extend. That is, as shown in FIG. 40A, when a RESURF structure having a stripe pattern along in the X direction is arranged at the element terminating portion, the depletion layer can quickly extend not only in the Y direction but also in the X direction. As a result, concentration of the electric field can be suppressed, and the breakdown voltage can be increased. The stripe pattern of the superjunction structures at the element terminating portion need not always be perpendicular to the Y direction. They may have a predetermined angle with respect to the X direction. That is, a pattern that does not impede the depletion layer from extending or can help extending the depletion layer suffices.

The superjunction structures at the element terminating portion can be formed simultaneously with those in the element regions. That is, in the step of forming the trenches 51 described in the manufacturing methods according to the 25th and 27th embodiments, not only trenches extending in the Y direction in the element region but also trenches extending in the X direction at the element terminating portion are simultaneously formed. This process can be executed without complicating the manufacturing process. As long as a superjunction structure is adjacent to the insulating film 50 in any manufacturing method, the above structure can be formed by any method: i.e., by forming the RESURF layer 18 using crystal growth or ion implantation or by forming the drift layer 11 by ion implantation.

Figure 40B:
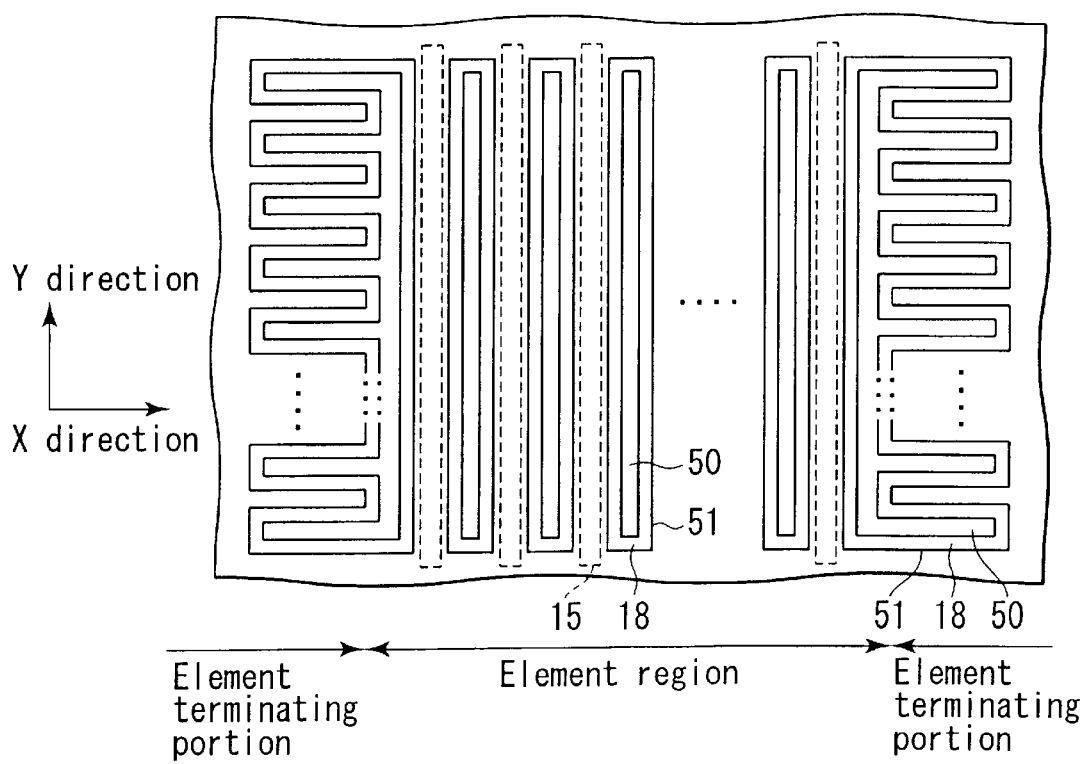
FIGS. 40B to 40D are plan views of vertical power MOS transistors according to the first to third modifications to the 29th embodiment of the present invention.

Several planar patterns of superjunction structures capable of obtaining the same effect as described above will be described as modifications to this embodiment. FIG. 40B shows the planar pattern of a vertical power MOS transistor according to the first modification to this embodiment.

As shown in FIG. 40B, in the planar pattern according to this modification, each superjunction structure at the element terminating portion are integrated with the superjunction structure at a corresponding end portion in the element region. That is, the trenches 51 extending in the X direction are formed outside the trench 51 extending in the Y direction at each end portion in the element region to make a comb-shaped structure. Each trench 51 is filled with the RESURF layer 18 and insulating film 50. According to this structure, the superjunction structures in the element terminating portion are connected, in the X direction, to the trench 51 that extends in the Y direction on the element region side. For this reason, corner portions at the bottom portions of the trenches in the element terminating portion are present only at the outermost portions of the element terminating portion. As described above, the crystallinity degrades at the corner portion of each trench bottom portion. However, since these corner portions can be eliminated, the reliability of the semiconductor device represented by the breakdown voltage can be improved.

Figure 40C:
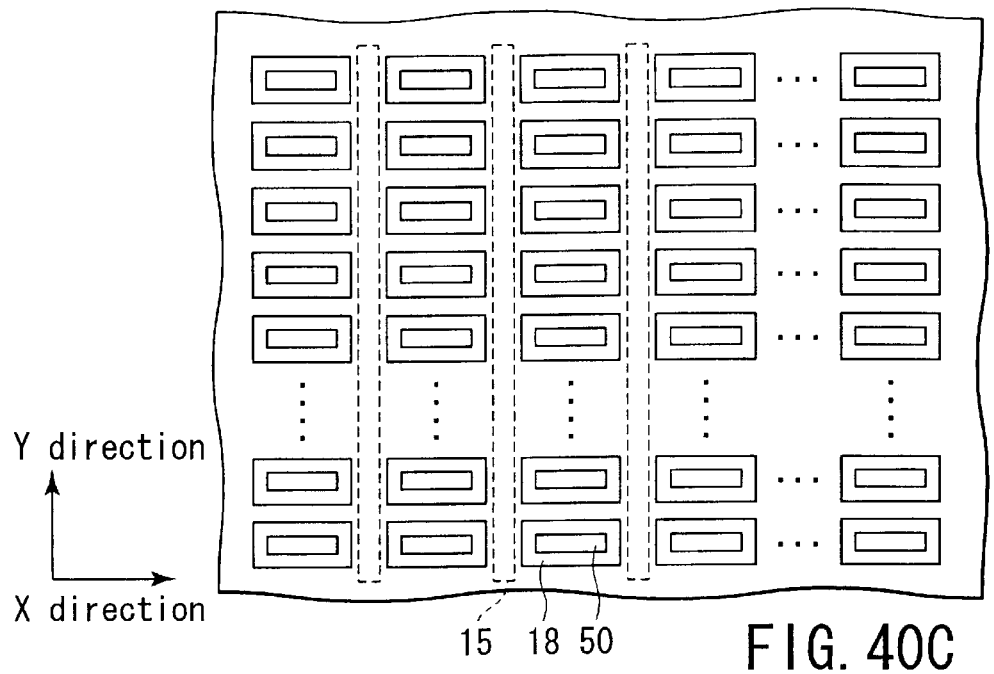

FIG. 40C shows the planar pattern of a vertical power MOS transistor according to the second modification to this embodiment. As shown in FIG. 40C, in this modification, superjunction structures in the element region in FIG. 40A are divided in the Y direction and arranged in a matrix. According to this arrangement, adjacent semiconductor elements are electrically connected through semiconductor layers between adjacent superjunction structures in the Y direction. For this reason, a depletion layer can be extended in the X direction. In addition, no new superjunction structures need to be arranged at the element terminating portion.

Figure 40D:
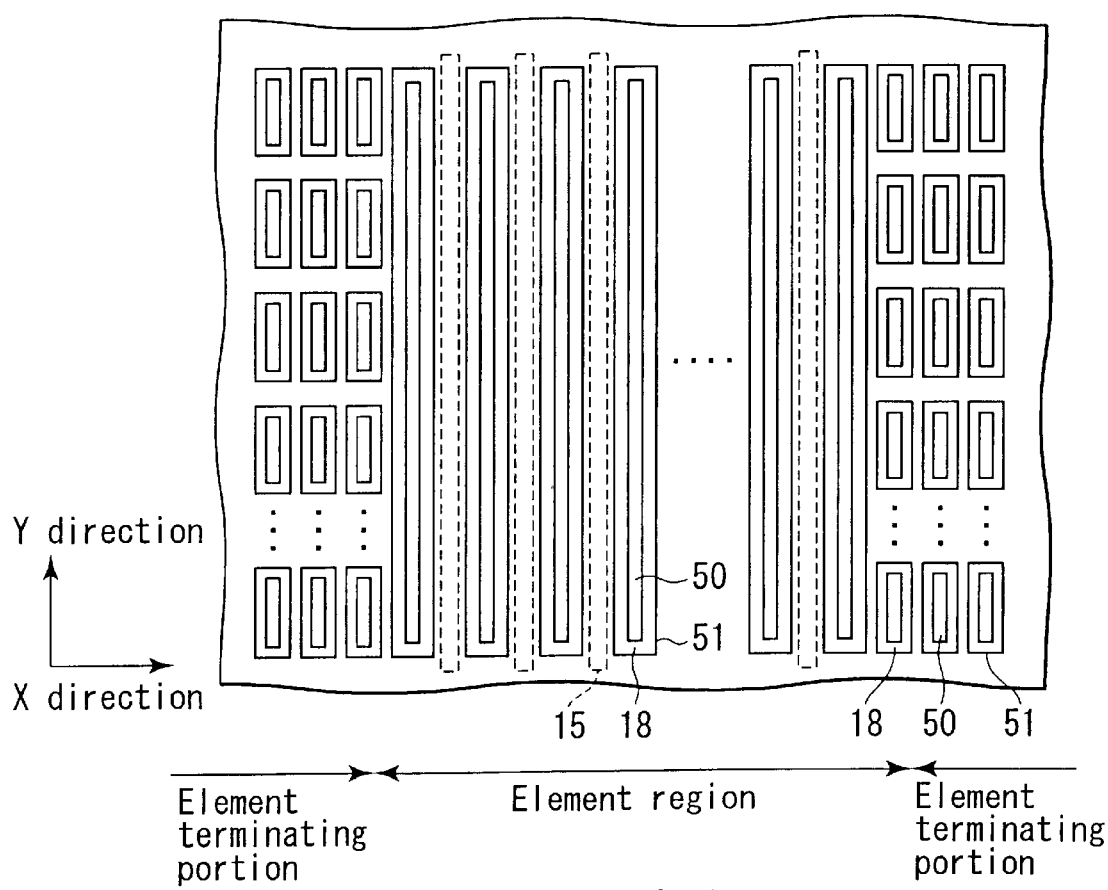

FIG. 40D shows the planar pattern of a vertical power MOS transistor according to the third modification to this embodiment. As shown in FIG. 40D, in this modification, superjunction structures at the element terminating portion in FIG. 40A have a pattern extending in the Y direction, and a plurality of superjunction structures are arranged in the X direction. Even according to this structure, the same effect as that of the first modification can be obtained.

The trenches in the planar patterns described in the 29th embodiment and the first to third modifications to the 29th embodiment need not have the same direction or length. The trenches may have different directions and lengths. The modifications may be combined. In addition, a number of trenches need not always be formed in the element region, as shown in FIGS. 40A to 40D. At least two trenches suffice. However, from the viewpoint of burying in the trenches, the trenches preferably have a uniform width and depth. In this embodiment, a MOS transistor having a sectional structure described in the 25th embodiment has been exemplified. However, the 29th embodiment can also be applied to MOS transistors having sectional structures described in the 26th to 28th embodiments. When one of the above-described patterns is applied to the MOS transistors according to one of the 25th to 28th embodiments, the effect (7) can be obtained in addition to the effects (1) to (6).

<30th Embodiment>

Figure 41A:
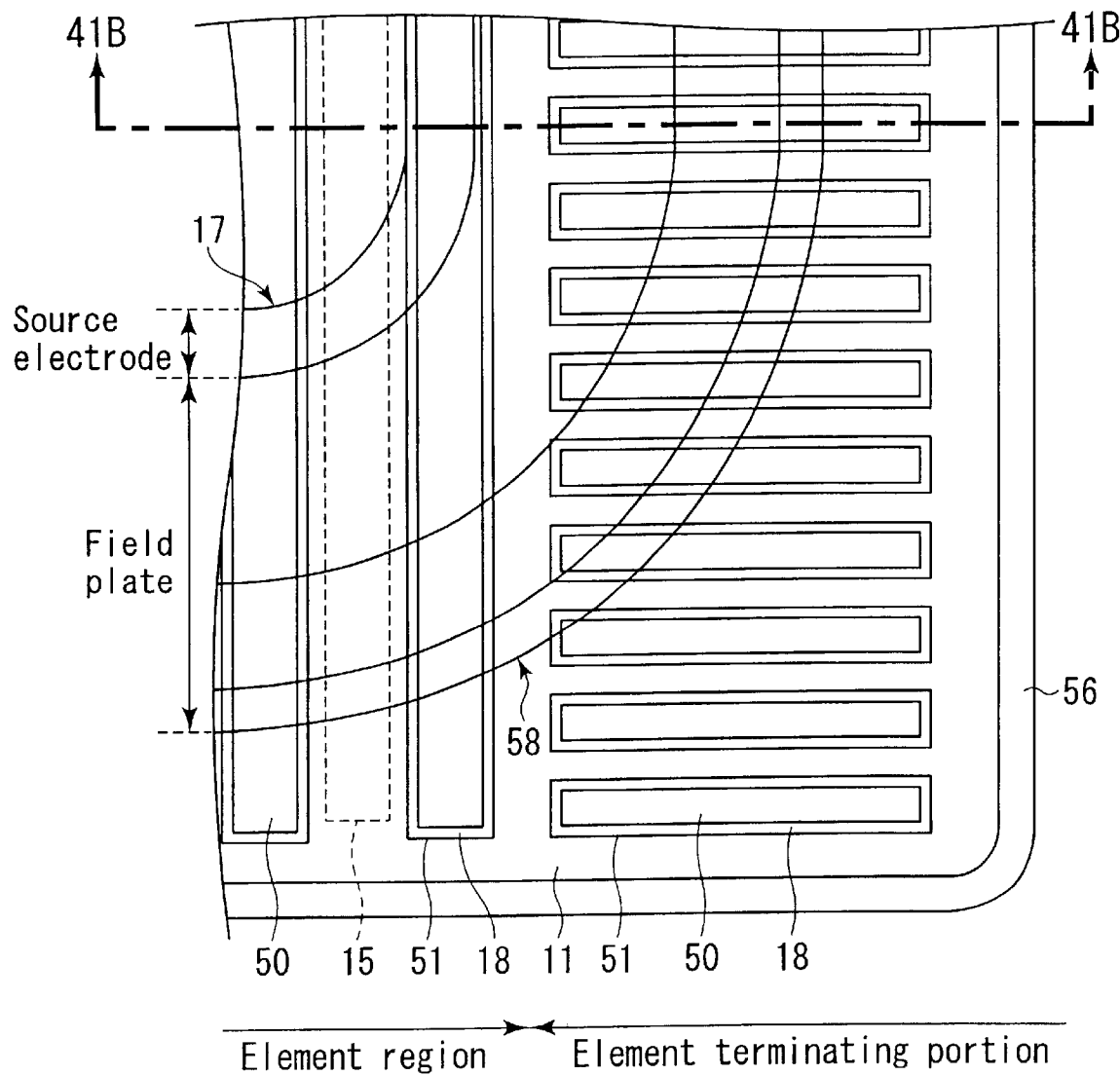
FIG. 41A is a plan view of a vertical power MOS transistor according to the 30th embodiment of the present invention.
Figure 41B:
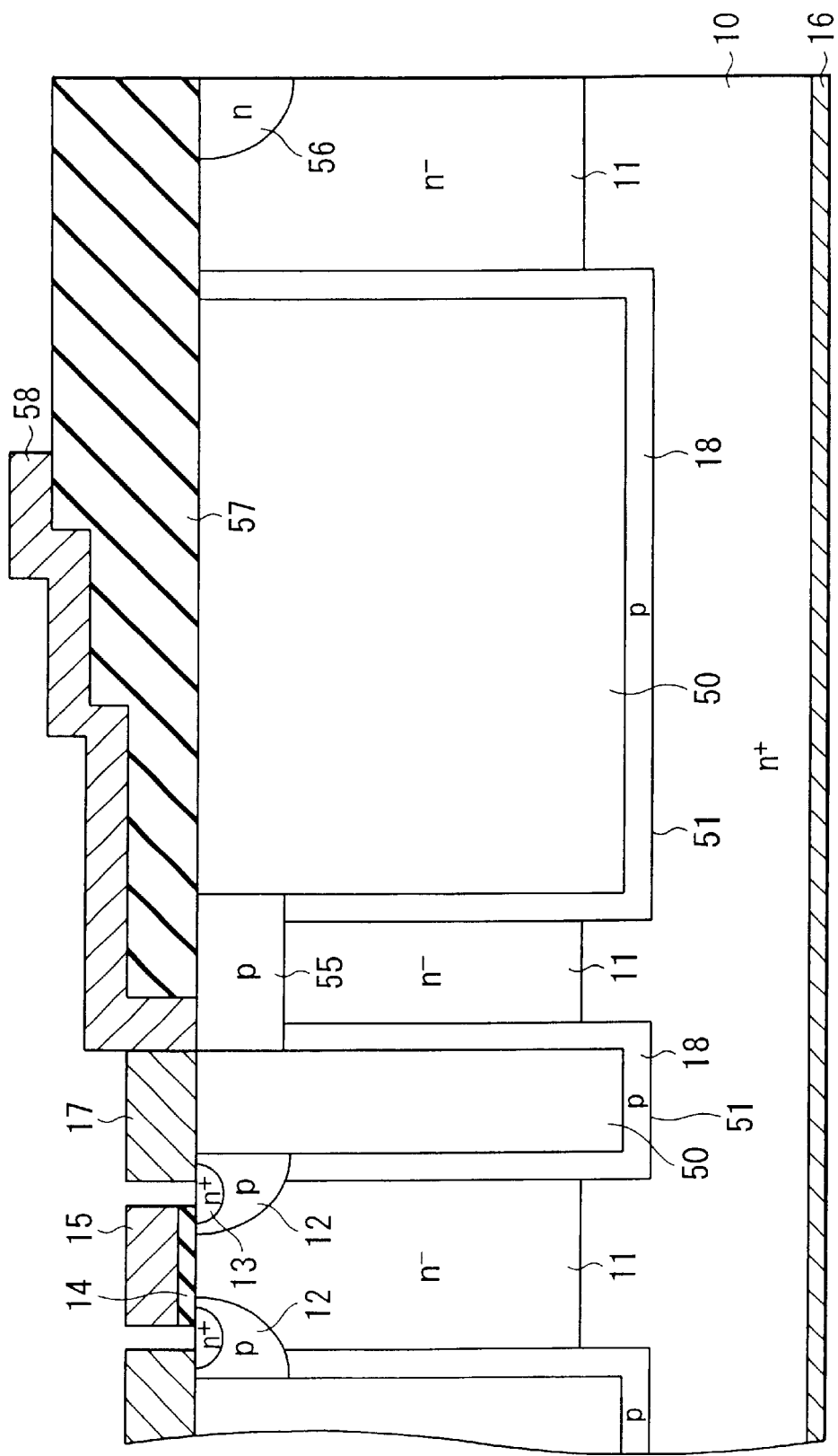
FIG. 41B is a sectional view taken along a line 41B—41B in FIG. 41A.

A semiconductor device according to the 30th embodiment of the present invention will be described next with reference to FIGS. 41A and 41B. FIG. 41A is a plan view of a vertical power MOS transistor according to this embodiment. FIG. 41B is a sectional view taken along a line 41B—41B in FIG. 41A. In this embodiment, the planar structure shown in FIG. 40A described in the 29th embodiment is applied to the element terminating portion of a vertical power MOS transistor described in the 25th embodiment, and a field plate structure is employed.

As shown in FIGS. 41A and 41B, in the element region, insulating films 50 having a stripe pattern are formed along gate electrodes 15. RESURF layers 18 are formed to surround the insulating films 50. At the element terminating portion, the insulating films 50 having a stripe pattern along a direction perpendicular to the gate electrodes 15 are formed. The RESURF layers 18 are formed to surround the insulating films 50. A guard ring layer (p-type semiconductor region) 55 surrounding the central portion of the element region is formed between the RESURF layers 18 in the element region and those in the element terminating portion. A channel stopper (n-type semiconductor region) 56 surrounding the element region is formed at the outermost periphery of the element terminating portion. An insulating film 57 is formed on the surface of the element terminating portion. A field plate 58 made of a conductive film such as a metal film is formed on the insulating film 57 so as to come into contact with the guard ring layer 55 and a source electrode 17.

In the semiconductor device having the above arrangement, since the field plate 58 is formed, a depletion layer at the element terminating portion can be effectively extended. For this reason, the breakdown voltage can be increased.

FIGS. 41A and 41B show an example in which the guard ring layer 55 serving as the boundary between the element region and the element terminating portion is in contact with the end portion of each RESURF layer 18 at the element terminating portion. However, the RESURF layer 18 at the element terminating portion can be formed such that a part of the RESURF layer 18 is I the element region. That is, the RESURF structure in the element region, which is adjacent to the guard ring 55 is not always necessary. The guard ring layer 55 and a base layer 12 of the MOS transistor may be directly jointed. The field plate 58 may be connected not to the source electrode 17 but to the gate electrode 15. Additionally, as described above, the superjunction structures may have not the pattern shown in FIG. 40A but any one of the patterns shown in FIGS. 40B to 40D. Not the sectional structure shown in FIG. 32 but that shown in FIGS. 34, 35, or 39 may be used.

<31st Embodiment>

Figure 42A:
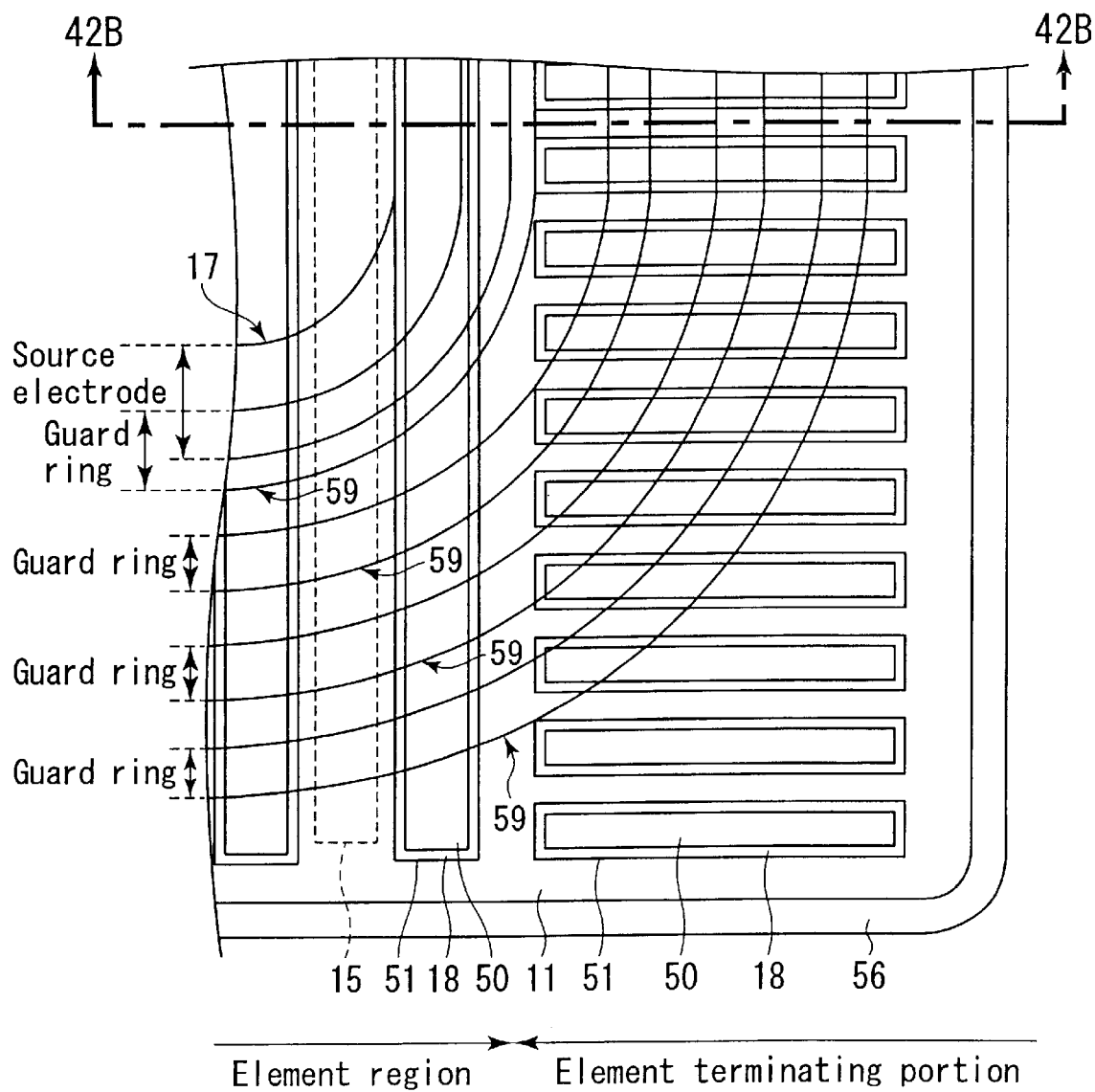
FIG. 42A is a sectional view of a vertical power MOS transistor according to the 31st embodiment of the present invention.
Figure 42B:
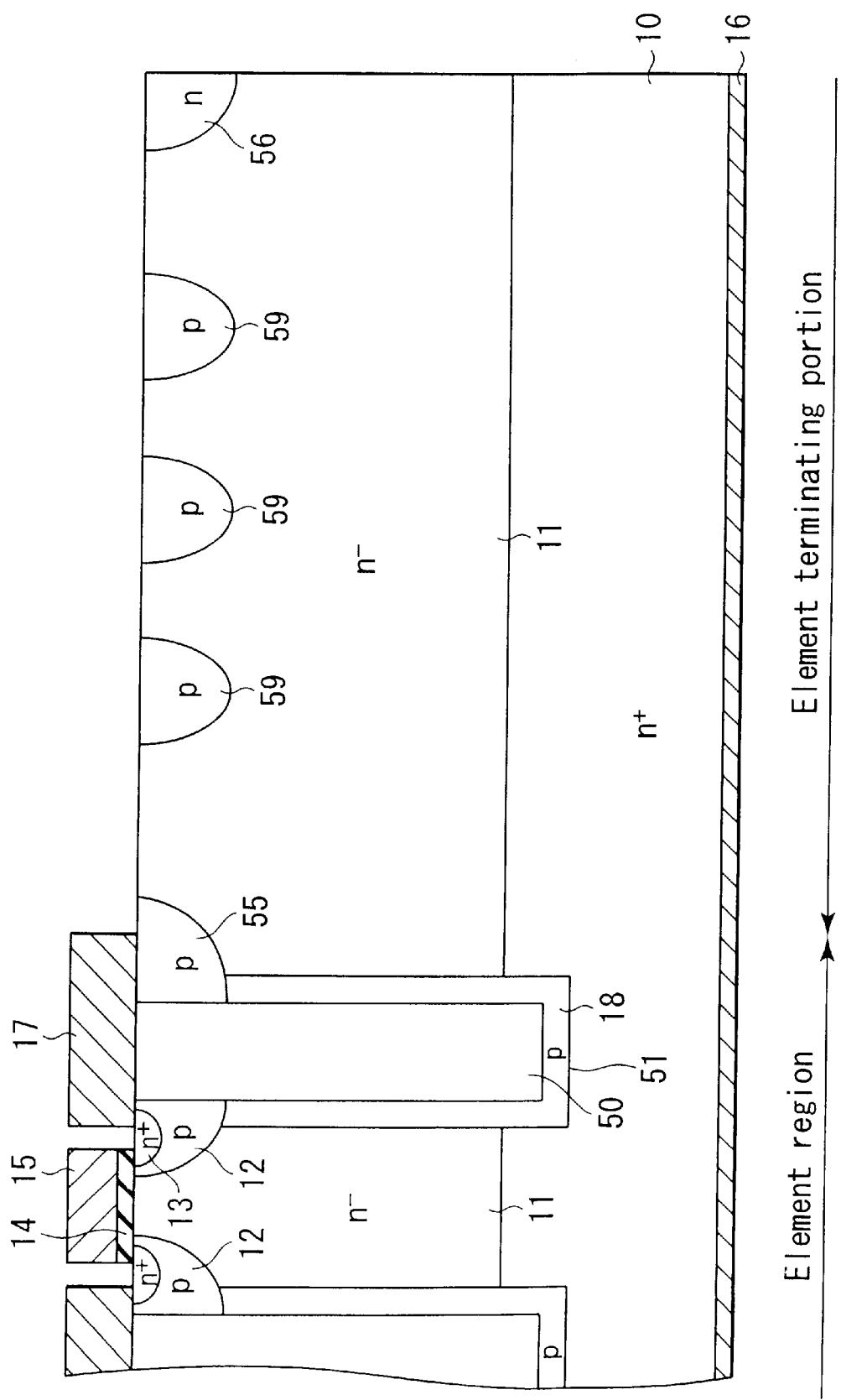
FIG. 42B is a sectional view taken along a line 42B—42B in FIG. 42A.

A semiconductor device according to the 31st embodiment of the present invention will be described next with reference to FIGS. 42A and 42B. FIG. 42A is a plan view of a vertical power MOS transistor according to this embodiment. FIG. 42B is a sectional view taken along a line 42B—42B in FIG. 42A. In this embodiment, the planar structure shown in FIG. 40A described in the 29th embodiment is applied to the element terminating portion of a vertical power MOS transistor described in the 25th embodiment, and a plurality of guard ring layers are formed.

As shown in FIGS. 42A and 42B, in the element region, insulating films 50 having a stripe pattern are formed along gate electrodes 15. RESURF layers 18 are formed to surround the insulating films 50. At the element terminating portion, the insulating films 50 having a stripe pattern along a direction perpendicular to the gate electrodes 15 are formed. The RESURF layers 18 are formed to surround the insulating films 50. A guard ring layer (p-type semiconductor region) 55 surrounding the central portion of the element region is formed between the RESURF layers 18 in the element region and those at the element terminating portion. A channel stopper (n-type semiconductor region) 56 surrounding the element region is formed at the outermost periphery of the element terminating portion. A plurality of guard ring layers 59 surrounding the central portion of the element region are formed in a region between the channel stopper 56 and the guard ring layer 55 at the element terminating portion.

In the semiconductor device having the above arrangement, since the guard ring layers 59 are formed, a depletion layer at the element terminating portion can be effectively extended. For this reason, the breakdown voltage can be increased. Even in this embodiment, as described in the 30th embodiment, any one of the patterns shown in FIGS. 40B to 40D may be used as the planar pattern of superjunction structures. A sectional structure shown in FIGS. 34, 35, or 39 may be used. In this embodiment, a field plate as described in the 30th embodiment may be formed.

<32nd Embodiment>

Figure 43A:
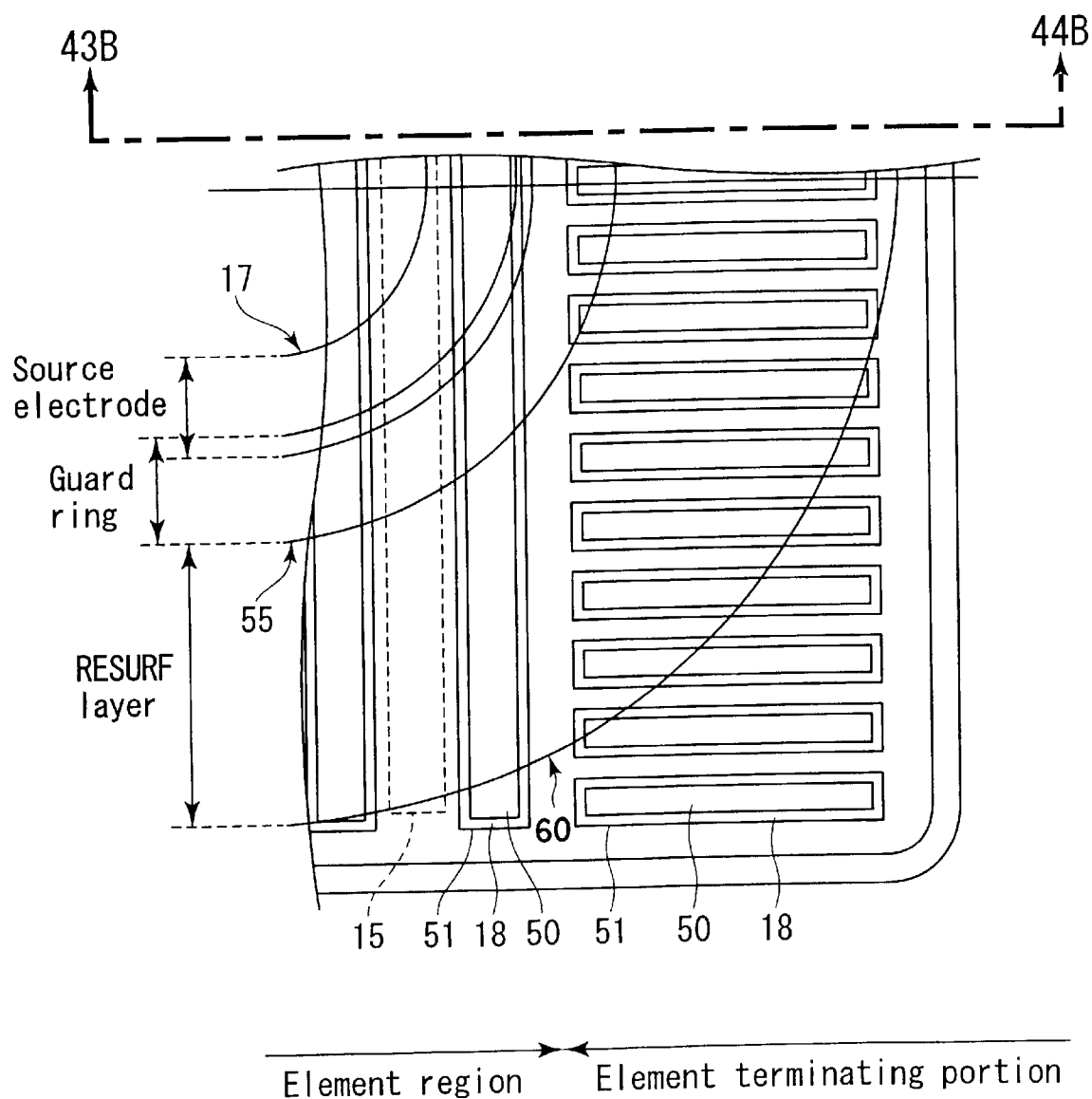
FIG. 43A is a sectional view of a vertical power MOS transistor according to the 32nd embodiment of the present invention.
Figure 43B:
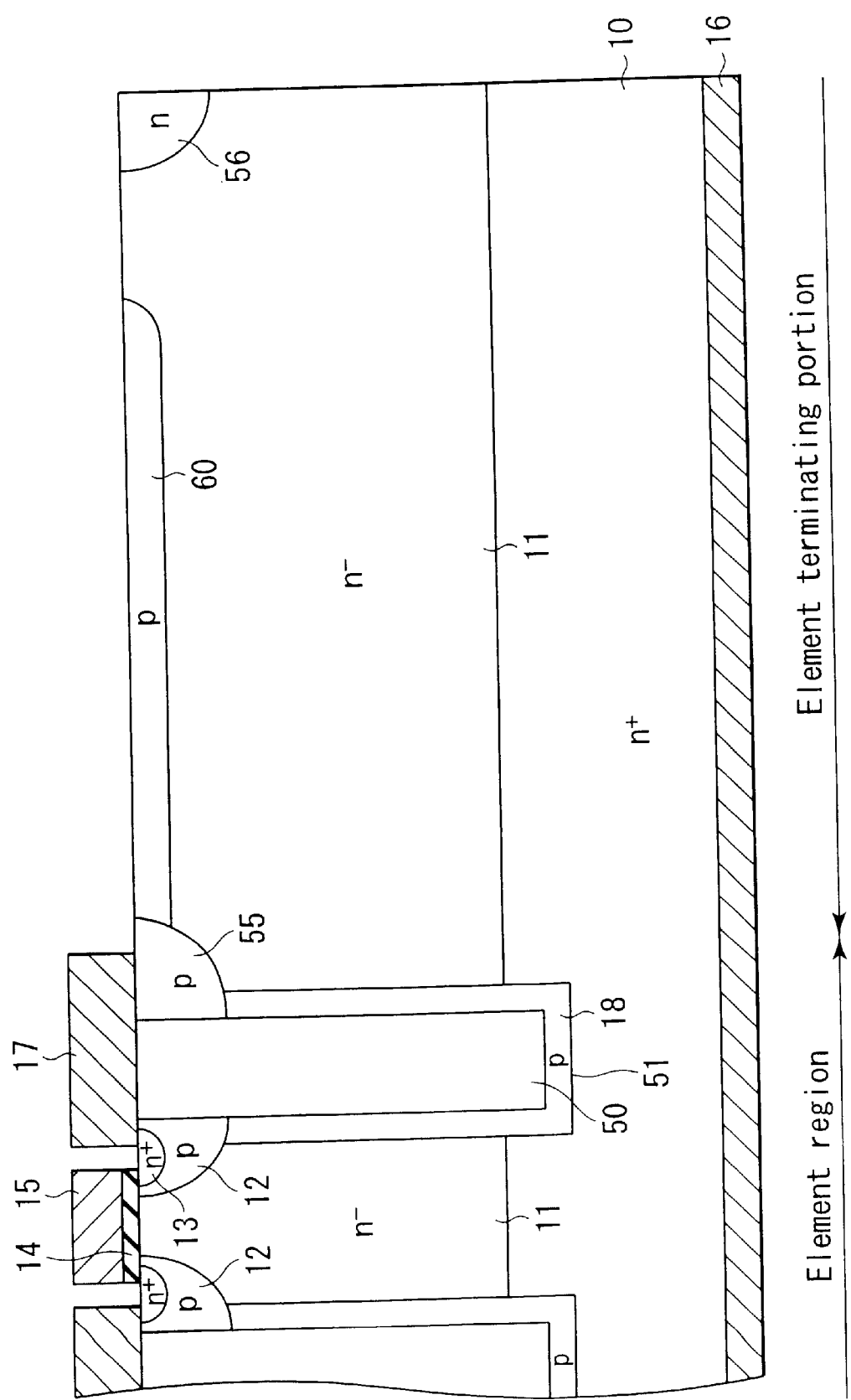
FIG. 43B is a sectional view taken along a line 43B—43B in FIG. 43A.

A semiconductor device according to the 32nd embodiment of the present invention will be described next with reference to FIGS. 43A and 43B. FIG. 43A is a plan view of a vertical power MOS transistor according to this embodiment. FIG. 43B is a sectional view taken along a line 43B—43B in FIG. 43A. In this embodiment, the planar structure shown in FIG. 40A described in the 29th embodiment is applied to the element terminating portion of a vertical power MOS transistor described in the 25th embodiment, and a RESURF layer surrounding the central portion of the element region is further arranged.

As shown in FIGS. 43A and 43B, in the element region, insulating films 50 having a stripe pattern are formed along gate electrodes 15. RESURF layers 18 are formed to surround the insulating films 50. At the element terminating portion, the insulating films 50 having a stripe pattern along a direction perpendicular to the gate electrodes 15 are formed. The RESURF layers 18 are formed to surround the insulating films 50. A guard ring layer (p-type semiconductor region) 55 surrounding the central portion of the element region is formed between the RESURF layers 18 in the element region and those at the element terminating portion. A channel stopper (n-type semiconductor region) 56 surrounding the element region is formed at the outermost periphery of the element terminating portion. A RESURF layer (p-type semiconductor region) 60 surrounding the central portion of the element region is formed in a region between the channel stopper 56 and the guard ring layer 55 at the element terminating portion.

In the semiconductor device having the above arrangement, since the RESURF layer 60 is further arranged, a depletion layer at the element terminating portion can be effectively extended. For this reason, the breakdown voltage can increase. Even in this embodiment, as described in the 30th embodiment, any one of the patterns shown in FIGS. 40B to 40D may be used as the planar pattern of superjunction structures. A sectional structure shown in FIGS. 34, 35, or 39 may be used. In this embodiment, a field plate as described in the 30th embodiment may be formed.

The optimum values of the impurity concentration and thickness of the RESURF layer 60 are the same as those of the RESURF layer 18. Hence, the RESURF layer 60 need not be formed by a p-type impurity diffusion layer, as shown in FIG. 43B. For example, when a trench is filled with the RESURF layer 18, the RESURF layer 18 formed even on the drift layer 11 may be left at the element terminating portion and used as the RESURF layer 60.

<33rd Embodiment>

Figure 44:
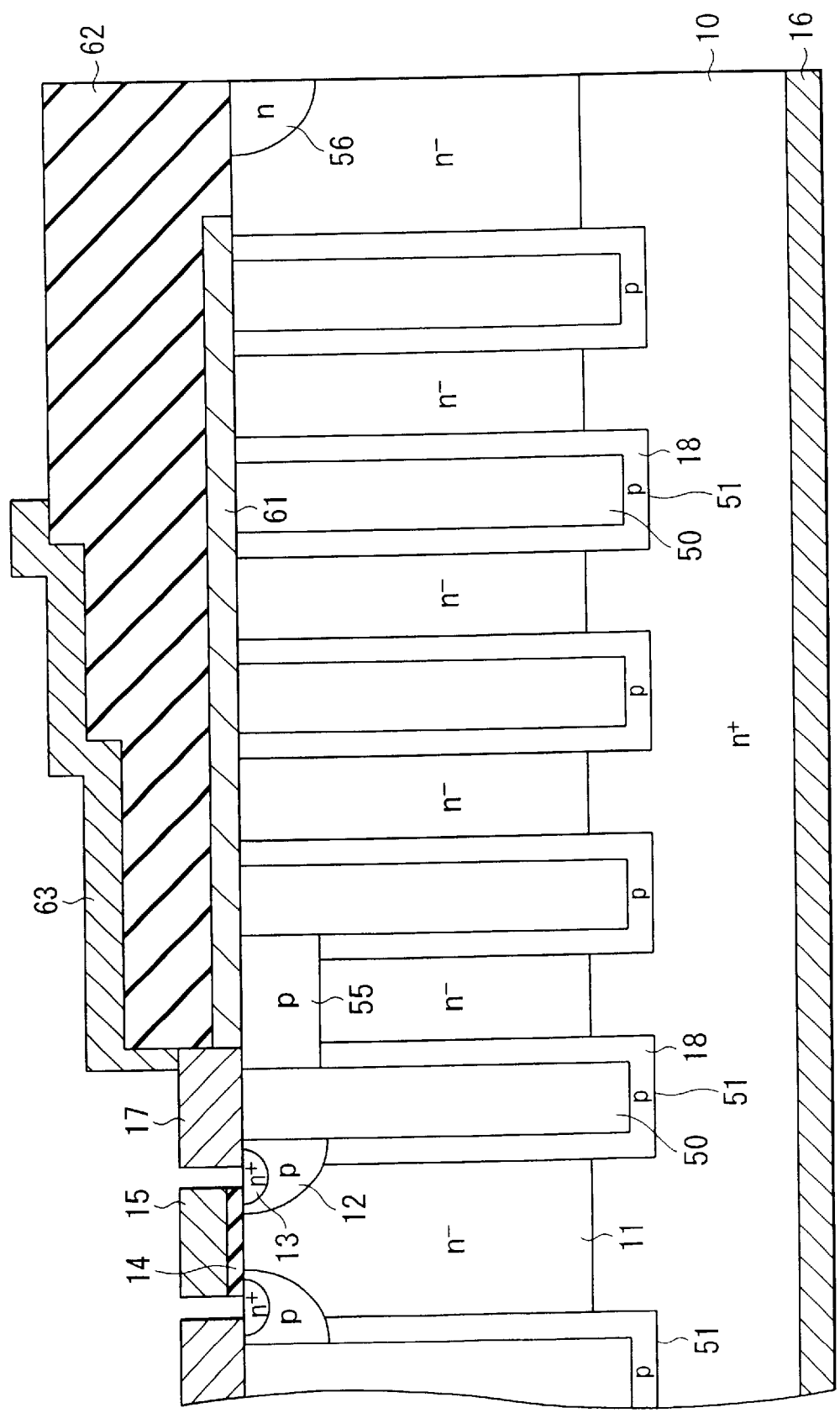
FIG. 44 is a sectional view of a vertical power MOS transistor according to the 33rd embodiment of the present invention.

A semiconductor device according to the 33rd embodiment of the present invention will be described next with reference to FIG. 44. FIG. 44 is a sectional view of a vertical power MOS transistor according to this embodiment. This embodiment is related to the structure of, particularly, the element terminating portion of the vertical power MOS transistor described in the 25th embodiment. A case wherein the planar pattern described in the 29th embodiment is not applied to the superjunction structures at an element terminating portion will be described.

As shown in FIG. 44, in the element region, trenches 51 having a stripe pattern along gate electrodes 15 are formed. Each trench 51 is filled with a RESURF layer 18 and insulating film 50. The trenches 51 having the same pattern as in the element region are formed even at the element terminating portion. Each trench 51 has the RESURF layer 18 and insulating film 50. That is, superjunction structures having the same stripe pattern are formed in the element region and at the element terminating portion. As described above, only with this structure, a depletion layer cannot spread in the horizontal direction because of the insulating films 50. To prevent this, in the structure according to this embodiment, a semiconductor layer 61 is formed on the element terminating portion to electrically connect the plurality of RESURF layers 18 and a guard ring layer 55. An insulating film 62 is formed on the element terminating portion to cover the semiconductor layer 61. A field plate 63 is formed on the insulating film 62.

The semiconductor device having the above arrangement can obtain the following effect in addition to the effects (1) to (6).

(8) Since a depletion layer can quickly extend when a high voltage is applied, the breakdown voltage can be increased.

This is because when the RESURF layers 18 are depleted, the semiconductor layer 61 serves as a path for holes. Hence, the depletion layer can easily spread to adjacent superjunction structures. As a result, the depletion layer can be quickly extended even in the horizontal direction, and the breakdown voltage can increase.

As the semiconductor layer 61, a single-crystal silicon film, a polysilicon film, or a semi-insulating polysilicon film can be used. The semiconductor layer 61 preferably has an impurity concentration so as to make complete depletion possible when a high voltage is applied. In this embodiment, a field plate is formed. However, guard ring layers 59 described in the 31st embodiment or a RESURF layer 60 described in the 32nd embodiment may be formed. As the sectional structure of the element region, not the structure described in the 25th embodiment but any one of the structures described in the 26th to 28th embodiments may be used.

<34th Embodiment>

Figure 45:
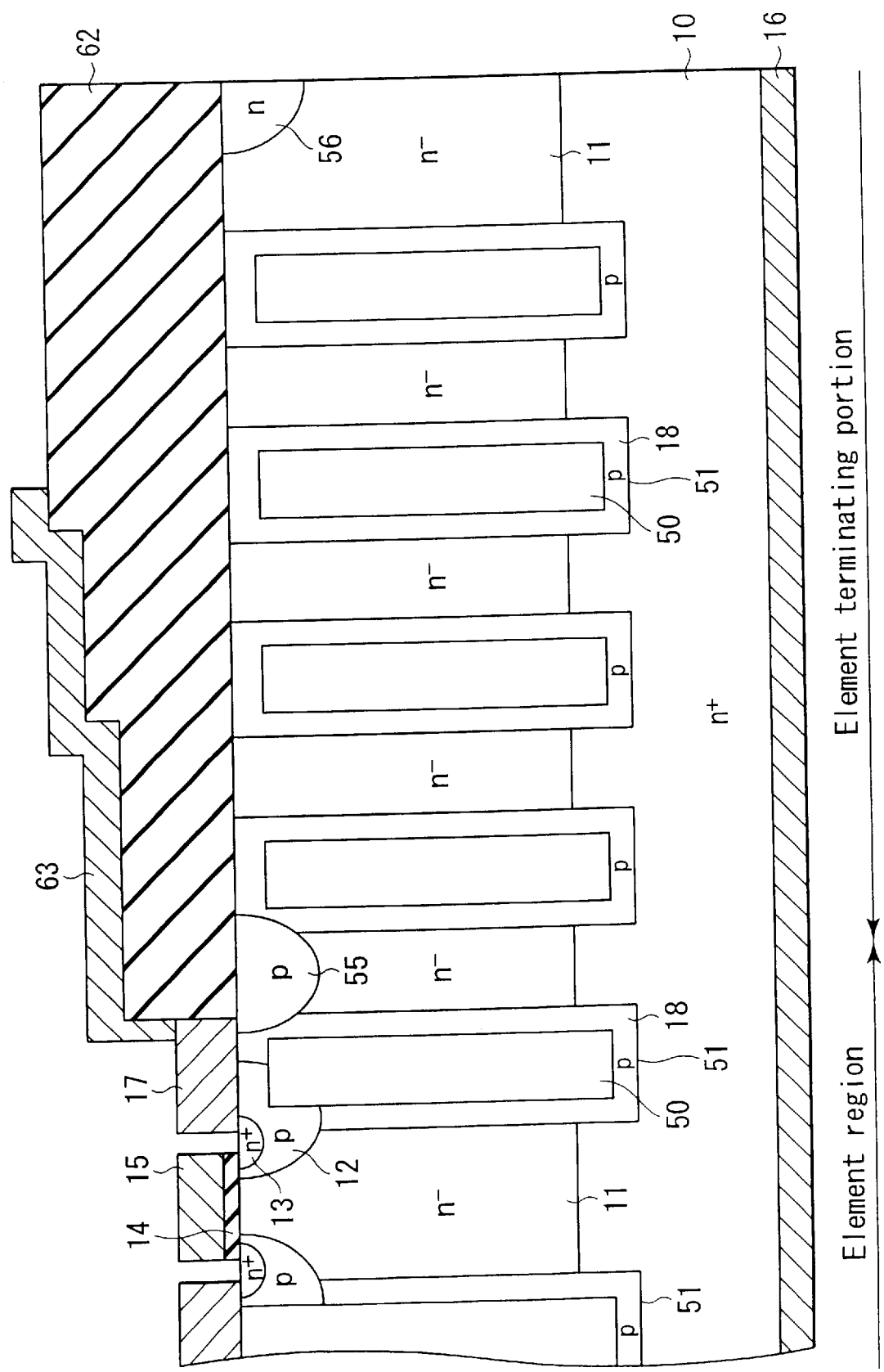
FIG. 45 is a sectional view of a vertical power MOS transistor according to the 34th embodiment of the present invention.

A semiconductor device according to the 34th embodiment of the present invention will be described next with reference to FIG. 45. FIG. 45 is a sectional view of a vertical power MOS transistor according to this embodiment. This embodiment is related to the structure of, particularly, the element terminating portion of the vertical power MOS transistor described in the 25th embodiment. A case wherein the planar pattern described in the 29th embodiment is not applied to the superjunction structures at an element terminating portion will be described.

As shown in FIG. 45, the structure according to this embodiment is different from that shown in FIG. 44 described in the 33rd embodiment in that instead of the semiconductor layer 61, RESURF layers 18 formed on insulating films 50 are used as a path of holes at a portion with the insulating film 50. That is, the RESURF layer 18 is formed not only on the side and bottom surfaces of a trench 51 but also on the insulating film 50. As a result, the insulating film 50 is completely surrounded by the RESURF layer 18. With this structure, when the RESURF layers 18 are depleted, holes can move to adjacent superjunction structures through the RESURF layers 18 on the insulating films 50. Hence, the depletion layer can quickly spread even in the horizontal direction. As in the 33rd embodiment, the effect (8) can be obtained in addition to the effects (1) to (6).

The structure shown in FIG. 45 can be implemented by recessing each insulating film 50 from the surface and forming the RESURF layer 18 again in the structure shown in FIG. 33D in the manufacturing method described in the 25th embodiment. This structure can also be formed by recessing each insulating film 50 and then executing annealing at a high temperature in a hydrogen atmosphere. In this case, the RESURF layers 18 reflow upon annealing and flow into the regions where the insulating films 50 are removed. The RESURF layers 18 are jointed at the upper portion of each insulating film 50. In this embodiment, the sectional structure described in the 25th embodiment has been exemplified. However, the structure shown in FIGS. 34, 35, or 39 described in the 26th to 28th embodiments may be used. In this embodiment, a field plate is formed. However, guard ring layers 59 described in the 31st embodiment or a RESURF layer 60 described in the 32nd embodiment may be formed.

<35th Embodiment>

Figure 46A:
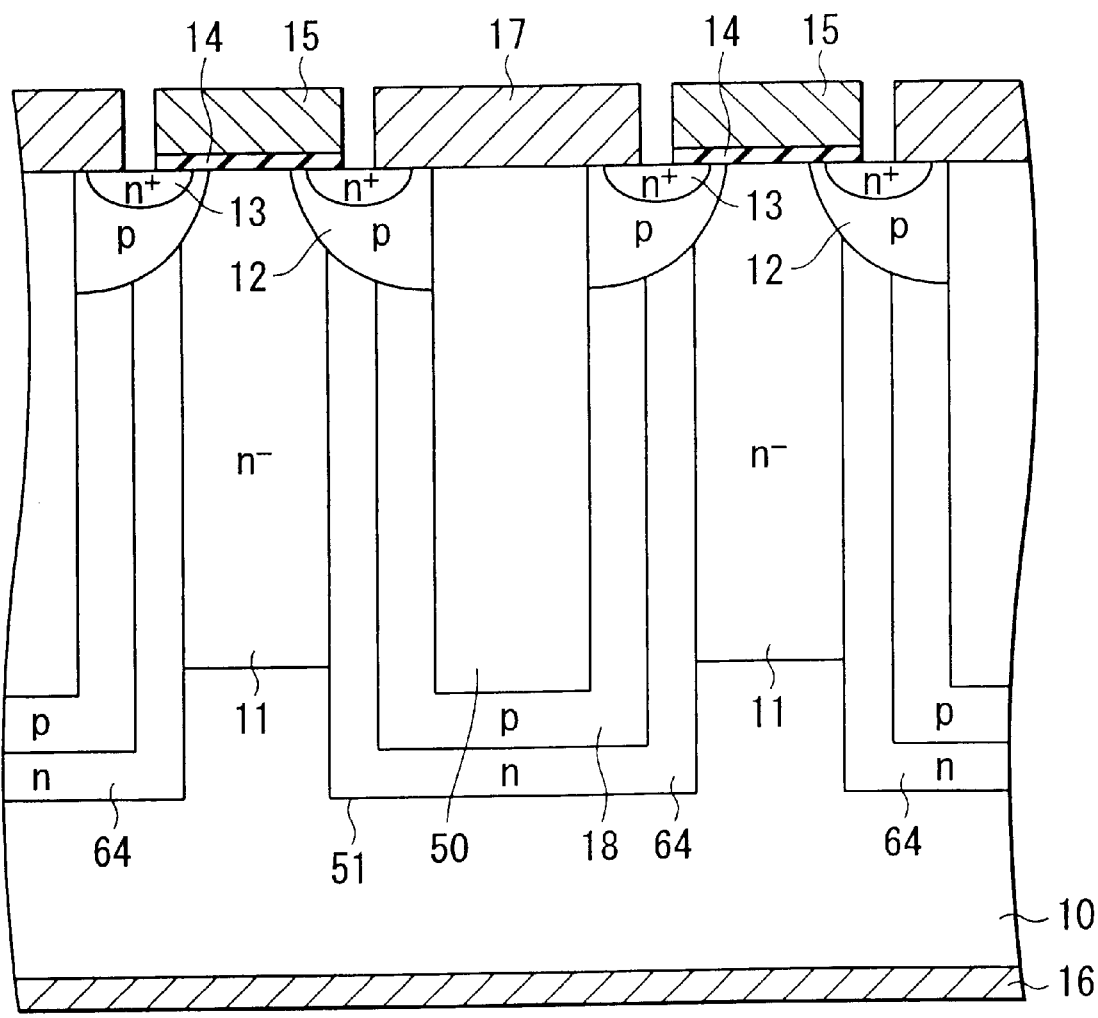
FIG. 46A is a sectional view of a vertical power MOS transistor according to the 35th embodiment of the present invention.

A semiconductor device according to the 35th embodiment of the present invention will be described next with reference to FIG. 46A. FIG. 46A is a sectional view of a vertical power MOS transistor according to this embodiment.

As shown in FIG. 46A, in the MOS transistor according to this embodiment, an n-type semiconductor layer 64 is formed between a RESURF layer 18 and a drift layer 11 and drain layer 10 in the structure shown in FIG. 32 described in the 25th embodiment. The impurity concentration in the drift layer 11 is set to almost the same low level as in the prior art. The n-type semiconductor layer 64 has an impurity concentration higher than that in the drift layer 11 and almost equal to that in the RESURF layer 18.

The semiconductor device having the above arrangement can be manufactured by forming the n-type semiconductor layer 64 in a trench 51, forming the RESURF layer 18 on the semiconductor layer 64, and then, forming an insulating film 50 in FIG. 33C described in the manufacturing method according to the 25th embodiment.

The semiconductor device having the above structure can obtain the following effects in addition to the effects (1) to (6).

(9) The reliability in holding the breakdown voltage can be improved. In the structure shown in FIG. 46A, the carrier path between a base layer 12 and the drain layer 10 is not the drift layer 11 but the n-type semiconductor layer 64. Hence, the drift layer 11 need not have a high impurity concentration. When the impurity concentration in the drift layer 11 is low, a superjunction structure is substantially formed from the RESURF layer 18 and n-type semiconductor layer 64. The drift layer 11 does not function as a superjunction structure anymore. Both the RESURF layer 18 and n-type semiconductor layer 64 are formed by crystal growth in the trench 51. Hence, even when the RESURF layer 18 and n-type semiconductor layer 64 have impurity concentration distributions different from designed value in the direction of depth in the trench, the distributions are almost the same. In addition, the RESURF layer 18 and n-type semiconductor layer 64 have almost the same impurity concentration. Since a superjunction structure is formed by a p-n junction with the same impurity concentration, the reliability in holding the breakdown voltage can be improved.

(10) Design of semiconductor device can be simplified. Since the impurity concentration in the drift layer 11 can be reduced, a depletion layer can quickly extend in the drift layer 11. Hence, the special structures described in the 29th, 33rd, and 34th embodiments are not required at the element terminating portion. To reduce the ON resistance, the impurity concentration not in the drift layer 11 but in the n-type semiconductor layer 64 is increased. The drift layer 11 can have an impurity concentration almost equal to or less than the impurity concentration in the prior art. Hence, the same structure as in the prior art can be applied to the element terminating portion. The effect (10) will be described below in detail with reference to FIGS. 46B and 46C.

Figure 46B:
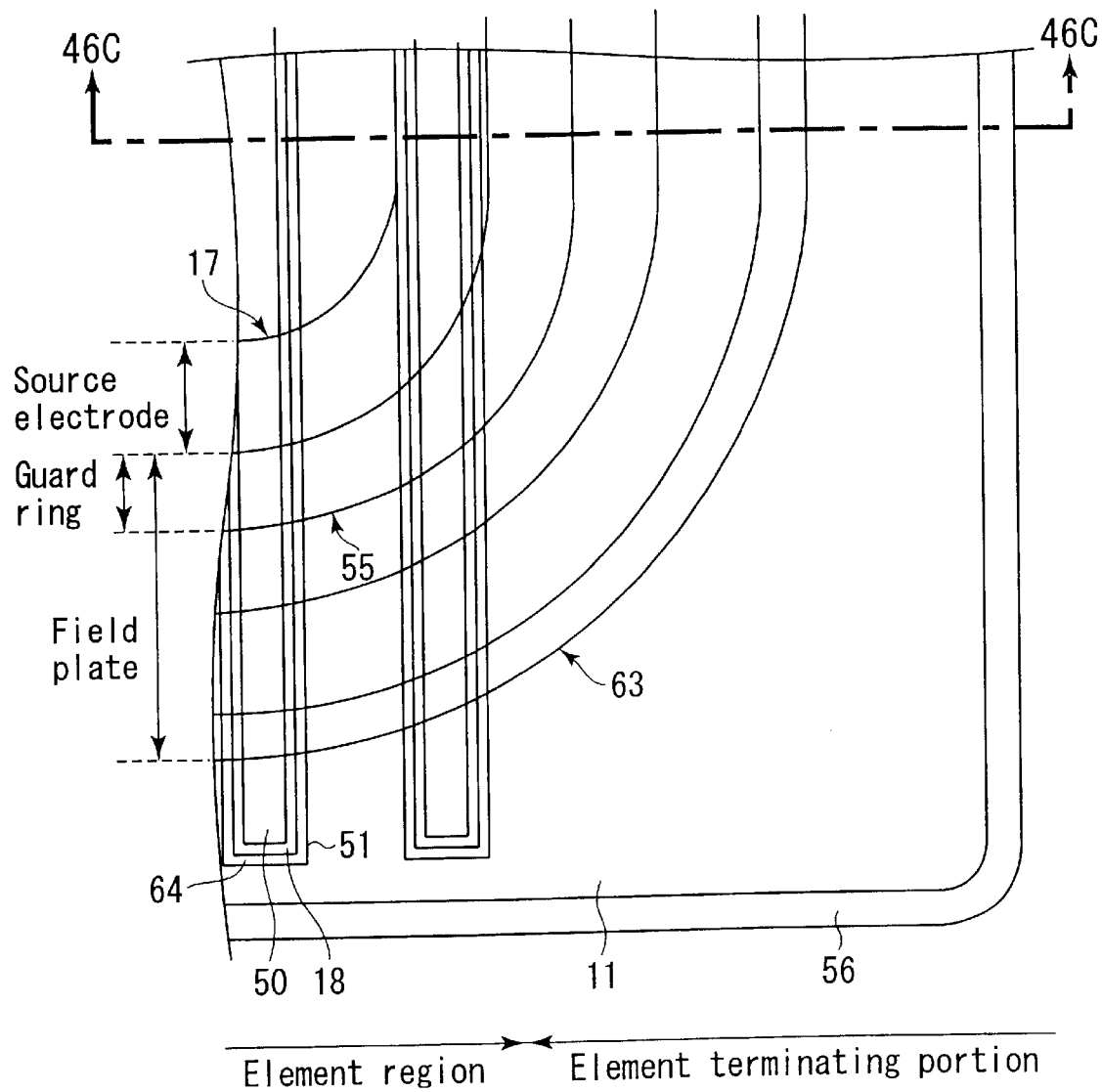
FIG. 46B is a plan view of the vertical power MOS transistor according to the 35th embodiment of the present invention.
Figure 46C:
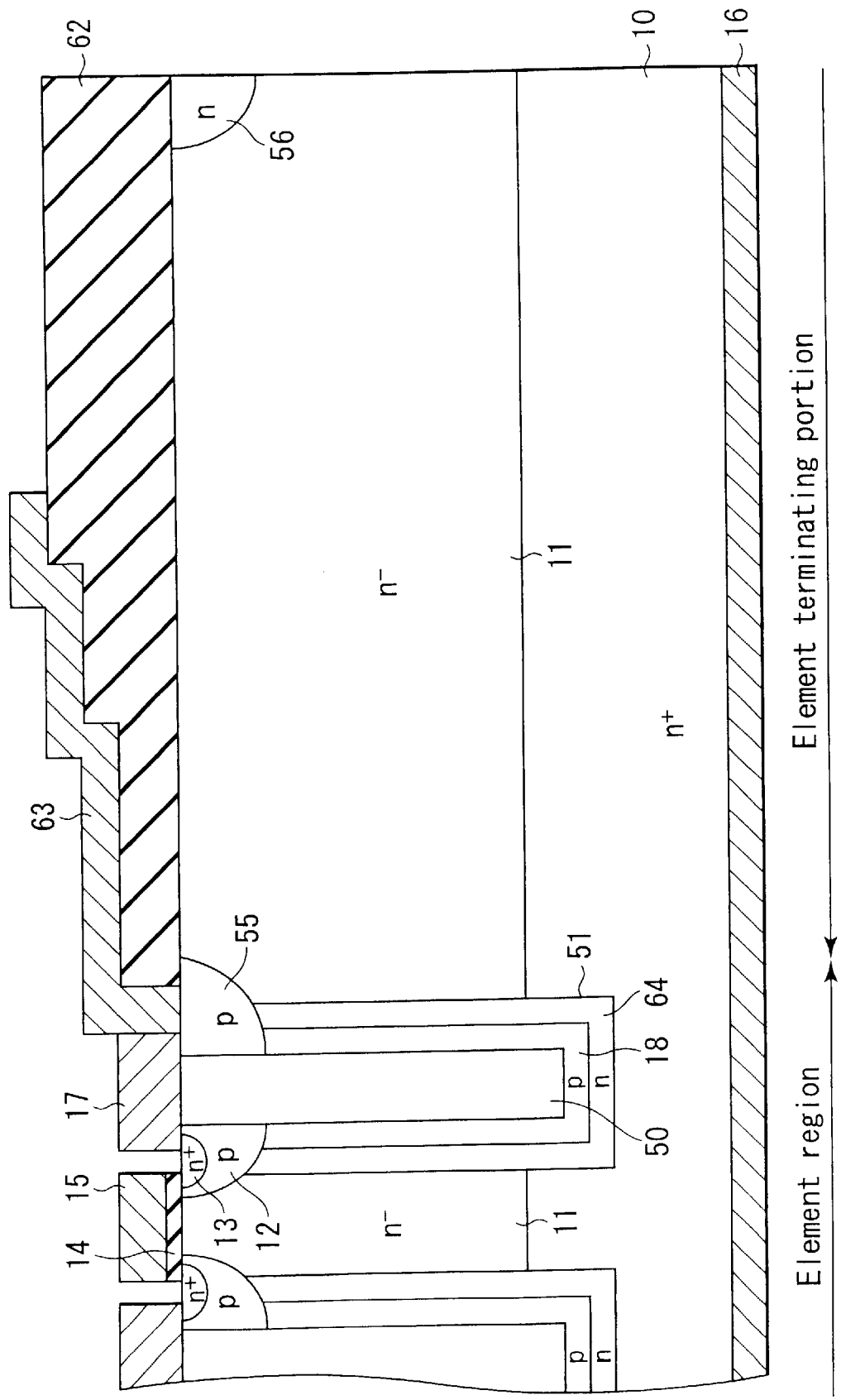
FIG. 46C is a sectional view taken along a line 46C—46C in FIG. 46B.

FIG. 46B is a plan view of the vertical power MOS transistor according to this embodiment. FIG. 46C is a sectional view taken along a line 46C—46C in FIG. 46B.

As shown in FIGS. 46B and 46C, since the drift layer 11 at the element terminating portion has a low impurity concentration, a depletion layer can quickly spread. Hence, no superjunction structure is necessary at the element terminating portion. The breakdown voltage can be maintained only with a field plate 63. As in a normal MOS transistor, a RESURF layer 60 shown in FIG. 43B or guard rings 59 shown in FIG. 42B may be formed.

As shown in FIG. 46B, the field plate 63 is not present on longitudinal end portions of the trenches 51 in the element region. Hence, the voltage applied to the trench end portions is suppressed. Even when the crystallinity of the semiconductor layer that fills a trench end portion degrades, the breakdown voltage can be maintained. A guard ring 55 formed at the outermost periphery of the element region is preferably formed along the pattern of the trenches 51. In this case, the superjunction structure can be symmetrical, i.e., can have identical structures at the central portion and the end portion of the element region. Hence, the reliability in holding the breakdown voltage can be improved. Even when the n-type semiconductor layer 64 is formed by ion implantation from oblique directions after formation of the trenches 51, and the n-type semiconductor layers 64 are present only in the side walls of the drift layer 11, the same effects as described above can be obtained.

<36th Embodiment>

Figure 47:
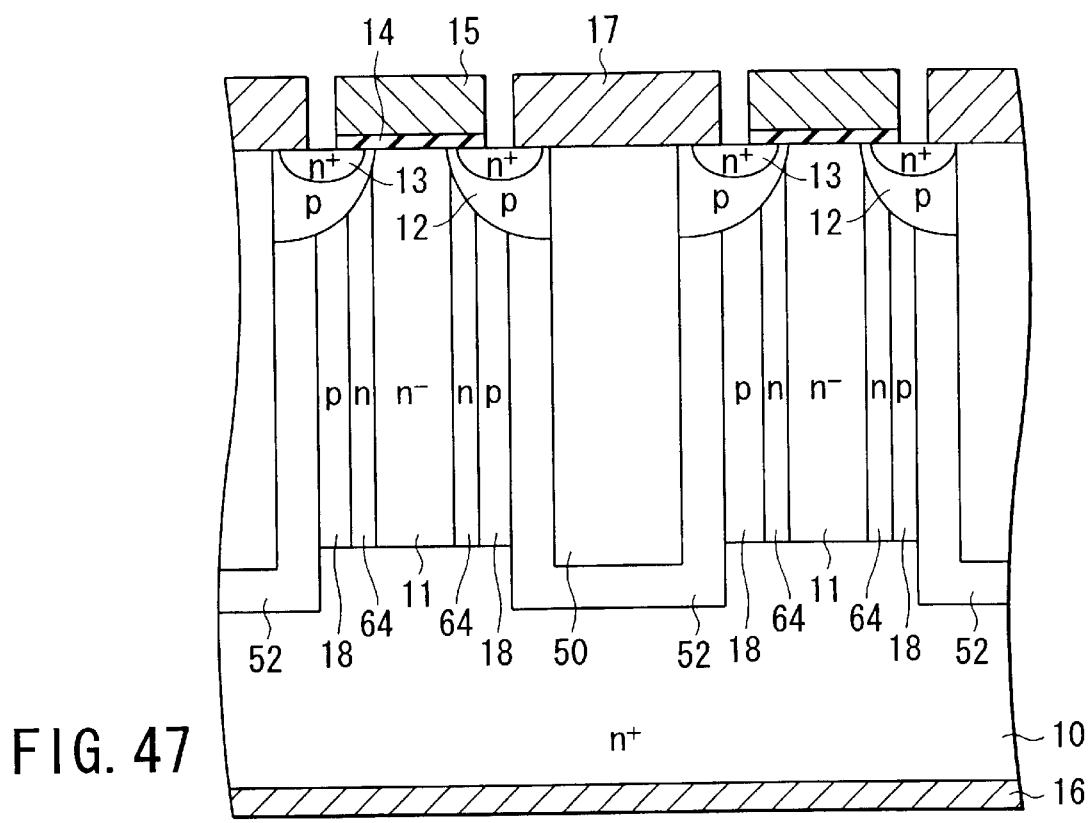
FIG. 47 is a sectional view of a vertical power MOS transistor according to the 36th embodiment of the present invention.

A semiconductor device according to the 36th embodiment of the present invention will be described next with reference to FIG. 47. FIG. 47 is a sectional view of a vertical power MOS transistor according to this embodiment. In this embodiment, the structure (FIG. 35) described in the 28th embodiment and the structure described in the 35th embodiment are combined. That is, n-type semiconductor layers 64 and RESURF layers 18 are formed by ion implantation from oblique directions such that they are present only in the side walls of a drift layer 11. Each trench 51 is filled with a lightly-doped or undoped semiconductor layer 52 and insulating film 50.

Even with this structure, the same effects as described above can be obtained.

<37th Embodiment>

Figure 48:
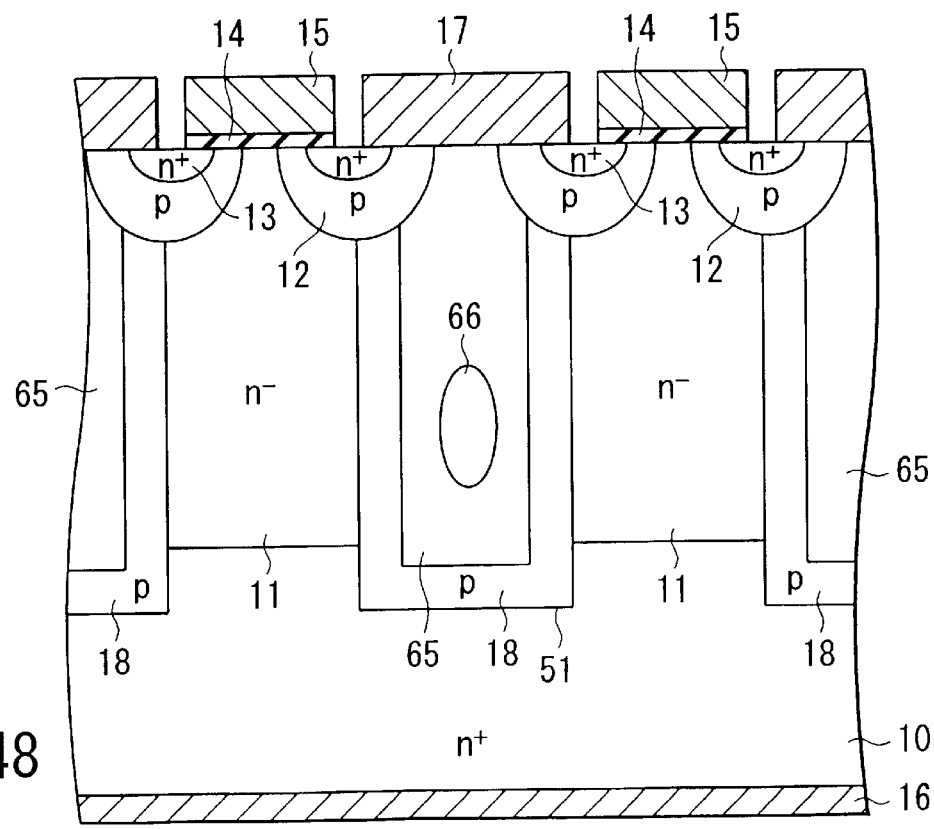
FIG. 48 is a sectional view of a vertical power MOS transistor according to the 37th embodiment of the present invention.

A semiconductor device according to the 37th embodiment of the present invention will be described next with reference to FIG. 48. FIG. 48 is a sectional view of a vertical power MOS transistor according to this embodiment.

In the MOS transistor according to this embodiment, an insulating film 50 described in the 25th embodiment is replaced with a semiconductor layer 65 having a low impurity concentration. According to this arrangement, effects (11) and (12) can be obtained in addition to the above-described effects.

(11) The breakdown voltage is not influenced by cavities in a trench. As described in the prior art, when a trench is to be filled with a semiconductor layer, the crystal growth rate changes between the upper portion and the lower portion of the trench. Hence, a cavity 66 is generated. In this case, since the thickness of the RESURF layer changes between the upper portion and the lower portion of the trench, the breakdown voltage degrades. In the arrangement of this embodiment, however, a RESURF layer 18 is formed so thick that no cavity is generated in a trench 51. The trench 51 is not completely filled with the RESURF layer 18. After that, the trench 51 is filled with the semiconductor layer 65 having a low impurity concentration. Even when the cavity 66 is generated in the semiconductor layer 65, and the thickness changes between the upper portion and the lower portion in the trench 51, the semiconductor layer 65 does not substantially contribute to the superjunction structure because the layer has a low impurity concentration. Hence, the breakdown voltage does not decrease. When the trench 51 is filled with the semiconductor layer, it is only necessary to change the concentration of an impurity to be doped, and crystal growth can be continuously executed. Hence, the manufacturing process can be simplified.

(12) The structure at the element terminating portion can be simplified. In the 25th to 35th embodiments, each trench 51 is filled with an insulating layer. Hence, a depletion layer cannot extend to adjacent superjunction structures. For this reason, a specific structure as described in the 29th embodiment is necessary. In the 37th embodiment, however, since each trench 51 is filled with the semiconductor layer 65. The superjunction structures are electrically connected, and a path of holes is ensured. Hence, a superjunction structure needs to have no specific structure, unlike the 29th embodiment. The breakdown voltage can be maintained only by a conventional means (a field plate or guard ring). The manufacturing process can be simplified. The structure of this embodiment can also be applied to the structures shown in FIGS. 34, 35, 39, 46A, and 47.

In the 25th to 37th embodiments, to completely fill the trench 51, the insulating film 50 is used. If the trench 51 is to be filled with a single-crystal semiconductor layer, the insulating film 50 need not be used.

<38th Embodiment>

Figure 49A:
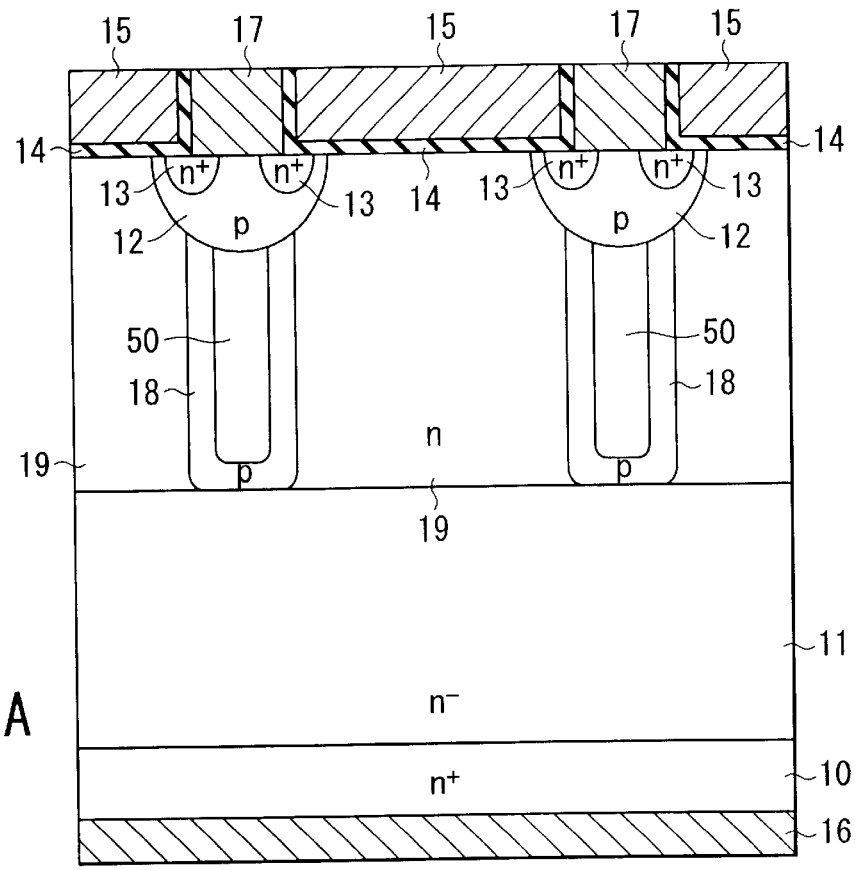
FIGS. 49A and 49B are sectional views of a vertical power MOS transistor according to the 38th embodiment of the present invention.
Figure 49B:
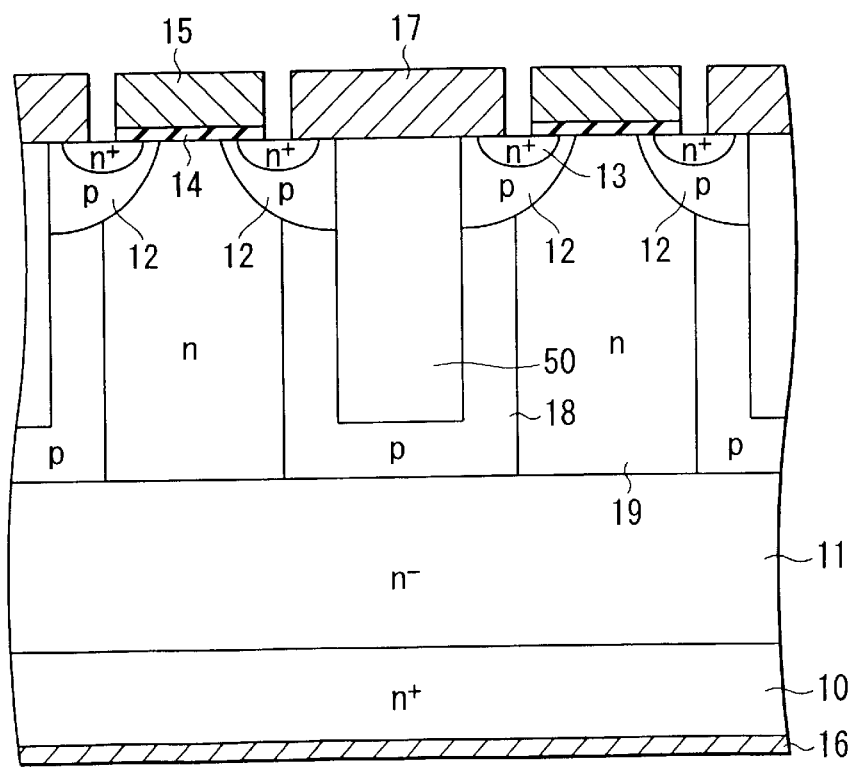

A semiconductor device according to the 38th embodiment of the present invention will be described next with reference to FIGS. 49A and 49B. FIGS. 49A and 49B are sectional views of a vertical power MOS transistor according to this embodiment. In this embodiment, the first and 25th embodiments are combined.

As shown in FIGS. 49A and 49B, in the structure according to this embodiment, an insulating film 50 is formed in each RESURF layer 18 of the structure shown in FIG. 2. In the structure shown in FIG. 49A, the RESURF layer 18 and insulating film 50 are arranged under a base layer 12. The insulating film 50 may extend through the base layer 12, as shown in FIG. 49B.

Figure 50A:
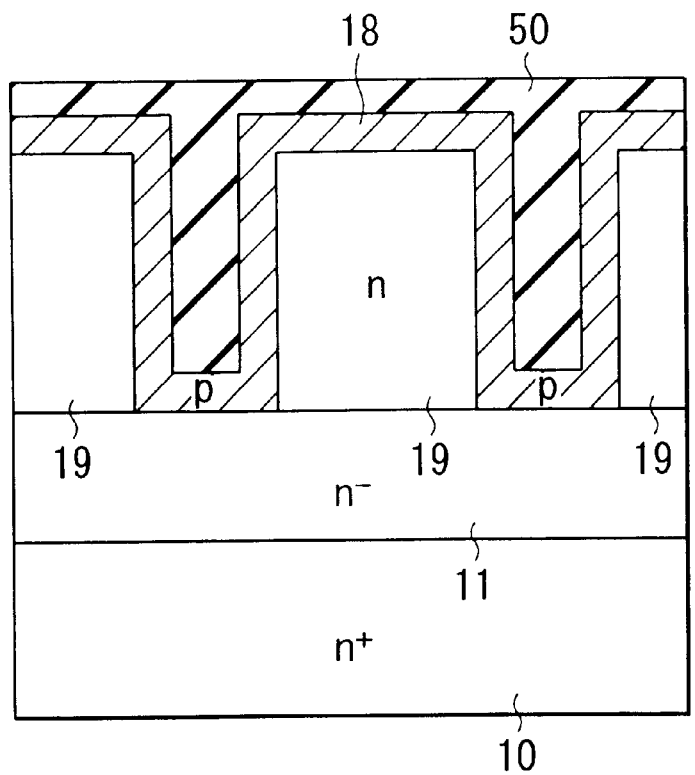
FIGS. 50A and 50B are sectional views sequentially showing steps in manufacturing the vertical power MOS transistor shown in FIGS. 49A and 49B.
Figure 50B:
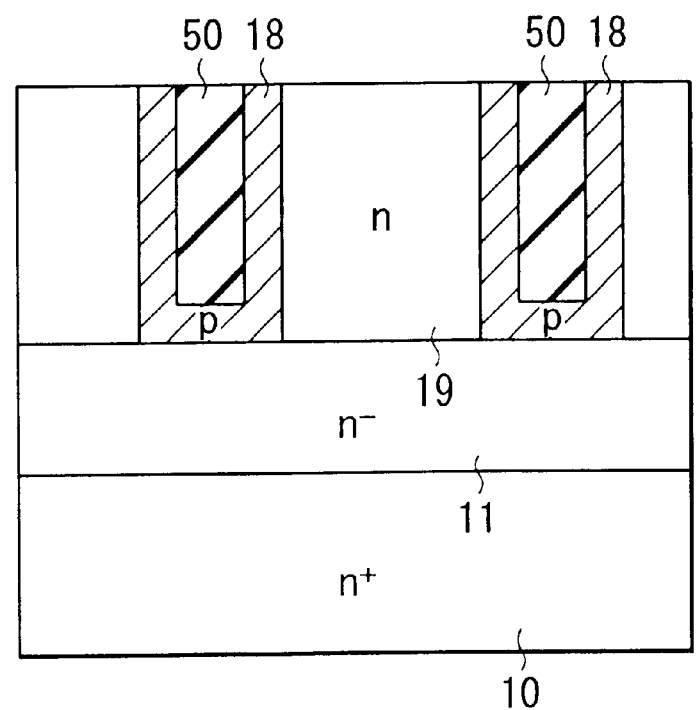

A method of manufacturing the vertical power MOS transistor having the above arrangement will be described with reference to FIGS. 50A and 50B. FIGS. 50A and 50B are sectional views sequentially showing steps in manufacturing the vertical power MOS transistor shown in FIGS. 49A and 49B.

First, the structure shown in FIG. 7B is obtained by the process described in the third embodiment. After a mask material 23 is removed, the RESURF layer 18 is formed in the trench and on a second drift layer 19. The insulating film 50 is formed on the RESURF layer 18. At this time, the RESURF layer 18 does not completely fill the trench. On the other hand, the insulating film 50 fills the trench. As a result, the structure shown in FIG. 50A can be obtained.

Next, as shown in FIG. 50B, the insulating film 50 and RESURF layer 18 on the second drift layer are polished and planarized, thereby leaving the insulating film 50 and RESURF layer 18 only in the trench.

After that, the vertical power MOS transistor shown in FIGS. 49A and 49B is completed by a known MOS process.

According to the structure of this embodiment, the filling process in the trench is facilitated. In addition to the effects described in the first embodiment, the effects described in the 25th embodiment can also be obtained.

<39th Embodiment>

Figure 51:
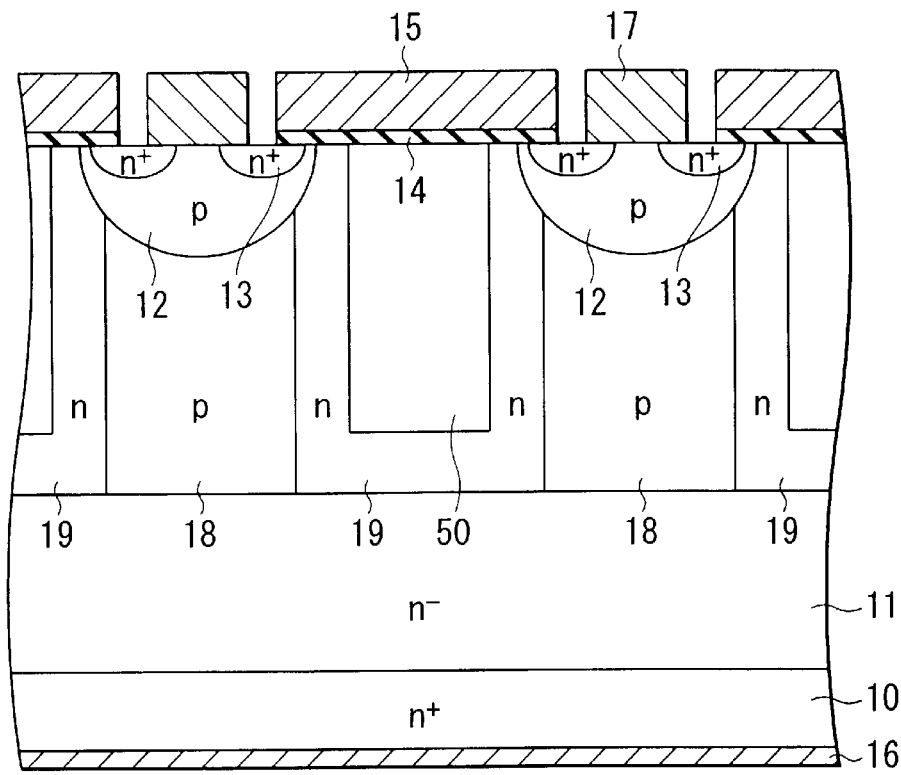
FIG. 51 is a sectional view of a vertical power MOS transistor according to the 39th embodiment of the present invention.

A semiconductor device according to the 39th embodiment of the present invention will be described next with reference to FIG. 51. FIG. 51 is a sectional view of a vertical power MOS transistor according to this embodiment. In this embodiment, the first and 26th embodiments are combined.

As shown in FIG. 51, in the structure according to this embodiment, the positions of a RESURF layer 18 and second drift layer 19 of the structure shown in FIG. 49A are exchanged.

Even in this embodiment, the effects described in the first and 25th embodiments can be obtained. As a method of manufacturing the arrangement of this embodiment, in the step shown in FIG, 50A, the RESURF layer 18 is formed on a drift layer 11 in place of the second drift layer 19. After a trench is formed in the RESURF layer 18, the second drift layer 19 and an insulating film 50 are buried in the trench, thereby forming the structure of this embodiment.

<40th Embodiment>

Figure 52:
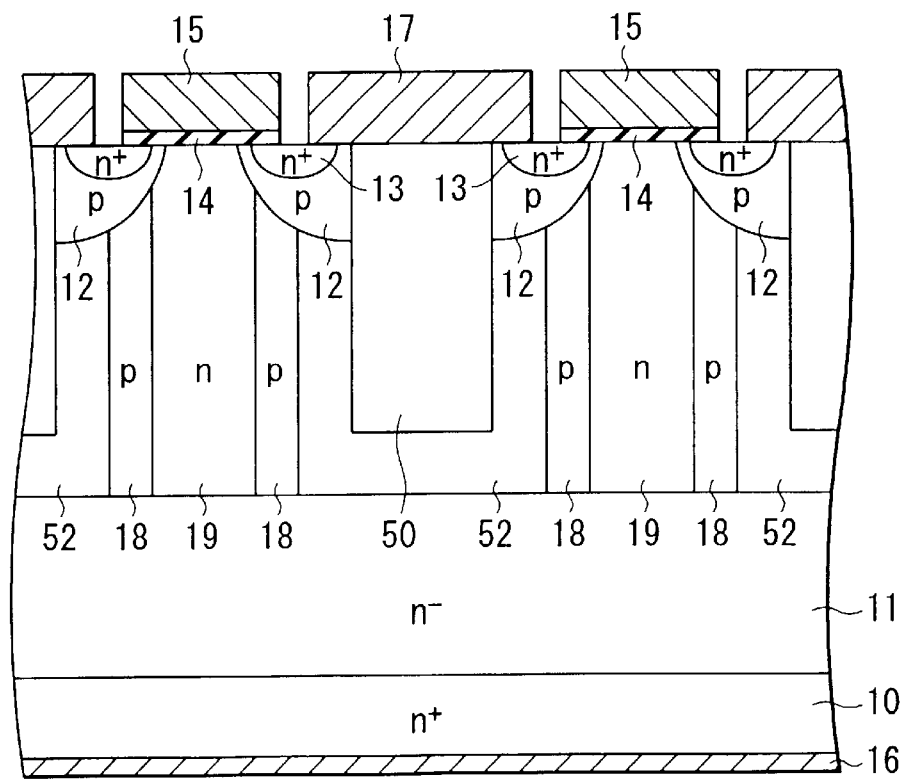
FIG. 52 is a sectional view of a vertical power MOS transistor according to the 40th embodiment of the present invention.

A semiconductor device according to the 40th embodiment of the present invention will be described next with reference to FIG. 52. FIG. 52 is a sectional view of a vertical power MOS transistor according to this embodiment. In this embodiment, the first and 27th embodiments are combined.

As shown in FIG. 52, an insulating film 50 is formed in a RESURF layer 18 of the structure shown in FIG. 2 described in the first embodiment. In addition, a lightly-doped semiconductor layer 52 is formed between the RESURF layer 18 and the insulating film 50.

With the above arrangement, the effects described in the first and 27th embodiments are obtained.

<41st Embodiment>

Figure 53:
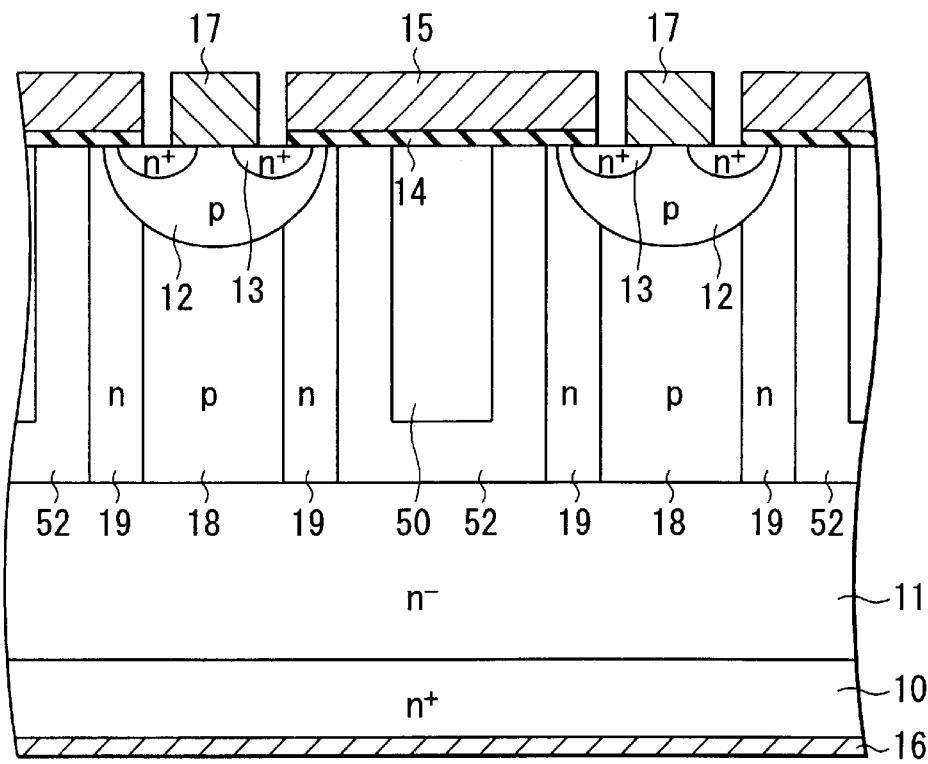
FIG. 53 is a sectional view of a vertical power MOS transistor according to the 41st embodiment of the present invention.

A semiconductor device according to the 41st embodiment of the present invention will be described next with reference to FIG. 53. FIG. 53 is a sectional view of a vertical power MOS transistor according to this embodiment. In this embodiment, the first and 28th embodiments are combined.

As shown in FIG. 53, in the structure according to this embodiment, the positions of a RESURF layer 18 and second drift layer 19 of the structure shown in FIG. 52 are exchanged.

Even with the above arrangement, the effects described in the first and 27th embodiments are obtained.

<42nd Embodiment>

Figure 54:
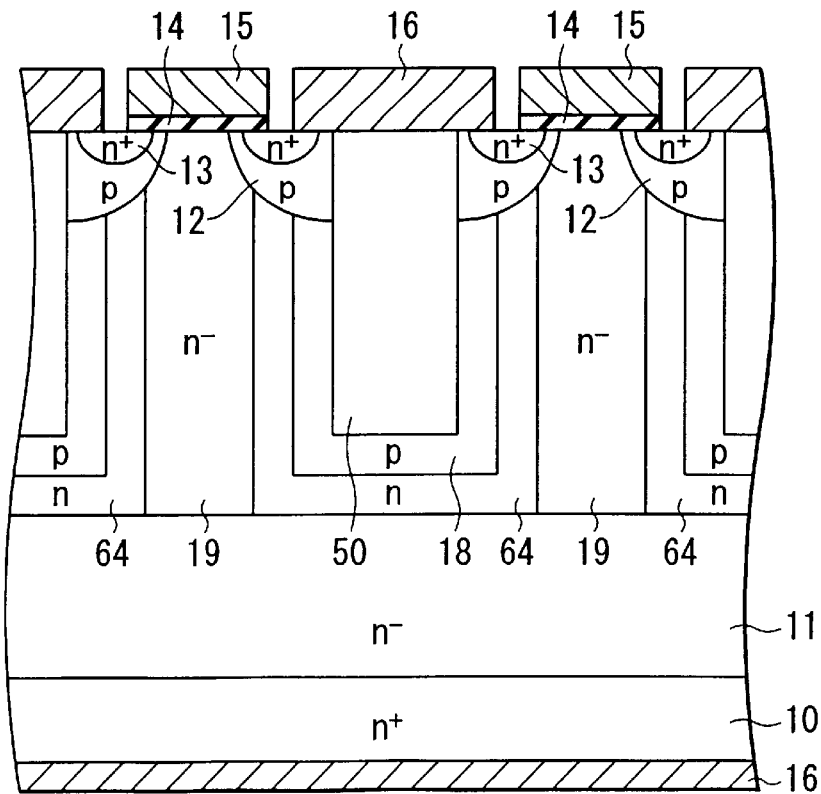
FIG. 54 is a sectional view of a vertical power MOS transistor according to the 42nd embodiment of the present invention.

A semiconductor device according to the 42nd embodiment of the present invention will be described next with reference to FIG. 54. FIG. 54 is a sectional view of a vertical power MOS transistor according to this embodiment. In this embodiment, the first and 35th embodiments are combined.

As shown in FIG. 54, an insulating film 50 is formed in a RESURF layer 18 of the structure shown in FIG. 2 described in the first embodiment. In addition, an n-type semiconductor layer 64 having an impurity concentration almost the same as that in the RESURF layer 18 is formed between the RESURF layer 18 and a second drift layer 19.

According to the above arrangement, the effects described in the first and 35th embodiments are obtained.

<43rd Embodiment>

Figure 55:
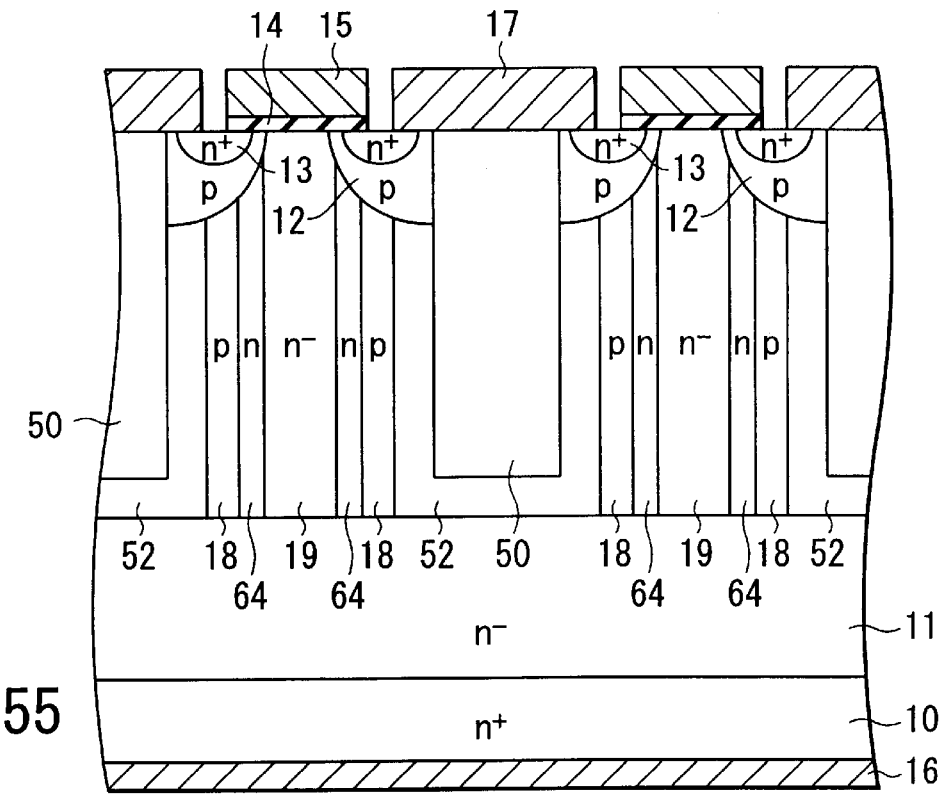
FIG. 55 is a sectional view of a vertical power MOS transistor according to the 43rd embodiment of the present invention.

A semiconductor device according to the 43rd embodiment of the present invention will be described next with reference to FIG. 55. FIG. 55 is a sectional view of a vertical power MOS transistor according to this embodiment. In this embodiment, the first and 36th embodiments are combined.

As shown in FIG. 55, an insulating film 50 is formed in a RESURF layer 18 of the structure shown in FIG. 2 described in the first embodiment. In addition, a lightly-doped semiconductor layer 52 is formed between the RESURF layer 18 and the insulating film 50. Furthermore, an n-type semiconductor layer 64 having an impurity concentration almost the same as that in the RESURF layer 18 is formed between the RESURF layer 18 and a second drift layer 19.

According to the above arrangement, the effects described in the first and 36th embodiments are obtained.

<44th Embodiment>

Figure 56:
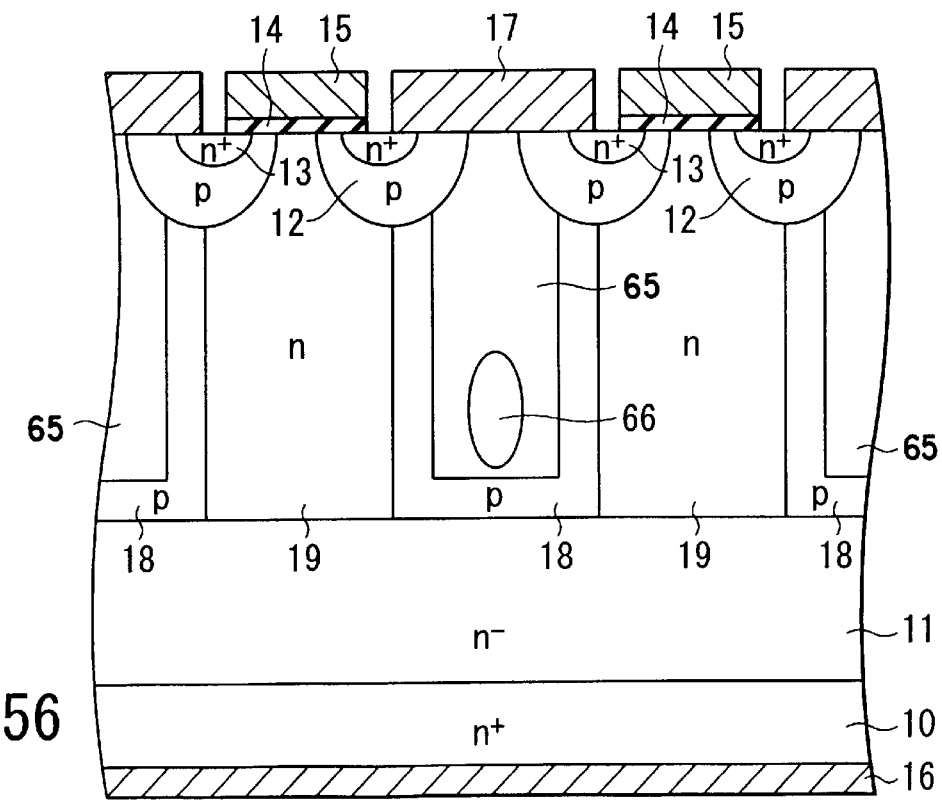
FIG. 56 is a sectional view of a vertical power MOS transistor according to the 44th embodiment of the present invention.

A semiconductor device according to the 44th embodiment of the present invention will be described next with reference to FIG. 56. FIG. 56 is a sectional view of a vertical power MOS transistor according to this embodiment. In this embodiment, the first and 37th embodiments are combined.

As shown in FIG. 56, a semiconductor layer 50 having a low impurity concentration is formed in a RESURF layer 18 of the structure shown in FIG. 2 described in the first embodiment.

According to the above arrangement, the effects described in the first and 37th embodiments are obtained.

As described above, according to the first to 44th embodiments of the present invention, a semiconductor device which can increase the breakdown voltage and simultaneously reduce the ON resistance and can also eliminate a variation in breakdown voltage, and a method of manufacturing the semiconductor device can be provided. Various changes and modifications can be made in the above embodiments. A semiconductor layer in the above embodiments may have an opposite conductivity type. The planar pattern of the RESURF layers 18 of superjunction structures is not limited to a stripe pattern. For example, a matrix pattern, staggered pattern, or dot pattern may be used.

In the first to 44th embodiments, planar type MOS transistors have been exemplified. These embodiments can also be applied to a trench gate type MOS transistor. In the 30th to 35th embodiments, the channel stopper 56 may be electrically connected to a superjunction structure. MOS transistors using silicon as a semiconductor material have been exemplified. However, the embodiment according to present invention can also be applied to a structure using a compound semiconductor such as silicon carbide or gallium nitride. The embodiment according to present invention can be appropriately applied not only to a MOS transistor but also to any semiconductor device having a superjunction structure, such as a JFET (Junction Field Effect Transistor), SBD (Schottky Barrier Diode), SIT (Static Induction Transistor), or IGBT (Insulated Gate Bipolar Transistor).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a drain layer having a first conductivity type;
   a first drift layer having the first conductivity type and formed on the drain layer;
   second drift layers having the first conductivity type and RESURF layers having a second conductivity type, which are formed on the first drift layer and periodically arranged in a direction perpendicular to a direction of depth, the RESURF layer forming a depletion layer in the second drift layer by a p-n junction including the second drift layer and RESURF layer, and the first drift layer having an impurity concentration different from that in the second drift layer;
   a drain electrode electrically connected to the drain layer;
   a base layer having the second conductivity type and selectively formed in surface regions of the second drift layer and RESURF layer;
   a source layer having the first conductivity type and selectively formed in a surface region of the base layer;
   a source electrode formed in contact with surfaces of the base layer and source layer; and
   a gate electrode formed on the base layer located between the source layer and the second drift layer with a gate insulating film interposed therebetween.

2. The device according to claim 1, wherein the impurity concentration in the first drift layer is lower than that in the second drift layer.

3. The device according to claim 2, wherein a ratio of a thickness of the second drift layer to a sum of thicknesses of the first and second drift layers falls within a range of 0.21 to 0.8.

4. The device according to claim 2, wherein an impurity amount contained in the RESURF layer falls within a range of 0.87 to 1.5 times that contained in the second drift layer.

5. The device according to claim 2, wherein a depth of the RESURF layer falls within a range of 0.95 to 1.05 times that of the second drift layer.

6. The device according to claim 5, wherein an impurity amount contained in the RESURF layer falls within a range of 1 to 1.3 times that contained in the second drift layer.

7. The device according to claim 2, wherein when a rated voltage is applied between the source and drain electrodes, the RESURF layer and base layer completely deplete the second drift layer by at least one of the p-n junction including the second drift layer and RESURF layer and a p-n junction including the second drift layer and base layer.

8. The device according to claim 2, wherein when a voltage not less than ½ a rated voltage is applied between the source and drain electrodes, the RESURF layer and base layer completely deplete the second drift layer by at least one of the p-n junction including the second drift layer and RESURF layer and a p-n junction including the second drift layer and base layer.

9. The device according to claim 2, wherein at least one of the second drift layer and RESURF layer has an impurity concentration profile in which the impurity concentration changes in the direction of depth.

10. The device according to claim 2, further comprising a first insulating film formed between the second drift layer and the RESURF layer.

11. The device according to claim 2, further comprising a first insulating film formed in one of the second drift layer and RESURF layer.

12. The device according to claim 10, wherein at least one of the second drift layer and RESURF layer has an impurity concentration profile in which the impurity concentration changes in the direction perpendicular to the direction of depth.

13. The device according to claim 2, wherein the second drift layer and RESURF layer are formed even on the first drift layer at an element terminating portion in the same manner as that at an element central portion.

14. The device according to claim 2, further comprising a first semiconductor layer having the first conductivity type, which is formed on the first drift layer at an element terminating portion and has an impurity concentration lower than that in the second drift layer.

15. The device according to claim 2, wherein the first drift layer has an impurity concentration profile in which the impurity concentration changes in the direction of depth.

16. The device according to claim 2, further comprising a plurality of second semiconductor layers having the first conductivity type, which are formed at a lower portion of the first drift layer at a predetermined interval and have an impurity concentration higher than that in the first drift layer.

17. The device according to claim 1, wherein the second drift layers and RESURF layers are formed to fill a plurality of first trenches formed in the first drift layer, and the RESURF layers sandwich the second drift layers in the direction perpendicular to the direction of depth, and each RESURF layer has one side wall in contact with the first drift layer and the other side wall in contact with the second drift layer.

18. The device according to claim 17, wherein a width of the first drift layer located between adjacent first trenches is different from that of the second drift layer adjacent to the first drift layer via the RESURF layer.

19. The device according to claim 17, further comprising:

a third semiconductor layer having the second conductivity type and formed on a side wall of a second trench formed in the first drift layer at an element terminating portion;

a fourth semiconductor layer having the first conductivity type, which is formed to fill the second trench and sandwiched between the third semiconductor layers in the direction perpendicular to the direction of depth; and a fifth semiconductor layer having the second conductivity type, which is formed in a surface region of the fourth semiconductor layer to electrically connect a plurality of third semiconductor layers.

20. The device according to claim 19, wherein the fifth semiconductor layer is electrically connected to the base layer, and at least one of a p-n junction including the third and fourth semiconductor layers and a p-n junction including the fourth and fifth semiconductor layers forms a depletion layer in the fourth semiconductor layer.

21. The device according to claim 17, further comprising:

a sixth semiconductor layer having the second conductivity type, which is formed on a bottom surface and side walls of a third trench formed in the first drift layer at an element terminating portion;

a seventh semiconductor layer having the first conductivity type, which is formed on the sixth semiconductor layer to fill the third trench; and an eighth semiconductor layer having the second conductivity type, which is formed in a surface region of the seventh semiconductor layer to surround the seventh semiconductor layer together with the sixth semiconductor layer.

22. The device according to claim 21, wherein the eighth semiconductor layer electrically connects a plurality of seventh semiconductor layers.

23. The device according to claim 21, wherein the eighth semiconductor layer is electrically connected to the base layer, and at least one of a p-n junction including the sixth and seventh semiconductor layers and a p-n junction including the seventh and eighth semiconductor layers forms a depletion layer in the seventh semiconductor layer.

24. The device according to claim 17, further comprising:

a ninth semiconductor layer having the second conductivity type and formed at least on a side wall of a fourth trench formed in the first drift layer at an element terminating portion;

a 10th semiconductor layer having the first conductivity type, which is formed to fill the fourth trench and located in the fourth trench while being sandwiched between the ninth semiconductor layers in the direction perpendicular to the direction of depth;

a second insulating film formed on the ninth and 10th semiconductor layers; and one of metal layer and 11th semiconductor layers formed on the second insulating film, the 11th semiconductor layer made of a conductive material.

25. The device according to claim 1, further comprising one of a third insulating film and 12th semiconductor layer formed in the RESURF layer, the 12th semiconductor layer having an impurity concentration lower than those in the second drift layer and RESURF layer, wherein the RESURF layer is located between the second drift layer and one of the third insulating film and 12th semiconductor layer.

26. The device according to claim 1, further comprising one of a third insulating film and 12th semiconductor layer formed in the second drift layer, the 12th semiconductor layer having an impurity concentration lower than those in the second drift layer and RESURF layer, wherein the second drift layer is located between the RESURF layer and one of the third insulating film and 12th semiconductor layer.

* * * * *